United States Patent
Shimizu et al.

(10) Patent No.: US 8,378,347 B2
(45) Date of Patent: Feb. 19, 2013

(54) LED PACKAGE

(75) Inventors: Satoshi Shimizu, Fukuoka-ken (JP);
Kazuhisa Iwashita, Fukuoka-ken (JP);
Teruo Takeguchi, Fukuoka-ken (JP);
Tetsuro Komatsu, Fukuoka-ken (JP);
Hiroaki Oshio, Fukuoka-ken (JP);
Tatsuo Tonedachi, Fukuoka-ken (JP);
Naoya Ushiyama, Fukuoka-ken (JP);
Kazuhiro Inoue, Fukuoka-ken (JP); Gen Watari, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/289,587

(22) Filed: Nov. 4, 2011

(65) Prior Publication Data
US 2012/0080674 A1   Apr. 5, 2012

Related U.S. Application Data

(63) Continuation of application No. PCT/JP2010/057504, filed on Apr. 27, 2010.

(30) Foreign Application Priority Data

Jan. 29, 2010   (JP) ................................. 2010-019768

(51) Int. Cl.
H01L 25/075   (2006.01)
H01L 33/62    (2010.01)
H01L 21/329   (2006.01)
H01L 21/56    (2006.01)
H01L 21/58    (2006.01)
H01L 21/60    (2006.01)
H01L 33/50    (2010.01)

(52) U.S. Cl. .............. 257/48; 257/98; 257/99; 257/100; 438/25; 438/26; 438/29

(58) Field of Classification Search .................... 257/48, 257/91, E33.061, E33.066; 438/22, 26, 28
See application file for complete search history.

(56) References Cited

U.S. PATENT DOCUMENTS

2010/0270571 A1 * 10/2010 Seo ................................. 257/98

FOREIGN PATENT DOCUMENTS

| JP | 2002-223001 | 8/2002 |
| JP | 2003-110080 | 4/2003 |
| JP | 2003-110145 | 4/2003 |
| JP | 2004-247612 | 9/2004 |

(Continued)

OTHER PUBLICATIONS

Japanese Office Action dated May 28, 2010 corresponding to U.S. Appl. No. 13/289,587, filed Nov. 4, 2011.

(Continued)

*Primary Examiner* — Olik Chaudhuri
*Assistant Examiner* — Wilner Jean Baptiste
(74) *Attorney, Agent, or Firm* — Turocy & Watson, LLP

(57) ABSTRACT

According to one embodiment, an LED package includes first and second lead frames spaced from each other, and an LED chip. Each of the first and second lead frames includes a base portion and a plurality of extending portions extending from the base portion. A part of a lower surface of the base portion, side surfaces of the base portion, lower surfaces of the extending portions and side surfaces of the extending portions are covered by resin. A remaining part of the lower surface of the base portion and tip surfaces of the extending portions are not covered by resin. The part of the lower surface of the base portion includes a first edge of the first lead frame and a second edge of the second lead frame. The first edge and the second edge are opposed each other.

20 Claims, 34 Drawing Sheets

FOREIGN PATENT DOCUMENTS

| | | |
|---|---|---|
| JP | 2004-274027 | 9/2004 |
| JP | 2006-093672 | 4/2006 |
| JP | 2006-147622 | 6/2006 |
| JP | 2007-027281 | 2/2007 |
| JP | 2008-112966 | 5/2008 |
| JP | 2008-147575 | 6/2008 |
| JP | 2008-218469 | 9/2008 |
| JP | 2009-283654 | 12/2009 |
| JP | D1375900 | 12/2009 |
| JP | D1375901 | 12/2009 |
| JP | 4620175 | 11/2010 |
| WO | 2008 153043 A1 | 12/2008 |

OTHER PUBLICATIONS

OSRAM Product SmartLED 0603, Hyper-Bright LED Opto Semi-conductors, Jun. 16, 2008.

Japanese Office Action for Application No. 2010-103411 issued on May 28, 2010.
Japanese Office Action for Application No. 2010-165357 issued on Oct. 26, 2010.
Japanese Office Action for Application No. 2010-165357 issued on Feb. 8, 2011.
Japanese Office Action for Application No. 2010-165357 issued on Jun. 24, 2011.
Japanese Office Action for Application No. 2011-024619 issued on Mar. 24, 2011.
Japanese Office Action for Application No. 2011-024619 issued on Jun. 24, 2011.
Japanese Office Action for Japanese Application No. 2010-230920 mailed on Jan. 8, 2013.

* cited by examiner

ULTRAVIOLET LIGHT EXPOSURE

LED PACKAGE

CROSS-REFERENCE TO RELATED APPLICATIONS

This application is a continuation application of International Application PCT/JP2010/057504, filed on Apr. 27, 2010. This application also claims priority to Japanese Application No. 2010-019768, filed on Jan. 29, 2010. The entire contents of each are incorporated herein by reference

FIELD

Embodiments described herein relate generally to an LED package.

BACKGROUND

In a conventional LED package installed with an LED chip, in order to control the light distribution and enhance the extraction efficiency of light from the LED package, a cup-shaped enclosure made of a white resin is provided. The LED chip is installed on the bottom surface of the enclosure, and a transparent resin is filled inside the enclosure to bury the LED chip. The enclosure is often formed from a polyamide-based thermoplastic resin.

However, recently, with the expanding application of LED packages, there is a growing demand for LED packages with higher durability. On the other hand, increase in the output power of LED chips results in increasing light and heat emitted from the LED chip. This makes the resin portion sealing the LED chip more susceptible to degradation. Furthermore, with the expanding application of LED packages, there is demand for further cost reduction.

DETAILED DESCRIPTION

In general, according to one embodiment, an LED package includes first and second lead frames spaced from each other, and an LED chip. The LED chip is provided above the first and second lead frames. One terminal of the LED chip is connected to the first lead frame and another terminal of the LED chip is connected to the second lead frame. Each of the first and second lead frames includes a base portion and a plurality of extending portions extending from the base portion. A part of a lower surface of the base portion, side surfaces of the base portion, lower surfaces of the extending portions and side surfaces of the extending portions are covered by resin. A remaining part of the lower surface of the base portion and tip surfaces of the extending portions are not covered by resin. The part of the lower surface of the base portion includes a first edge of the first lead frame and a second edge of the second lead frame. The first edge and the second edge are opposed each other.

According to another embodiment, an LED package includes first and second lead frames spaced from each other, first and second LED chips mounted on the first lead frame, and a Zener diode chip mounted on the second lead frame. Each of the first and second lead frames includes a base portion and two extending portions. The two extending portions extend mutually opposite directions from the base portion. The opposite directions are orthogonal to the arrangement direction of the first lead frame and the second lead frame. The first and second LED chips are connected in series between the first lead frame and the second lead frame. A part of a lower surface of the base portion, side surfaces of the base portion, lower surfaces of the extending portions and side surfaces of the extending portions are covered by resin. A remaining part of the lower surface of the base portion and tip surfaces of the extending portions are not covered by resin. The part of the lower surface of the base portion includes a first edge of the first lead frame and a second edge of the second lead frame. The first edge and the second edge are opposed each other.

Embodiments of the invention will now be described with reference to the drawings.

First, a first embodiment of the invention is described.

Figure 1:
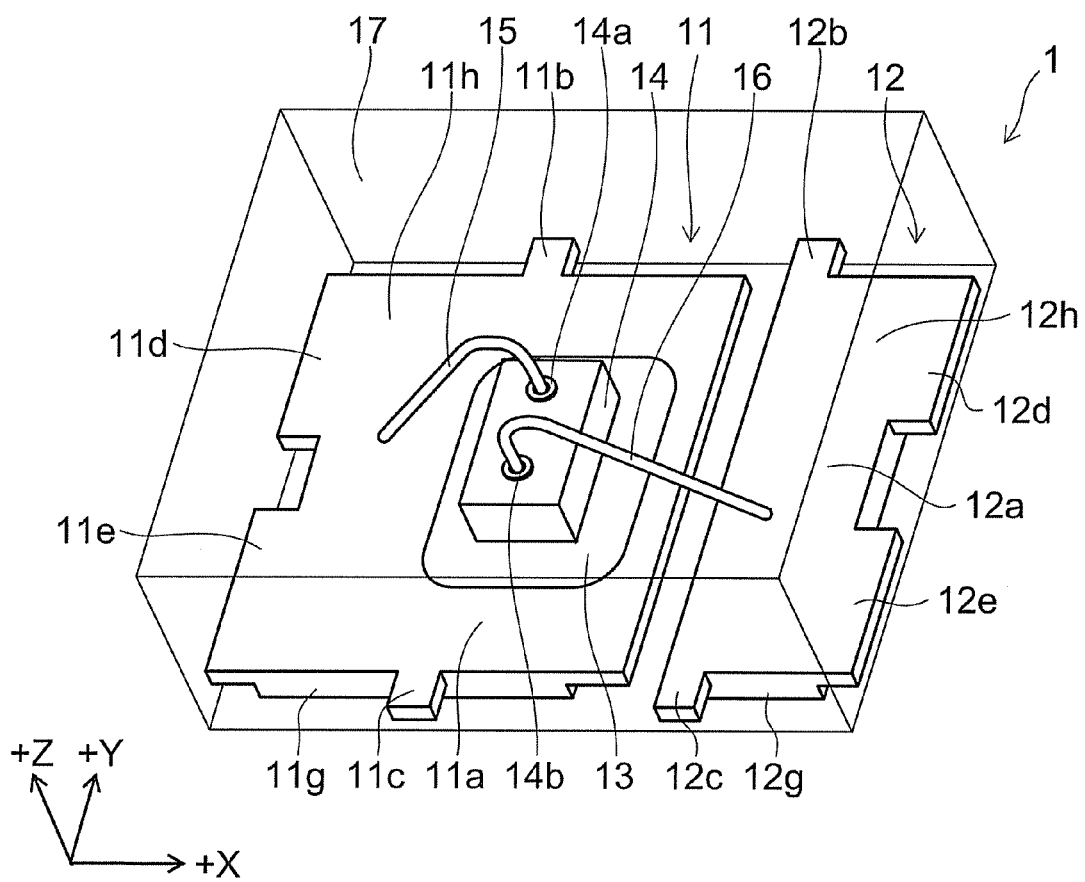
FIG. 1 is a perspective view illustrating an LED package according to a first embodiment.

FIG. 1 is a perspective view illustrating an LED package according to the embodiment.

Figure 2A:
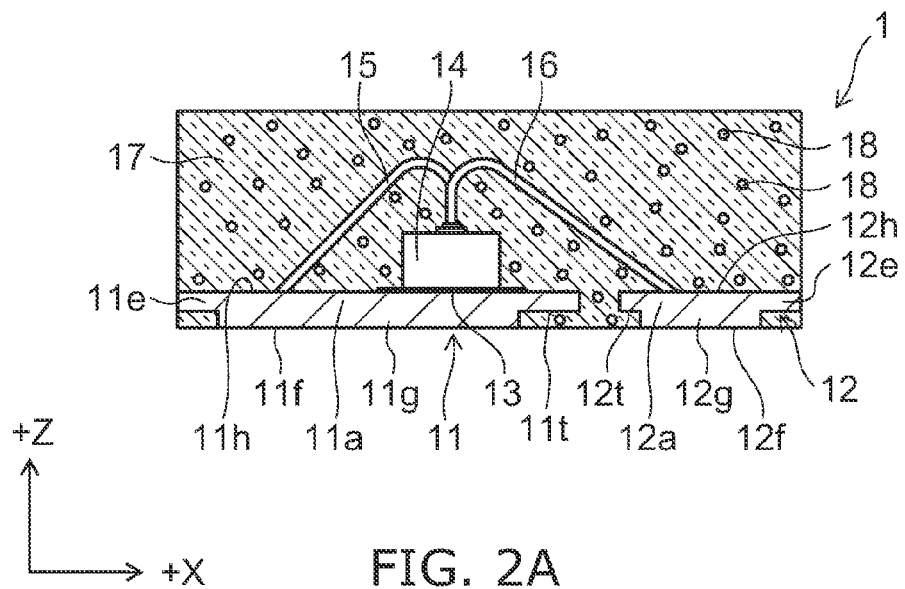
FIG. 2A is a cross-sectional view illustrating the LED package according to the first embodiment.
Figure 2B:
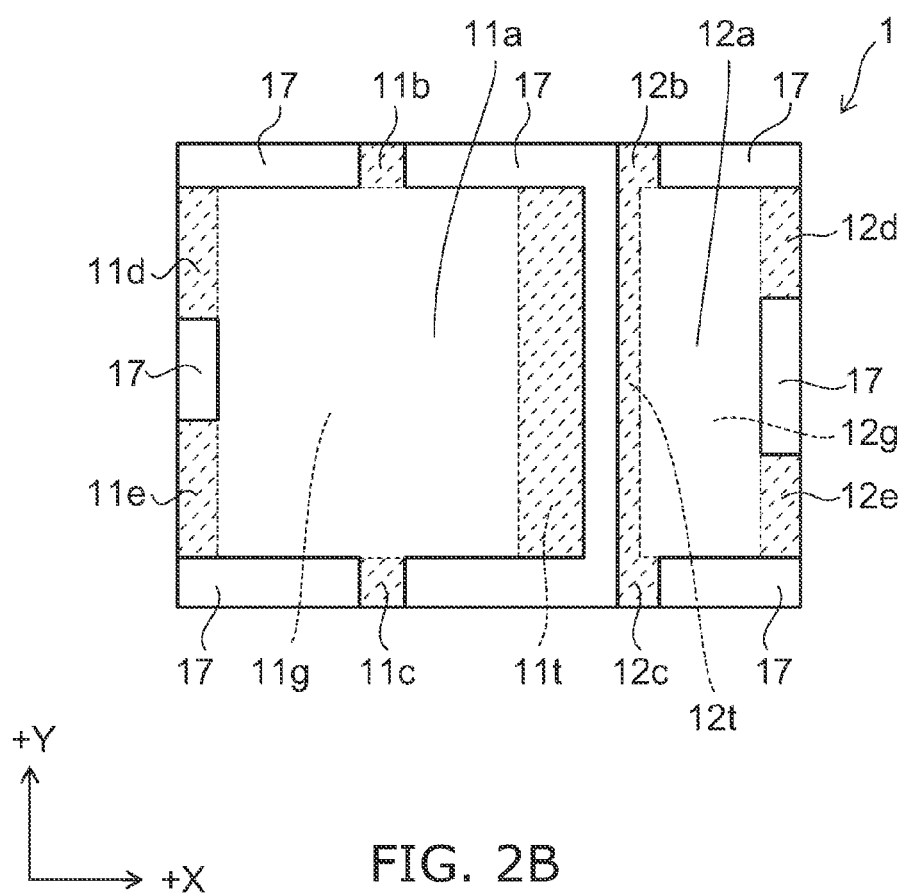
FIG. 2B is a plan view illustrating lead frames.

FIG. 2A is a cross-sectional view illustrating the LED package according to the embodiment, and FIG. 2B is a plan view illustrating lead frames.

As shown in FIGS. 1 to 2B, the LED package 1 according to the embodiment includes a pair of lead frames 11 and 12. The lead frames 11 and 12 are shaped like flat plates, being placed on the same plane and spaced from each other. The lead frames 11 and 12 are made of the same conductive material, e.g. in a configuration such that a silver plating layer is formed on the upper surface and lower surface of a copper plate. However, on the end surface of the lead frames 11 and 12, the silver plating layer is not formed, but the copper plate is exposed.

In the following, for convenience of description, an XYZ orthogonal coordinate system is herein introduced. Of the directions parallel to the upper surface of the lead frames 11 and 12, the direction from the lead frame 11 to the lead frame 12 is defined as +X direction. Of the directions perpendicular to the upper surface of the lead frames 11 and 12, the upward direction, i.e., the direction to which the LED chip 14 described below is disposed as viewed from the lead frame, is defined as +Z direction. Furthermore, one of the directions orthogonal to both the +X direction and the +Z direction is defined as +Y direction. In addition, the directions opposite to the +X direction, +Y direction, and +Z direction are referred to as −X direction, −Y direction, and −Z direction, respectively. Furthermore, the "+X direction" and "−X direction", for instance, are also collectively and simply referred to as "X direction".

The lead frame 11 includes one base portion 11a. The base portion 11a is rectangular as viewed in the Z direction. Four extending portions 11b, 11c, 11d, and 11e extend out from this base portion 11a. The extending portion 11b extends out from the X-direction center of the +Y-direction facing edge of the base portion 11a toward the +Y direction. The extending portion 11c extends out from the X-direction center of the −Y-direction facing edge of the base portion 11a toward the −Y direction. The positions of the extending portions 11b and 11c in the X direction are the same. The extending portions 11d and 11e extend out from both ends of the −X-direction facing edge of the base portion 11a toward the −X direction. Thus, the extending portions 11b to 11e extend out from three different sides of the base portion 11a.

As compared with the lead frame 11, the lead frame 12 has a shorter length in the X direction and the same length in the Y direction. The lead frame 12 includes one base portion 12a. The base portion 12a is rectangular as viewed in the Z direction. Four extending portions 12b, 12c, 12d, and 12e extend out from this base portion 12a. The extending portion 12b extends out from the −X-direction end of the +Y-direction facing edge of the base portion 12a toward the +Y direction. The extending portion 12c extends out from the −X-direction end of the −Y-direction facing edge of the base portion 12a toward the −Y direction. The extending portions 12d and 12e extend out from both ends of the +X-direction facing edge of the base portion 12a toward the +X direction. Thus, the extending portions 12b to 12e extend out from three different sides of the base portion 12a. The width of the extending portions 11d and 11e of the lead frame 11 may be either equal to or different from the width of the extending portions 12d and 12e of the lead frame 12. However, if the width of the extending portions 11d and 11e is made different from the width of the extending portions 12d and 12e, it is easier to distinguish between the anode and the cathode.

At the lower surface 11f of the lead frame 11, a protrusion 11g is formed at the X-direction center of the base portion 11a. Thus, the lead frame 11 has two thickness levels. That is, the X-direction center of the base portion 11a, i.e., of the portion where the protrusion 11g is formed, is relatively thick, whereas both X-direction ends of the base portion 11a and the extending portions 11b to 11e are relatively thin. In FIG. 2B, the portion of the base portion 11a where the protrusion 11g is not formed is shown as a thin plate portion 11t. Likewise, at the lower surface 12f of the lead frame 12, a protrusion 12g is formed at the X-direction center of the base portion 12a. Thus, the lead frame 12 also has two thickness levels. The X-direction center of the base portion 12a is relatively thick because the protrusion 12g is formed thereat, whereas both X-direction ends of the base portion 12a and the extending portions 12b to 12e are relatively thin. In FIG. 2B, the portion of the base portion 12a where the protrusion 12g is not formed is shown as a thin plate portion 12t. In other words, notches extending in the Y direction along the edges of the base portions 11a and 12a are formed in the lower surface of both X-direction ends of the base portions 11a and 12a. In FIG. 2B, the relatively thin portions in the lead frames 11 and 12, i.e., the thin plate portions and the extending portions, are hatched with dashed lines.

The protrusions 11g and 12g are formed in regions spaced from the mutually opposed edges of the lead frames 11 and 12. The regions including these edges constitute the thin plate portions 11t and 12t. The upper surface 11h of the lead frame 11 and the upper surface 12h of the lead frame 12 are on the same plane. The lower surface of the protrusion 11g of the lead frame 11 and the lower surface of the protrusion 12g of the lead frame 12 are on the same plane. The position of the upper surface of each extending portion in the Z direction coincides with the position of the upper surface of the lead frames 11 and 12. Hence, the extending portions are located on the same XY plane.

A die mount material 13 is attached to part of the region corresponding to the base portion 11a in the upper surface 11h of the lead frame 11. In the embodiment, the die mount material 13 may be either conductive or insulative. In the case where the die mount material 13 is conductive, the die mount material 13 is formed from e.g. a silver paste, solder, eutectic solder or the like. In the case where the die mount material 13 is insulative, the die mount material 13 is formed from e.g. a transparent resin paste.

An LED chip 14 is provided on the die mount material 13. That is, the die mount material secures the LED chip 14 to the lead frame 11 so that the LED chip 14 is disposed on the lead frame 11. The LED chip 14 includes e.g. semiconductor layers made of gallium nitride (GaN) and the like stacked on a sapphire substrate. The LED chip 14 is shaped like e.g. a rectangular solid, with terminals 14a and 14b provided on its upper surface. The LED chip 14 emits e.g. blue light by being supplied with a voltage between the terminal 14a and the terminal 14b.

One end of a wire 15 is bonded to the terminal 14a of the LED chip 14. The wire 15 is drawn out from the terminal 14a to the +Z direction (directly upward) and curved toward the direction between the -X direction and the -Z direction. The other end of the wire 15 is bonded to the upper surface 11h of the lead frame 11. Thus, the terminal 14a is connected to the lead frame 11 via the wire 15. On the other hand, one end of a wire 16 is bonded to the terminal 14b. The wire 16 is drawn out from the terminal 14b to the +Z direction and curved toward the direction between the +X direction and the -Z direction. The other end of the wire 16 is bonded to the upper surface 12h of the lead frame 12. Thus, the terminal 14b is connected to the lead frame 12 via the wire 16. The wires 15 and 16 are formed from a metal, such as gold or aluminum.

Furthermore, the LED package 1 includes a transparent resin body 17. The transparent resin body 17 is formed from a transparent resin, such as silicone resin. Here, "transparent" includes translucent as well. The outline of the transparent resin body 17 is a rectangular solid. The transparent resin body 17 buries the lead frames 11 and 12, the die mount material 13, the LED chip 14, and the wires 15 and 16. Thus, the outline of the transparent resin body 17 constitutes the outline of the LED package 1. Part of the lead frame 11 and part of the lead frame 12 are exposed at the lower surface and side surface of the transparent resin body 17. That is, the transparent resin body 17 covers the LED chip 14, and covers the upper surface, part of the lower surface, and part of the end surface of the lead frames 11 and 12. However, the transparent resin body 17 exposes the rest of the lower surface and the rest of the end surface of the lead frames 11 and 12. The term "to cover" used herein refers to the concept including both cases where the covering thing is in contact with the covered thing, and where the covering thing is not in contact with the covered thing.

More specifically, in the lower surface 11f of the lead frame 11, the lower surface of the protrusion 11g is exposed at the lower surface of the transparent resin body 17. The tip surface of the extending portions 11b to 11e is exposed at the side surface of the transparent resin body 17. On the other hand, in the lead frame 11, the entire upper surface 11h, the region of the lower surface 11f outside the protrusion 11g, i.e., the lower surface of the extending portions and the thin plate portion, the side surface of the protrusion 11g, and the end surface of the base portion 11a are covered with the transparent resin body 17. Likewise, in the lead frame 12, the lower surface of the protrusion 12g is exposed at the lower surface of the transparent resin body 17. The tip surface of the extending portions 12b to 12e is exposed at the side surface of the transparent resin body 17. The entire upper surface 12h, the region of the lower surface 12f other than the protrusion 12g, i.e., the lower surface of the extending portions and the thin plate portion, the side surface of the protrusion 12g, and the end surface of the base portion 12a are covered with the transparent resin body 17. In the LED package 1, the lower surfaces of the protrusions 11g and 12g exposed at the lower surface of the transparent resin body 17 constitute external electrode pads. Thus, as viewed from above, the transparent resin body 17 is shaped like a rectangle. The tip surfaces of the plurality of extending portions described above are exposed at three different side surfaces of the transparent resin body 17.

Numerous phosphors 18 are dispersed inside the transparent resin body 17. Each phosphor 18 is particulate. The phosphor 18 absorbs light emitted from the LED chip 14 and emits light with a longer wavelength. For instance, the phosphor 18 absorbs part of blue light emitted from the LED chip 14 and emits yellow light. Thus, the LED package 1 emits blue light, which is emitted from the LED chip 14 and not absorbed by the phosphors 18, and yellow light emitted from the phosphors 18, resulting in white emission light as a whole. For convenience of illustration, FIGS. 1, 3, and the subsequent figures do not show the phosphors 18. Furthermore, in FIGS. 2A and 2B, the phosphors 18 are shown larger and fewer than in reality.

Such a phosphor 18 can be e.g. a silicate-based phosphor emitting yellow-green, yellow, or orange light. The silicate-based phosphor can be represented by the following general formula:

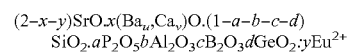

where $0<x$, $0.005<y<0.5$, $x+y \leqq 1.6$, $0 \leqq a$, b, c, $d<0.5$, $0<u$, $0<v$, and $u+v=1$.

Furthermore, a YAG-based phosphor can also be used as a yellow phosphor. The YAG-based phosphor can be represented by the following general formula:

where $0 \leqq x<1$, $0 \leqq y \leqq 1$, and RE is at least one element selected from Y and Gd.

Alternatively, the phosphor 18 can be a mixture of a sialon-based red phosphor and green phosphor. That is, the phosphor 18 can include a green phosphor absorbing blue light emitted from the LED chip 14 and emitting green light, and a red phosphor absorbing blue light and emitting red light.

The sialon-based red phosphor can be represented by the following general formula, for instance:

$$(M_{1-x}R_x)_{a1}AlSi_{b1}O_{c1}N_{d1}$$

where M is at least one metallic element except Si and Al, and preferably at least one of Ca and Sr in particular. R is an emission center element, and preferably Eu in particular. The quantities x, a1, b1, c1, and d1 satisfy $0<x\leq 1$, $0.6<a1<0.95$, $2<b1<3.9$, $0.25<c1<0.45$, and $4<d1<5.7$. A specific example of such a sialon-based red phosphor is given by:

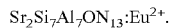
$$Sr_2Si_7Al_7ON_{13}:Eu^{2+}.$$

The sialon-based green phosphor can be represented by the following general formula, for instance:

$$(M_{1-x}R_x)_{a2}AlSi_{b2}O_{c2}N_{d2}$$

where M is at least one metallic element except Si and Al, and preferably at least one of Ca and Sr in particular. R is an emission center element, and preferably Eu in particular. The quantities x, a2, b2, c2, and d2 satisfy $0<x\leq 1$, $0.93<a2<1.3$, $4.0<b2<5.8$, $0.6<c2<1$, and $6<d2<11$.

A specific example of such a sialon-based green phosphor is given by:

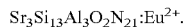
$$Sr_3Si_{13}Al_3O_2N_{21}:Eu^{2+}.$$

Next, a method for manufacturing an LED package according to the embodiment is described.

Figure 3:
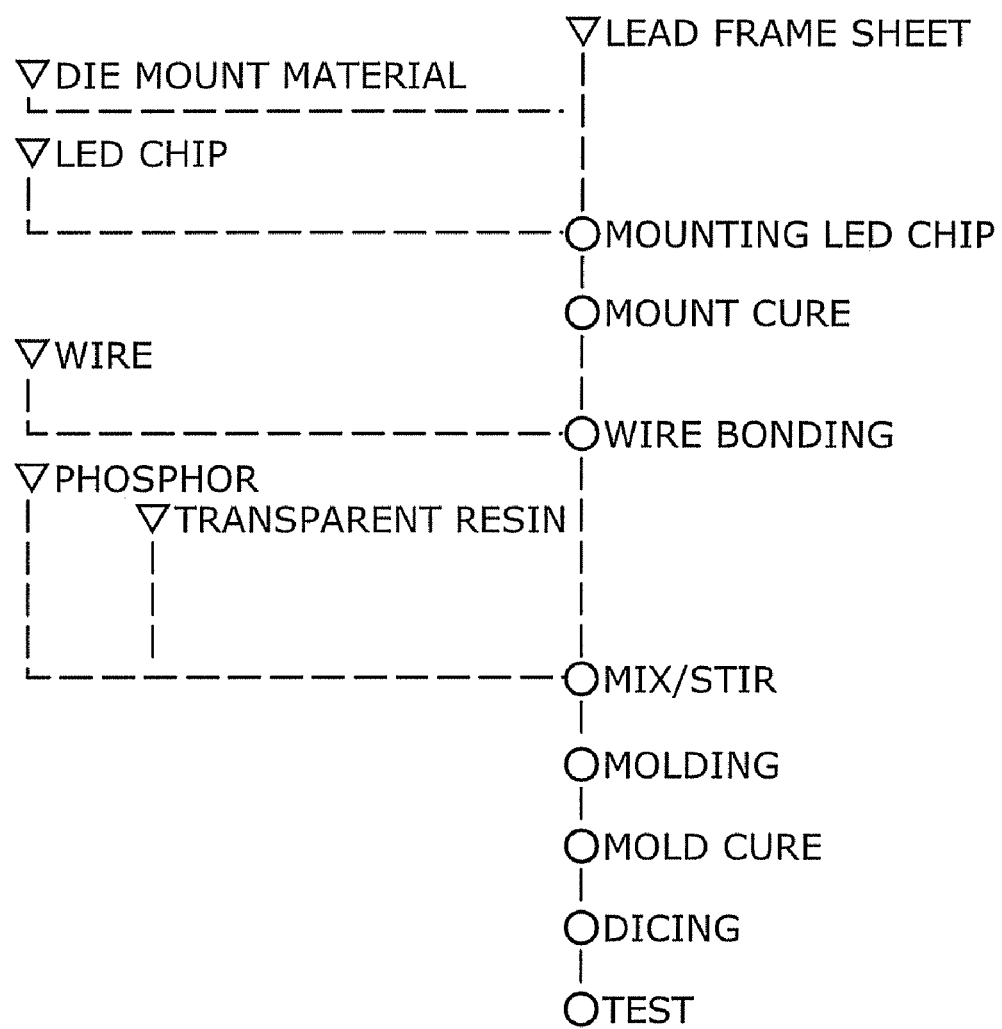
FIG. 3 is a flowchart illustrating a method for manufacturing the LED package according to the first embodiment.

FIG. 3 is a flowchart illustrating the method for manufacturing an LED package according to the embodiment.

FIGS. 4A to 4D, FIGS. 5A to 5C, and FIGS. 6A and 6B are cross-sectional views of processes, illustrating the method for manufacturing an LED package according to the embodiment.

Figure 7A:
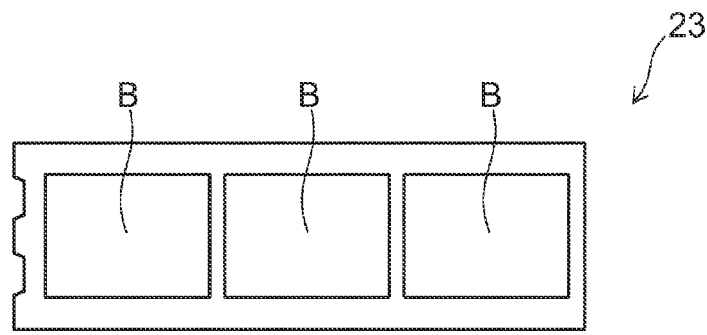
FIG. 7A is a plan view illustrating a lead frame sheet in the first embodiment.
Figure 7B:
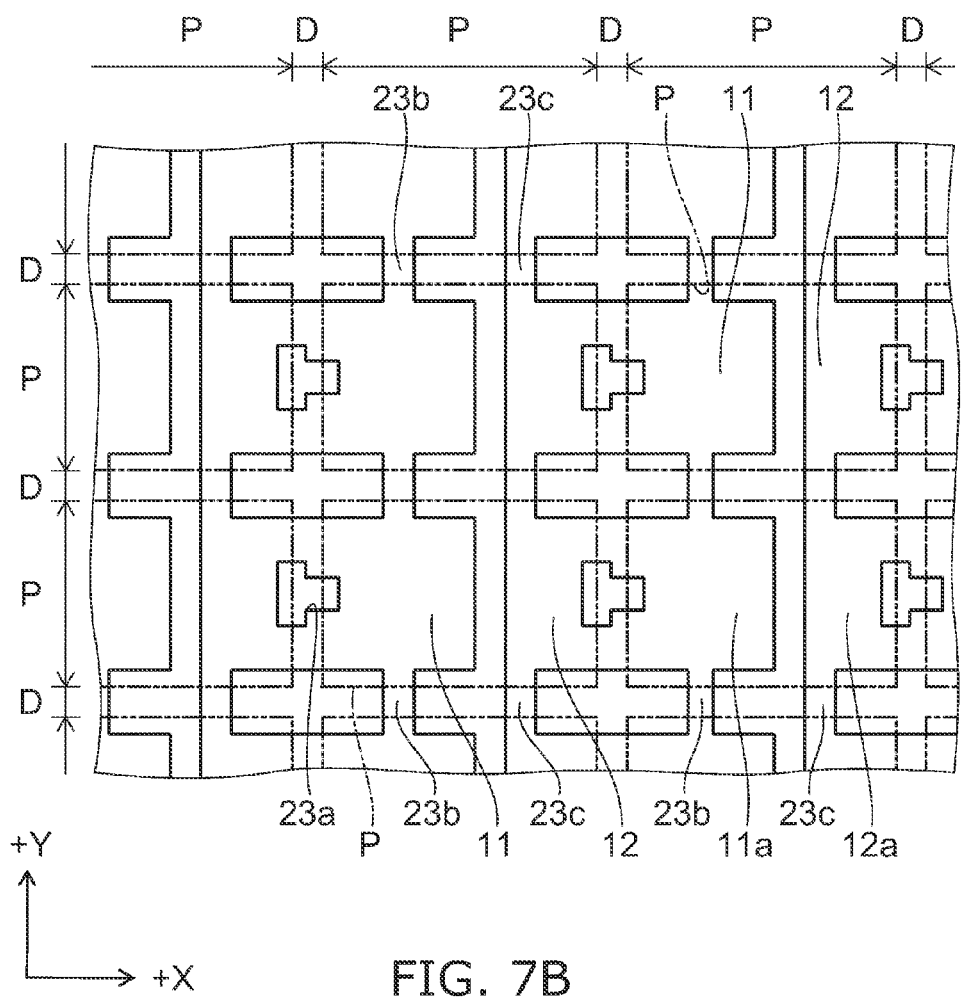
FIG. 7B is a partially enlarged plan view illustrating the device region of the lead frame sheet.

FIG. 7A is a plan view illustrating a lead frame sheet in the embodiment, and FIG. 7B is a partially enlarged plan view illustrating the device region of this lead frame sheet.

Figure 4A:
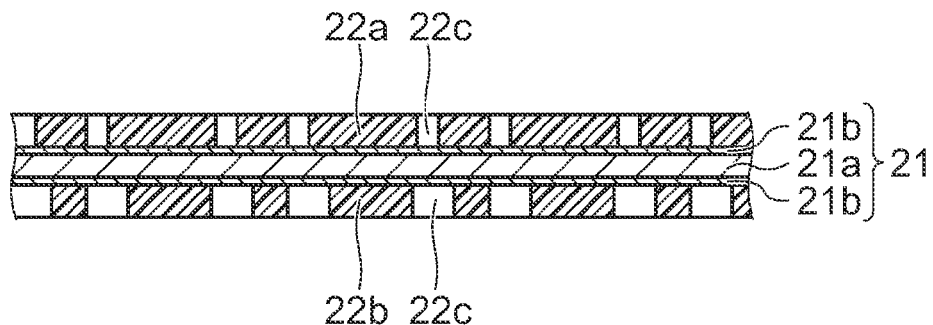
FIGS. 4A to 4D are cross-sectional views of processes, illustrating the method for manufacturing the LED package according to the first embodiment.

First, as shown in FIG. 4A, a conductive sheet 21 made of a conductive material is prepared. This conductive sheet 21 is e.g. a strip-shaped copper plate 21a with the upper and lower surface provided with a silver plating layer 21b. Next, masks 22a and 22b are formed on the upper and lower surface of this conductive sheet 21. Openings 22c are selectively formed in the masks 22a and 22b. The masks 22a and 22b can be formed by e.g. a printing process.

Next, the conductive sheet 21 with the masks 22a and 22b attached thereto is immersed in an etching liquid, and thereby wet etched. Thus, in the conductive sheet 21, the portion located in the opening 22c is etched and selectively removed. Here, by adjusting the immersion time, for instance, the etching amount is controlled so that etching is stopped before the etching from each of the upper surface side and lower surface side of the conductive sheet 21 singly penetrates through the conductive sheet 21. Thus, half-etching is performed from the upper and lower surface side. However, in the portion etched from both the upper surface side and lower surface side, etching is performed so as to penetrate through the conductive sheet 21. Subsequently, the masks 22a and 22b are removed.

Figure 4B:
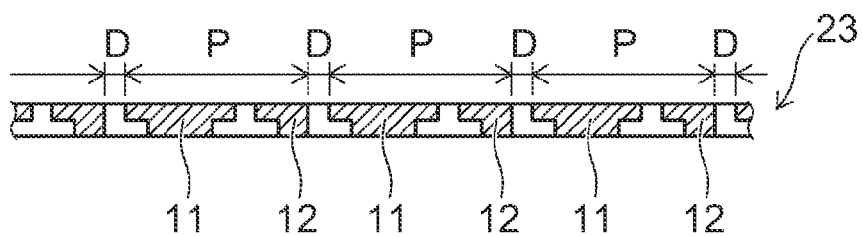

Thus, as shown in FIGS. 3 and 4B, the copper plate 21a and the silver plating layer 21b are selectively removed from the conductive sheet 21 to form a lead frame sheet 23. For convenience of illustration, in FIG. 4B and the subsequent figures, the copper plate 21a and the silver plating layer 21b are integrally shown as a lead frame sheet 23 without distinction. As shown in FIG. 7A, three blocks B, for instance, are defined in the lead frame sheet 23. Approximately 1000 device regions P, for instance, are defined in each block B. As shown in FIG. 7B, the device regions P are arranged in a matrix, and the portion between the device regions P constitutes a lattice-like dicing region D. In each device region P, a basic pattern including lead frames 11 and 12 spaced from each other is formed. In the dicing region D, the conductive material forming the conductive sheet 21 remains so as to connect between the adjacent device regions P.

More specifically, the lead frame 11 and the lead frame 12 are spaced from each other in the device region P. However, the lead frame 11 belonging to one device region P is connected to the lead frame 12 belonging to the adjacent device region P located on the −X-direction side of the former device region P. An opening 23a with a shape projected to the +X direction is formed between these frames. Furthermore, the lead frames 11 belonging to the device regions P adjacent in the Y direction are connected to each other via a bridge 23b. Likewise, the lead frames 12 belonging to the device regions P adjacent in the Y direction are connected to each other via a bridge 23c. Thus, from the base portions 11a and 12a of the lead frames 11 and 12, four conductive members extend out toward three directions. Furthermore, because half-etching is used to etch the lead frame sheet 23 from its lower surface side, protrusions 11g and 12g (see FIGS. 2A and 2B) are formed on the lower surface of the lead frames 11 and 12, respectively.

Figure 4C:
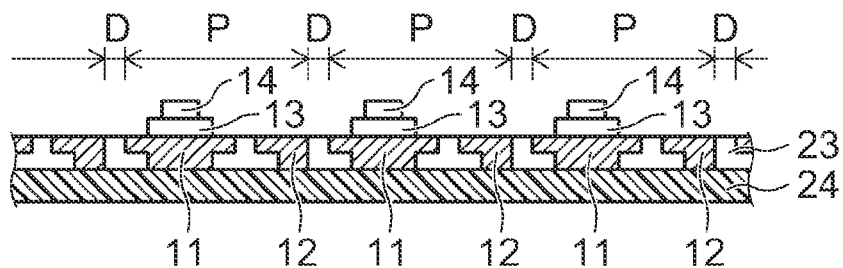

Next, as shown in FIGS. 3 and 4C, a reinforcing tape 24 made of e.g. polyimide is affixed to the lower surface of the lead frame sheet 23. Then, a die mount material 13 is attached onto the lead frame 11 belonging to each device region P of the lead frame sheet 23. For instance, a paste-like die mount material 13 is discharged from a discharger onto the lead frame 11, or transferred onto the lead frame 11 by a mechanical method. Next, an LED chip 14 is mounted on the die mount material 13. Next, heat treatment (mount cure) for sintering the die mount material 13 is performed. Thus, the LED chip 14 is disposed on the lead frame 11 via the die mount material 13 in each device region P of the lead frame sheet 23.

Figure 4D:
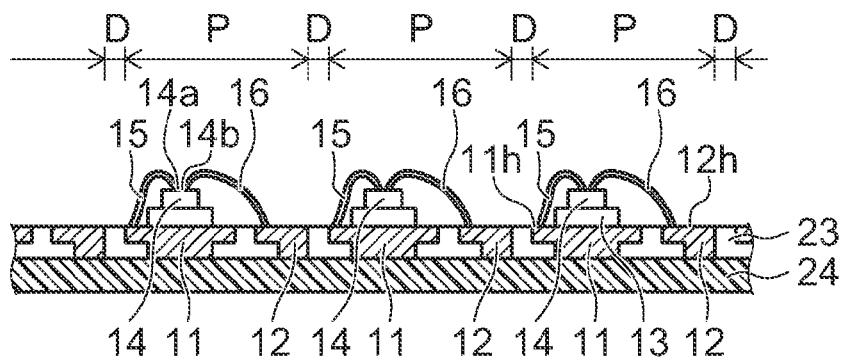

Next, as shown in FIGS. 3 and 4D, by ultrasonic bonding, for instance, one end of a wire 15 is bonded to the terminal 14a of the LED chip 14, and the other end is bonded to the upper surface of the lead frame 11. Furthermore, one end of a wire 16 is bonded to the terminal 14b of the LED chip 14, and the other end is bonded to the upper surface 12h of the lead frame 12. Thus, the terminal 14a is connected to the lead frame 11 via the wire 15, and the terminal 14b is connected to the lead frame 12 via the wire 16.

Figure 5A:
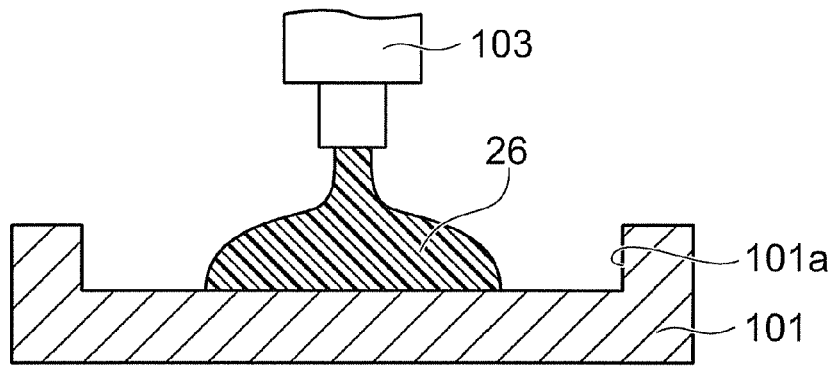
FIGS. 5A to 5C are cross-sectional views of processes, illustrating the method for manufacturing the LED package according to the first embodiment.

Next, as shown in FIGS. 3 and 5A, a lower mold 101 is prepared. The lower mold 101, in combination with an upper mold 102 described below, constitutes a set of molds. A recess 101a shaped like a rectangular solid is formed in the upper surface of the lower mold 101. On the other hand, phosphors 18 (see FIG. 2A) are mixed and stirred in a transparent resin such as silicone resin to prepare a liquid or semi-liquid phosphor-containing resin material 26. Then, by a dispenser 103, the phosphor-containing resin material 26 is supplied into the recess 101a of the lower mold 101.

Figure 5B:
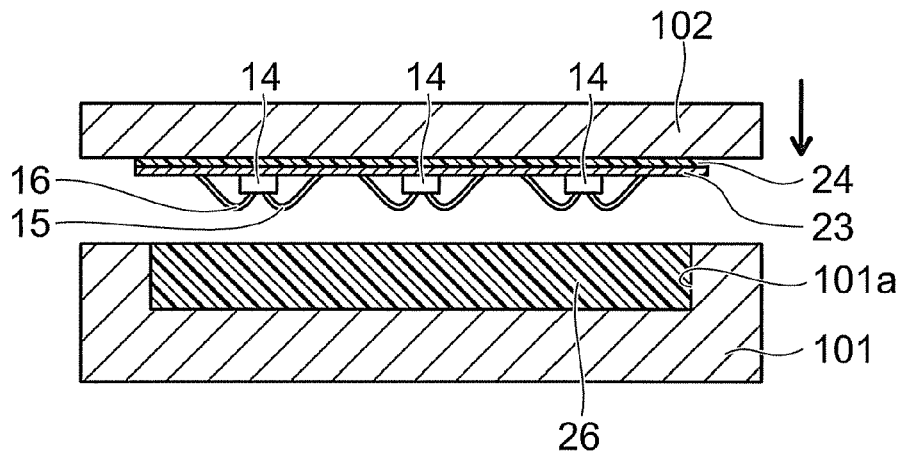

Next, as shown in FIGS. 3 and 5B, the aforementioned lead frame sheet 23 disposed with the LED chips 14 is attached to the lower surface of the upper mold 102 so that the LED chips 14 face downward. Then, the upper mold 102 is pressed to the lower mold 101, and the molds are clamped. Thus, the lead frame sheet 23 is pressed to the phosphor-containing resin material 26. At this time, the phosphor-containing resin material 26 covers the LED chip 14 and the wires 15 and 16, and also penetrates into the etched-away portion of the lead frame sheet 23. Thus, the phosphor-containing resin material 26 is molded.

Figure 5C:
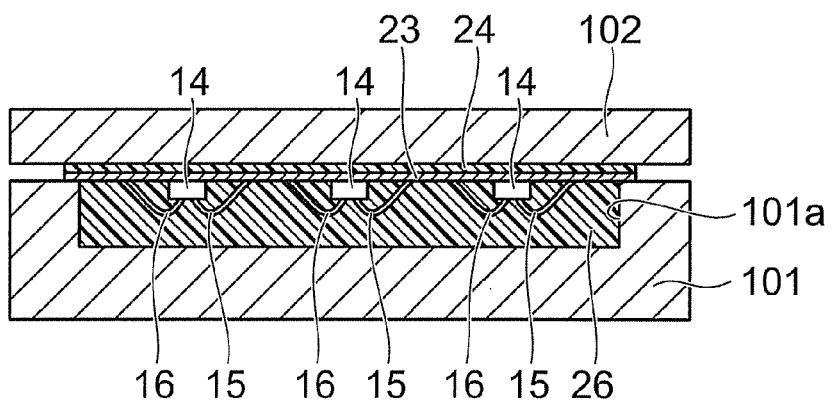
Figure 6A:
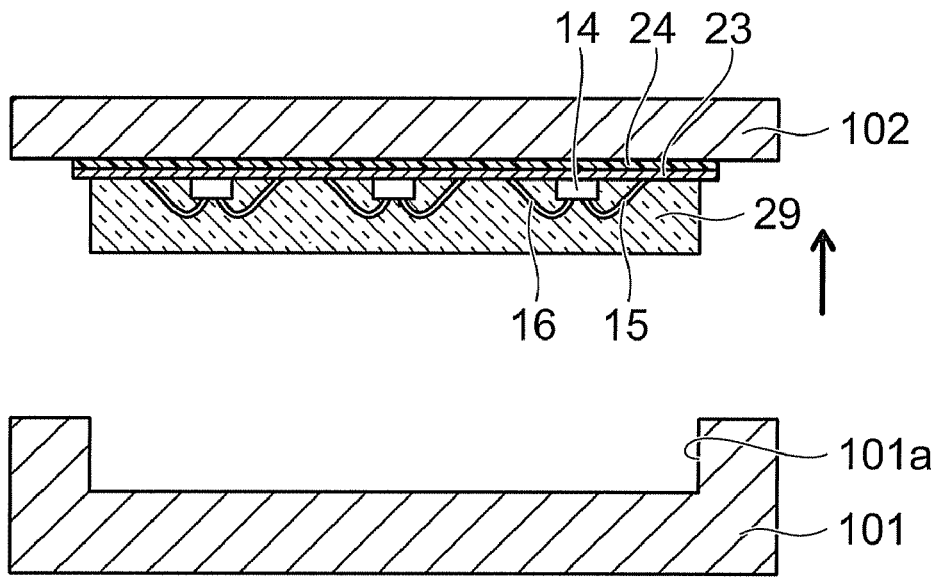
FIGS. 6A and 6B are cross-sectional views of processes, illustrating the method for manufacturing the LED package according to the first embodiment.

Next, as shown in FIGS. 3 and 5C, heat treatment (mold cure) is performed with the upper surface of the lead frame sheet 23 pressed to the phosphor-containing resin material 26 to cure the phosphor-containing resin material 26. Subsequently, as shown in FIG. 6A, the upper mold 102 is pulled away from the lower mold 101. Thus, a transparent resin plate 29 covering the entire upper surface and part of the lower surface of the lead frame sheet 23 and burying the LED chips 14 and the like is formed on the lead frame sheet 23. Phosphors 18 (see FIG. 2A) are dispersed in the transparent resin plate 29. Subsequently, the reinforcing tape 24 is stripped from the lead frame sheet 23. Thus, the lower surface of the protrusions 11g and 12g (see FIGS. 2A and 2B) of the lead frames 11 and 12 is exposed at the surface of the transparent resin plate 29.

Figure 6B:
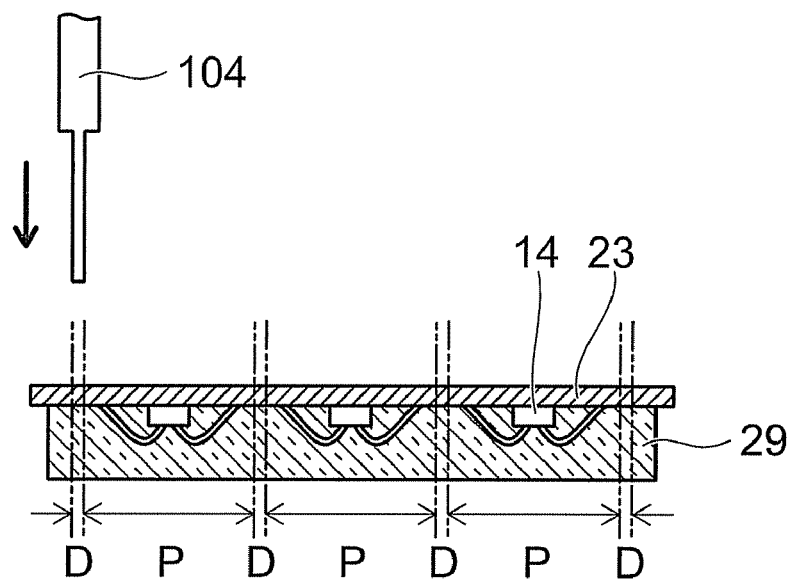

Next, as shown in FIGS. 3 and 6B, by a blade 104, the combined body of the lead frame sheet 23 and the transparent resin plate 29 is diced from the lead frame sheet 23 side, i.e., from the −Z direction side toward the +Z direction. Thus, the portion of the lead frame sheet 23 and the transparent resin plate 29 located in the dicing region D is removed. Consequently, the portion of the lead frame sheet 23 and the transparent resin plate 29 located in the device region P is singulated, and an LED package 1 shown in FIGS. 1 to 2B is manufactured. Here, the combined body of the lead frame sheet 23 and the transparent resin plate 29 may be diced from the transparent resin plate 29 side.

In each LED package 1 after dicing, the lead frames 11 and 12 are separated from the lead frame sheet 23. Furthermore, the transparent resin plate 29 is divided into transparent resin bodies 17. The portion of the dicing region D extending in the Y direction passes through the openings 23a of the lead frame sheet 23. Thus, extending portions 11d, 11e, 12d, and 12e are formed in the lead frames 11 and 12. Furthermore, extending portions 11b and 11c are formed in the lead frame 11 by division of the bridge 23b. Extending portions 12b and 12c are formed in the lead frame 12 by division of the bridge 23c. The tip surface of the extending portions 11b to 11e and 12b to 12e is exposed at the side surface of the transparent resin body 17.

Next, as shown in FIG. 3, various tests are performed on the LED package 1. At this time, the tip surfaces of the extending portions 11b to 11e and 12b to 12e may be used as terminals for the tests.

Next, the functional effect of the embodiment is described.

The LED package 1 according to the embodiment is not provided with an enclosure made of a white resin. Hence, there is no degradation of the enclosure by absorbing light and heat generated from the LED chip 14. In particular, while degradation is likely to proceed in the case where the enclosure is formed from a polyamide-based thermoplastic resin, there is no such risk in the embodiment. Thus, the LED package 1 according to the embodiment has high durability. Hence, the LED package 1 according to the embodiment has long lifetime and high reliability, and is applicable to a wide variety of purposes.

Furthermore, in the LED package 1 according to the embodiment, the transparent resin body 17 is formed from silicone resin. Because silicone resin has high durability against light and heat, the durability of the LED package 1 is improved also for this reason.

Moreover, the LED package 1 according to the embodiment is not provided with an enclosure covering the side surface of the transparent resin body 17. Hence, light is emitted toward a wide angle. Thus, the LED package 1 according to the embodiment is advantageous for applications requiring light emission with a wide angle, such as lighting and backlights of liquid crystal televisions.

Moreover, in the LED package 1 according to the embodiment, the transparent resin body 17 covers part of the lower surface and most of the end surface of the lead frames 11 and 12, thereby retaining the peripheral portion of the lead frames 11 and 12. Hence, the retainability of the lead frames 11 and 12 can be enhanced while the lower surface of the protrusions 11g and 12g of the lead frames 11 and 12 is exposed from the transparent resin body 17 to realize external electrode pads. That is, the protrusions 11g and 12g are formed at the X-direction center of the base portions 11a and 12a so that notches are realized at both X-direction ends of the lower surface of the base portions 11a and 12a. By penetration of the transparent resin body 17 into this notch, the lead frames 11 and 12 can be robustly retained. This makes the lead frames 11 and 12 more resistant to being stripped from the transparent resin body 17 at the time of dicing. Thus, the yield of the LED package 1 can be improved.

Moreover, in the LED package 1 according to the embodiment, a silver plating layer is formed on the upper surface and lower surface of the lead frames 11 and 12. Because the silver plating layer has high light reflectance, the LED package 1 according to the embodiment has high light extraction efficiency.

Moreover, in the embodiment, a large number, e.g. approximately several thousands, of LED packages 1 can be collectively manufactured from one conductive sheet 21. Thus, the manufacturing cost per LED package can be reduced. Furthermore, because no enclosure is provided, the number of parts and the number of processes are small, achieving low cost.

Moreover, in the embodiment, the lead frame sheet 23 is formed by wet etching. Thus, in manufacturing an LED package with a new layout, it is only necessary to prepare a mask original plate. Thus, as compared with the case of forming the lead frame sheet 23 by press molding and the like, the initial cost can be suppressed at lower level.

Moreover, in the LED package 1 according to the embodiment, the extending portions extend out from the base portions 11a and 12a of the lead frames 11 and 12. This prevents the base portion itself from being exposed at the side surface of the transparent resin body 17. Thus, the exposed area of the lead frames 11 and 12 can be reduced. This can prevent the lead frames 11 and 12 from being stripped from the transparent resin body 17. Furthermore, corrosion of the lead frames 11 and 12 can also be suppressed.

Viewing this effect from the standpoint of the manufacturing method, as shown in FIG. 7B, openings 23a and bridges 23b and 23c are provided in the lead frame sheet 23 so as to be interposed in the dicing region D, thereby reducing the metal portion interposed in the dicing region D. This facilitates dicing, and can suppress attrition of the dicing blade. Furthermore, in the embodiment, four extending portions extend out in three directions from each of the lead frames 11 and 12. Thus, in the process of mounting the LED chip 14 shown in FIG. 4C, the lead frame 11 is reliably supported from three directions by the lead frames 11 and 12 in the neighboring device regions P, thereby achieving high mountability. Likewise, also in the wire bonding process shown in FIG. 4D, the wire bonding position is reliably supported from three directions. Hence, for instance, ultrasonic waves applied in ultrasonic bonding are less likely to escape, and the wire can be favorably bonded to the lead frame and the LED chip.

Moreover, in the embodiment, in the dicing process shown in FIG. 6B, dicing is performed from the lead frame sheet 23 side. Thus, the metal material forming the cut end of the lead frames 11 and 12 extends to the +Z direction on the side surface of the transparent resin body 17. This avoids burring which would occur if this metal material extended to the −Z direction on the side surface of the transparent resin body 17 and protruded from the lower surface of the LED package 1. Hence, when the LED package 1 is mounted, no mounting failure occurs due to burring.

Next, a variation of the embodiment is described.

This variation is a variation of the method for forming the lead frame sheet.

More specifically, this variation is different from the above first embodiment in the method for forming the lead frame sheet shown in FIG. 4A.

FIGS. 8A to 8H are cross-sectional views of processes, illustrating the method for forming the lead frame sheet in this variation.

Figure 8A:
FIGS. 8A to 8H are cross-sectional views of processes, illustrating a method for forming a lead frame sheet in a variation of the first embodiment.
Figure 8B:
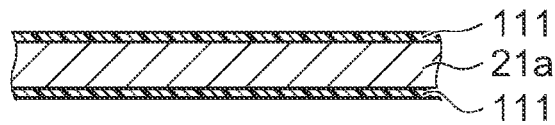
Figure 8C:
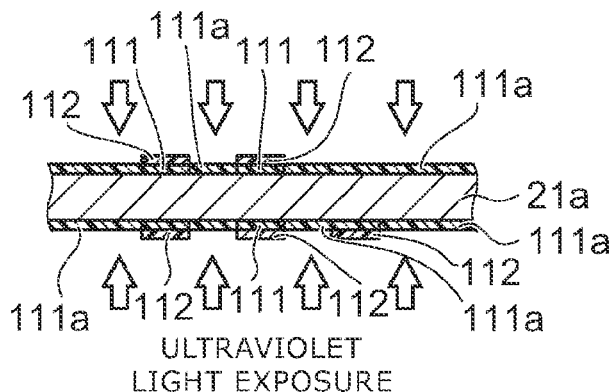
Figure 8D:
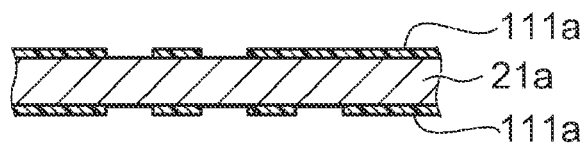
Figure 8E:
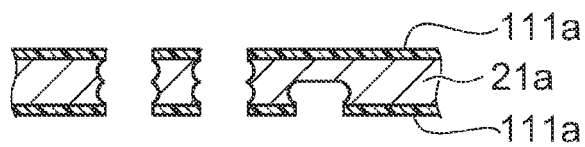
Figure 8F:
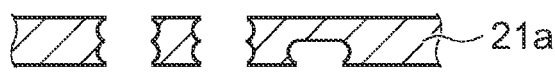
Figure 8G:
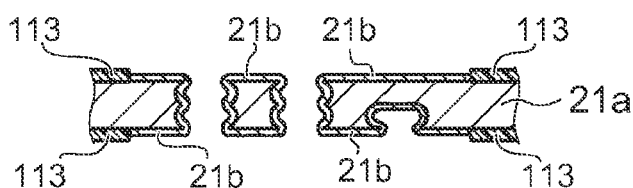
Figure 8H:
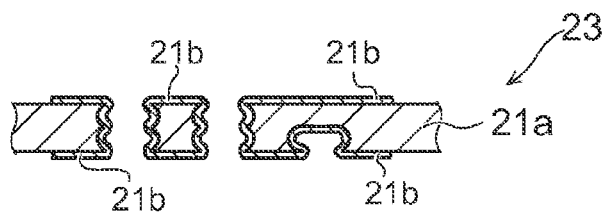

First, as shown in FIG. 8A, a copper plate 21a is prepared and cleaned. Next, as shown in FIG. 8B, resist coating is applied to both surfaces of the copper plate 21a and then dried to form a resist film 111. Next, as shown in FIG. 8C, a mask pattern 112 is placed on the resist film 111 and exposed to ultraviolet radiation. Thus, the light-exposed portion of the resist film 111 is cured to form a resist mask 111a. Next, as shown in FIG. 8D, development is performed, and the uncured portion of the resist film 111 is washed away. Thus, a resist pattern 111a is left on the upper and lower surfaces of the copper plate 21a. Next, as shown in FIG. 8E, the resist pattern 111a is used as a mask to perform etching to remove the exposed portion of the copper plate 21a from both surfaces. At this time, the etching depth is set to approximately half the plate thickness of the copper plate 21a. Thus, the region etched only from one side is half-etched, and the region etched from both sides is penetrated. Next, as shown in FIG. 8F, the resist pattern 111a is removed. Next, as shown in FIG. 8G, the end of the copper plate 21a is covered with a mask 113, and plating is performed. Thus, a silver plating layer 21b is formed on the surface of the portion of the copper plate 21a except its end. Next, as shown in FIG. 8H, the mask 113 is cleaned away. Subsequently, inspection is performed. Thus, a lead frame sheet 23 is fabricated. The configuration, manufacturing method, and functional effect of this variation other than the foregoing are similar to those of the above first embodiment.

Next, a second embodiment of the invention is described.

Figure 9:
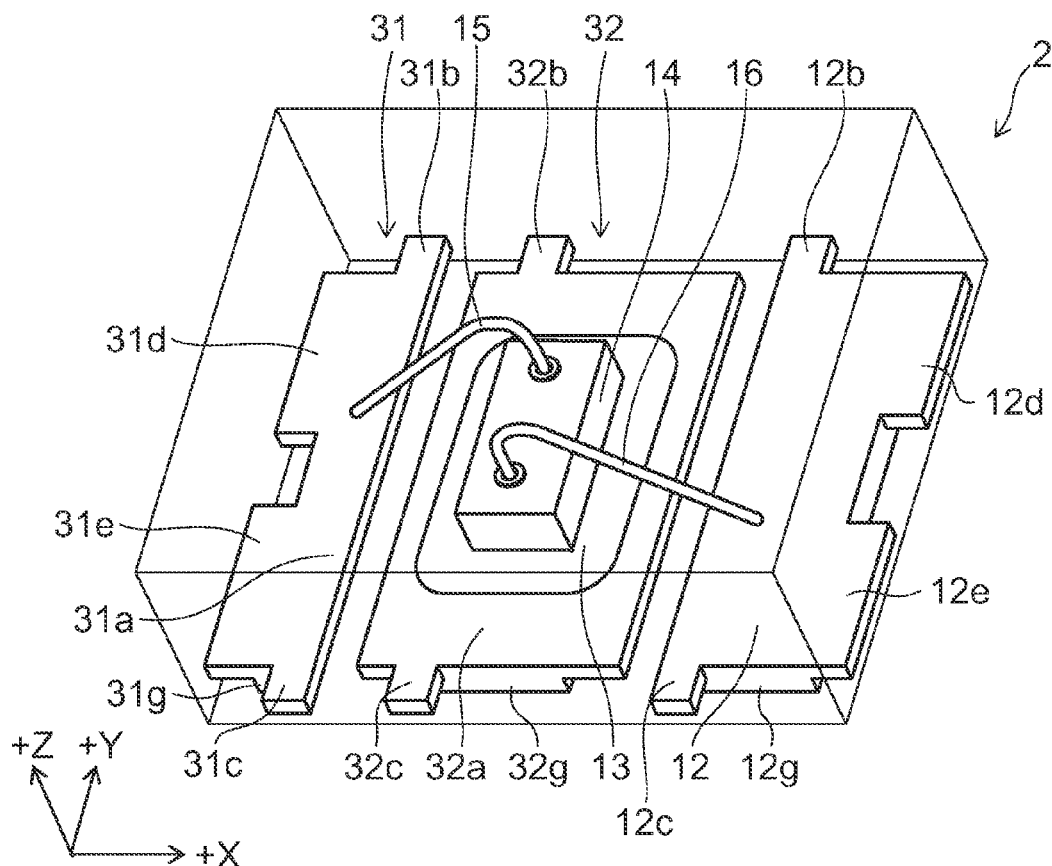
FIG. 9 is a perspective view illustrating an LED package according to a second embodiment.

FIG. 9 is a perspective view illustrating an LED package according to the embodiment.

Figure 10:
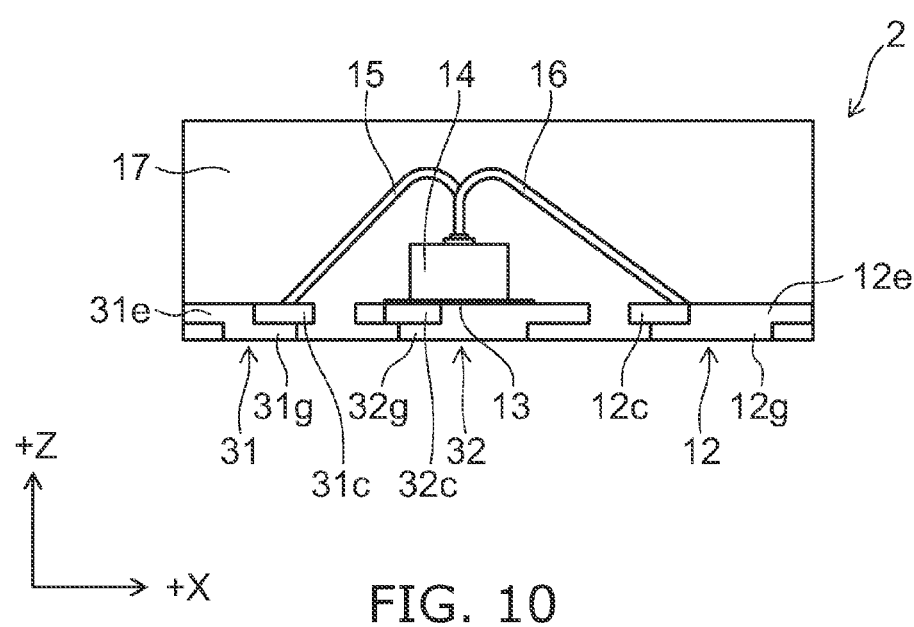
FIG. 10 is a side view illustrating the LED package according to the second embodiment.

FIG. 10 is a side view illustrating the LED package according to the embodiment.

As shown in FIGS. 9 and 10, the LED package 2 according to the embodiment is different from the LED package 1 (see FIG. 1) according to the above first embodiment in that the lead frame 11 (see FIG. 1) is divided into two lead frames 31 and 32 in the X direction. The lead frame 32 is located between the lead frame 31 and the lead frame 12. In the lead frame 31, extending portions 31d and 31e corresponding to the extending portions 11d and 11e (see FIG. 1) of the lead frame 11 are formed. Furthermore, extending portions 31b and 31c extending out from the base portion 31a to the +Y direction and −Y direction, respectively, are formed. The positions of the extending portions 31b and 31c in the X direction are the same. Furthermore, a wire 15 is bonded to the lead frame 31. On the other hand, in the lead frame 32, extending portions 32b and 32c corresponding to the extending portions 11b and 11c (see FIG. 1) of the lead frame 11 are formed. An LED chip 14 is disposed on the lead frame 32 via a die mount material 13. Furthermore, the protrusion corresponding to the protrusion 11g of the lead frame 11 is divided into protrusions 31g and 32g formed in the lead frames 31 and 32, respectively.

In the embodiment, the lead frames 31 and 12 function as external electrodes by external potential application. On the other hand, there is no need to apply a potential to the lead frame 32. The lead frame 32 can be used as a lead frame intended exclusively for a heat sink. Thus, in the case where a plurality of LED packages 2 are disposed on one module, the lead frame 32 can be connected to a common heat sink. Here, the lead frame 32 may be applied with the ground potential, or may be placed in a floating state. When the LED package 2 is mounted on a mother board, the so-called Manhattan phenomenon can be suppressed by bonding a solder ball to each of the lead frames 31, 32, and 12. The Manhattan phenomenon is a phenomenon in which, when a device or the like is mounted on a substrate via a plurality of solder balls and the like, the device rises up due to the different melting timing of the solder balls in the reflow furnace and the surface tension of solder. This is a phenomenon causing mounting failure. According to the embodiment, the layout of the lead frame is symmetrized in the X direction, and the solder balls are densely placed in the X direction. Thus, the Manhattan phenomenon is unlikely to occur.

Furthermore, in the embodiment, the lead frame 31 is supported from three directions by the extending portions 31b to 31e, hence improving the bonding performance of the wire 15. Likewise, the lead frame 12 is supported from three directions by the extending portions 12b to 12e, hence improving the bonding performance of the wire 16.

Such an LED package 2 can be manufactured by a method similar to that of the above first embodiment by changing the basic pattern of each device region P of the lead frame sheet 23 in the aforementioned process shown in FIG. 4A. That is, the manufacturing method described in the above first embodiment can manufacture LED packages with various layouts simply by changing the pattern of the masks 22a and 22b. The configuration, manufacturing method, and functional effect of the embodiment other than the foregoing are similar to those of the above first embodiment.

Next, a third embodiment of the invention is described.

Figure 11:
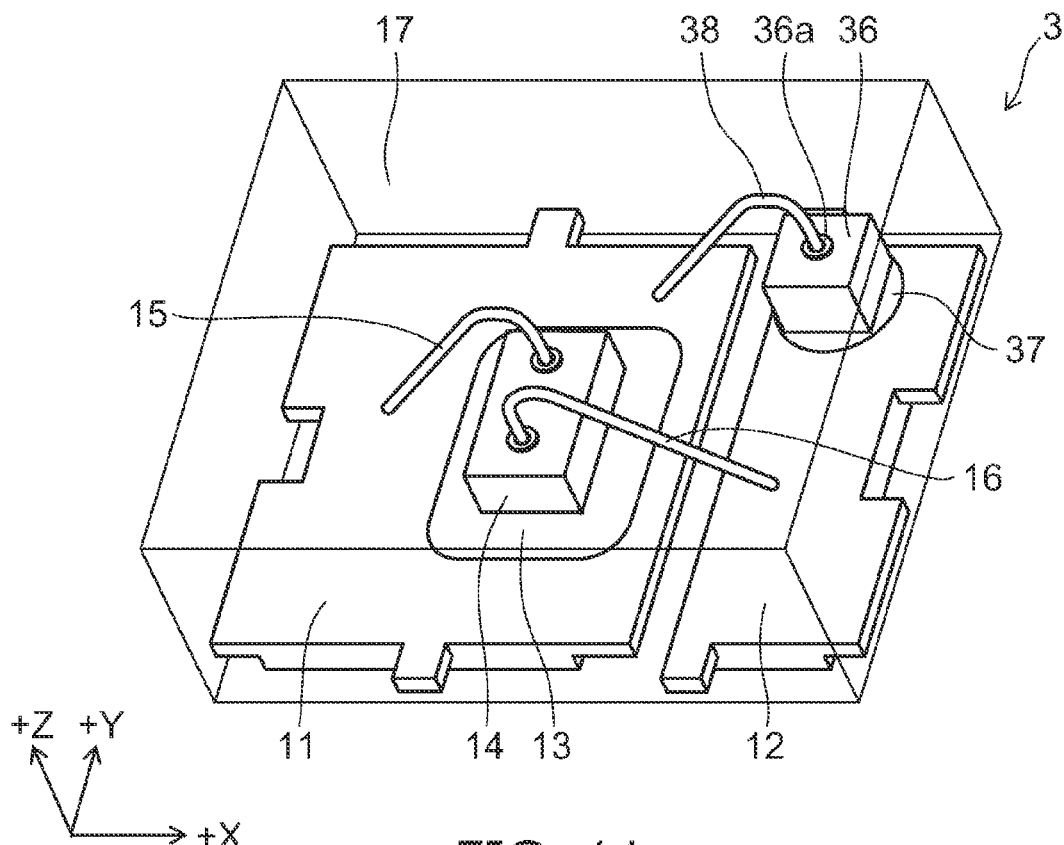
FIG. 11 is a perspective view illustrating an LED package according to a third embodiment.

FIG. 11 is a perspective view illustrating an LED package according to the embodiment.

Figure 12:
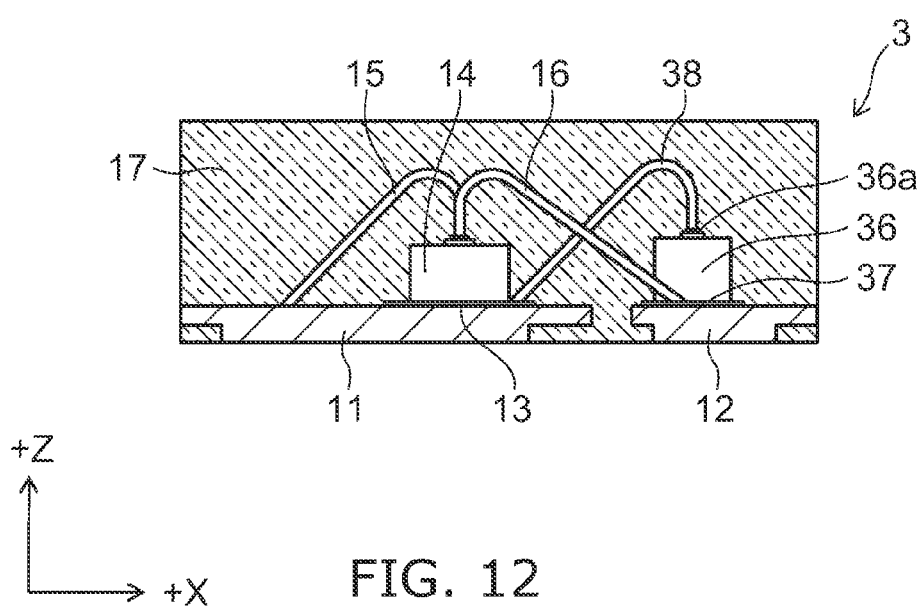
FIG. 12 is a cross-sectional view illustrating the LED package according to the third embodiment.

FIG. 12 is a cross-sectional view illustrating the LED package according to the embodiment.

As shown in FIGS. 11 and 12, in addition to the configuration of the LED package 1 (see FIG. 1) according to the above first embodiment, the LED package 3 according to the embodiment includes a Zener diode chip 36, and the like. The Zener diode chip 36 is connected between the lead frame 11 and the lead frame 12. More specifically, a die mount material 37 made of a conductive material such as solder or silver paste is attached onto the upper surface of the lead frame 12, and the Zener diode chip 36 is provided thereon. Thus, the Zener diode chip 36 is disposed on the lead frame 12 via the die mount material 37. The lower surface terminal (not shown) of the Zener diode chip 36 is connected to the lead frame 12 via the die mount material 37. Furthermore, the upper surface terminal 36a of the Zener diode chip 36 is connected to the lead frame 11 via a wire 38. That is, one end of the wire 38 is connected to the upper surface terminal 36a of the Zener diode chip 36. The wire 38 is drawn out from the terminal 36a to the +Z direction and curved toward the direction between the −Z direction and the −X direction. The other end of the wire 38 is bonded to the upper surface of the lead frame 11.

Thus, in the embodiment, the Zener diode chip 36 can be connected parallel to the LED chip 14. Consequently, this improves ESD (electrostatic discharge) resistance. The configuration, manufacturing method, and functional effect of the embodiment other than the foregoing are similar to those of the above first embodiment.

Next, a fourth embodiment of the invention is described.

Figure 13:
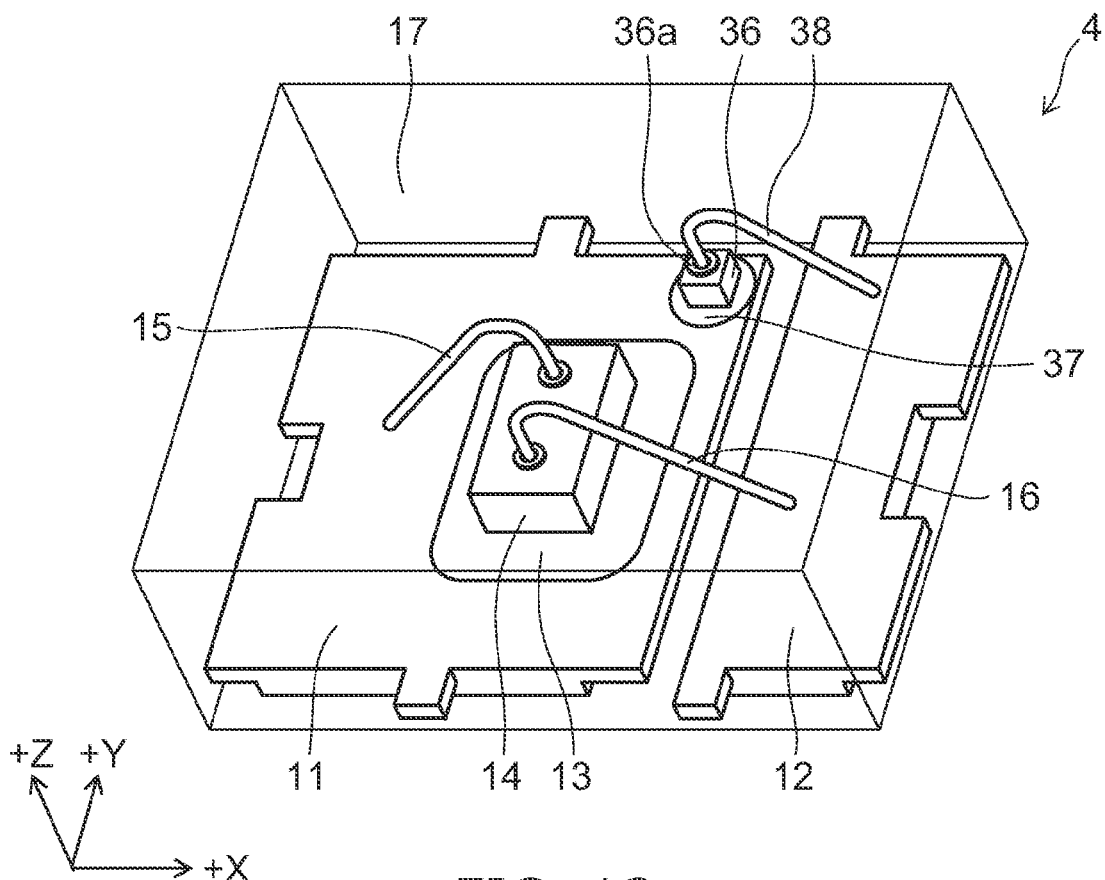
FIG. 13 is a perspective view illustrating an LED package according to a fourth embodiment.

FIG. 13 is a perspective view illustrating an LED package according to the embodiment.

Figure 14:
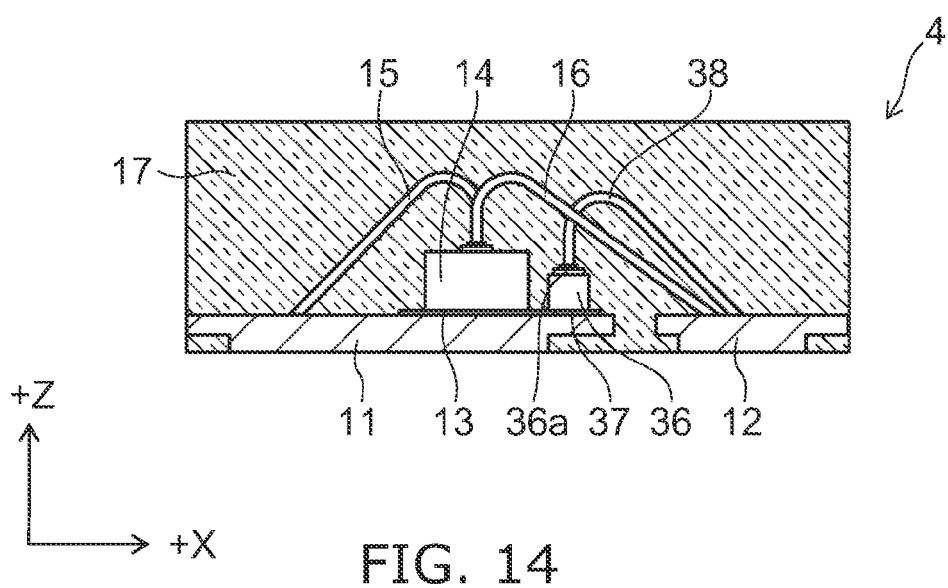
FIG. 14 is a cross-sectional view illustrating the LED package according to the fourth embodiment.

FIG. 14 is a cross-sectional view illustrating the LED package according to the embodiment.

As shown in FIGS. 13 and 14, the LED package 4 according to the embodiment is different from the LED package 3 (see FIG. 11) according to the above third embodiment in that the Zener diode chip 36 is disposed on the lead frame 11. In this case, the lower surface terminal of the Zener diode chip 36 is connected to the lead frame 11 via the die mount material 37, and the upper surface terminal is connected to the lead frame 12 via a wire 38. The configuration, manufacturing method, and functional effect of the embodiment other than the foregoing are similar to those of the above third embodiment.

Next, a fifth embodiment of the invention is described.

Figure 15:
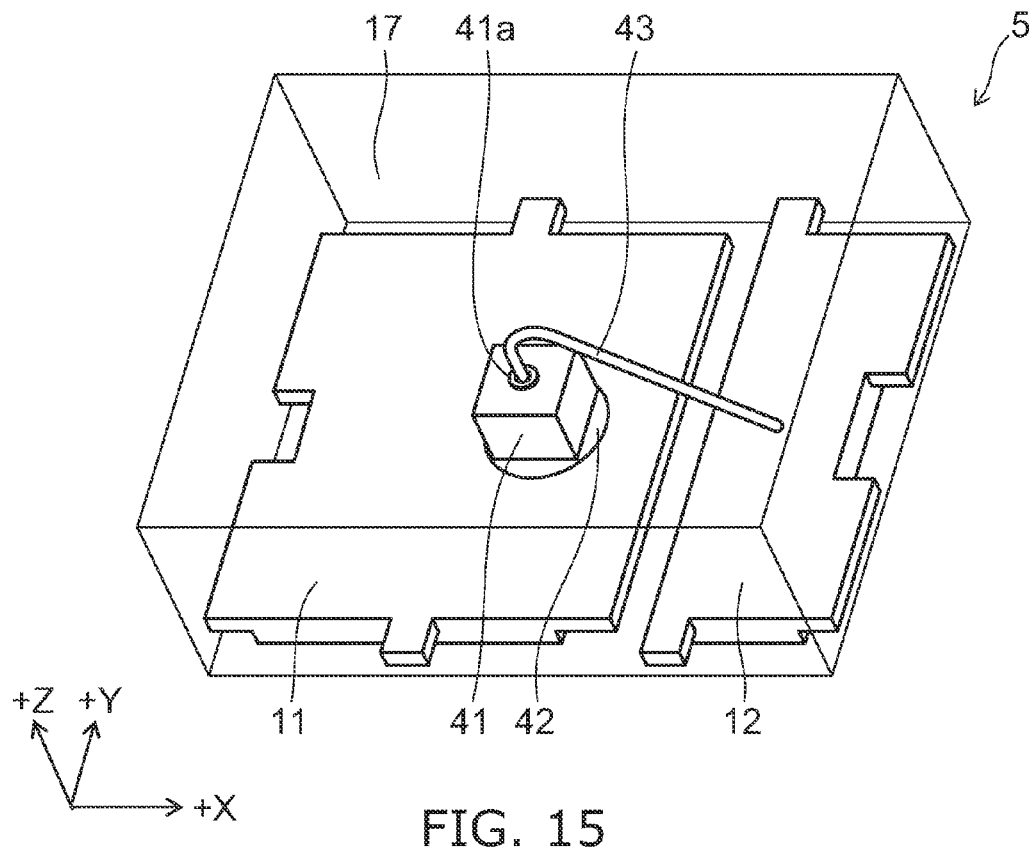
FIG. 15 is a perspective view illustrating an LED package according to a fifth embodiment.

FIG. 15 is a perspective view illustrating an LED package according to the embodiment.

Figure 16:
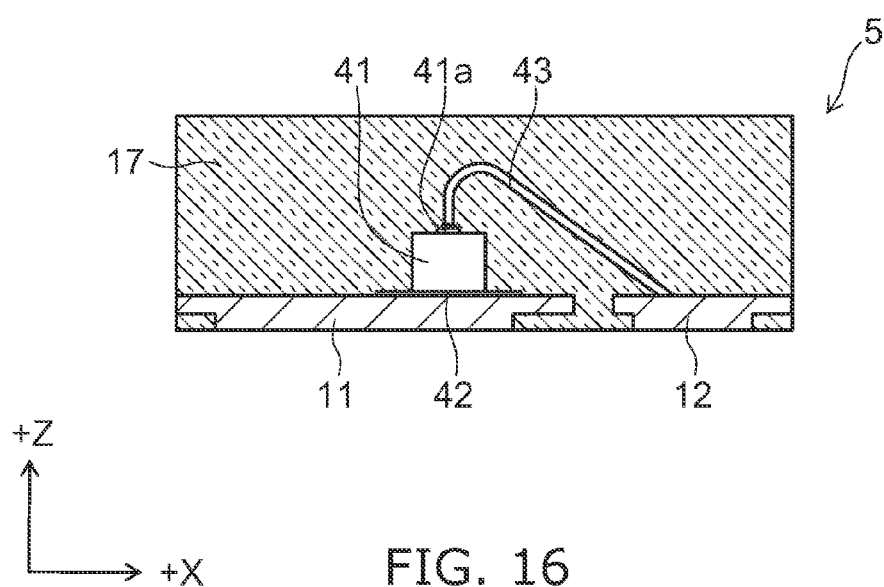
FIG. 16 is a cross-sectional view illustrating the LED package according to the fifth embodiment.

FIG. 16 is a cross-sectional view illustrating the LED package according to the embodiment.

As shown in FIGS. 15 and 16, the LED package 5 according to the embodiment is different from the LED package 1 (see FIG. 1) according to the above first embodiment in including a vertically conducting LED chip 41 instead of the LED chip 14 having upper surface terminals. More specifically, in the LED package 5 according to the embodiment, a die mount material 42 made of a conductive material such as solder or silver paste is formed on the upper surface of the lead frame 11. The LED chip 41 is disposed via the die mount material 42. The lower surface terminal (not shown) of the LED chip 41 is connected to the lead frame 11 via the die mount material 42. On the other hand, the upper surface terminal 41a of the LED chip 41 is connected to the lead frame 12 via a wire 43.

In the embodiment, a vertically conducting LED chip 41 is adopted, and a single wire is used. This can reliably prevent contact between wires, and simplify the wire bonding process. The configuration, manufacturing method, and functional effect of the embodiment other than the foregoing are similar to those of the above first embodiment.

Next, a sixth embodiment of the invention is described.

Figure 17:
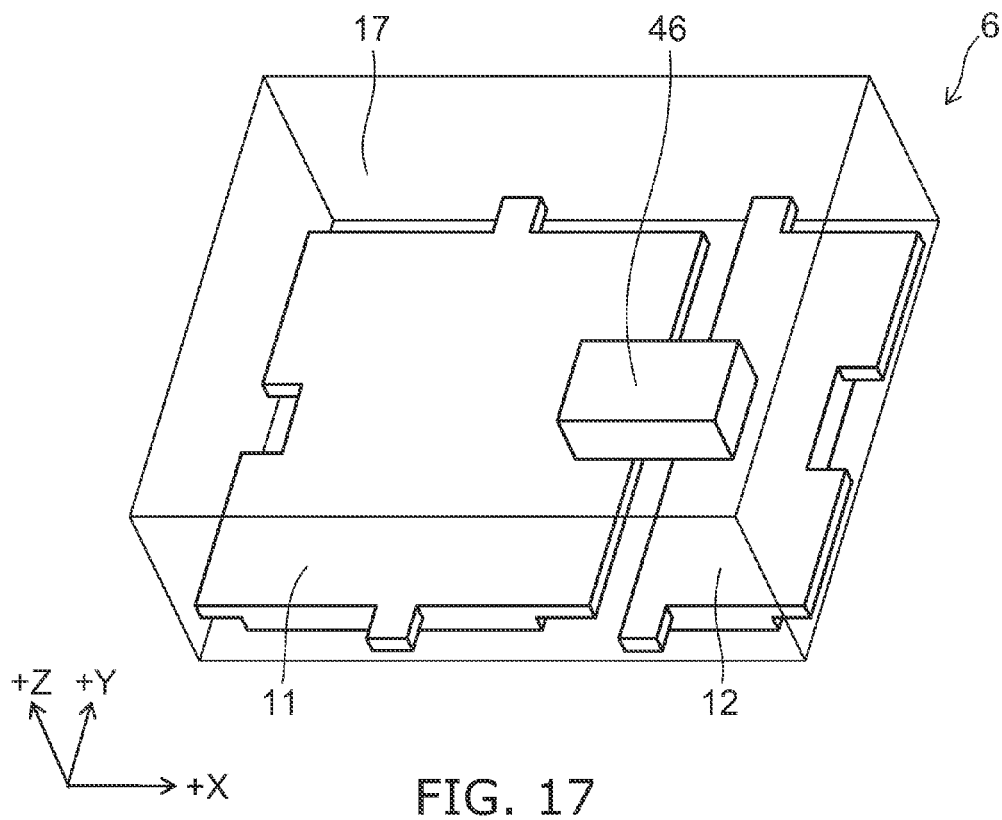
FIG. 17 is a perspective view illustrating an LED package according to a sixth embodiment.

FIG. 17 is a perspective view illustrating an LED package according to the embodiment.

Figure 18:
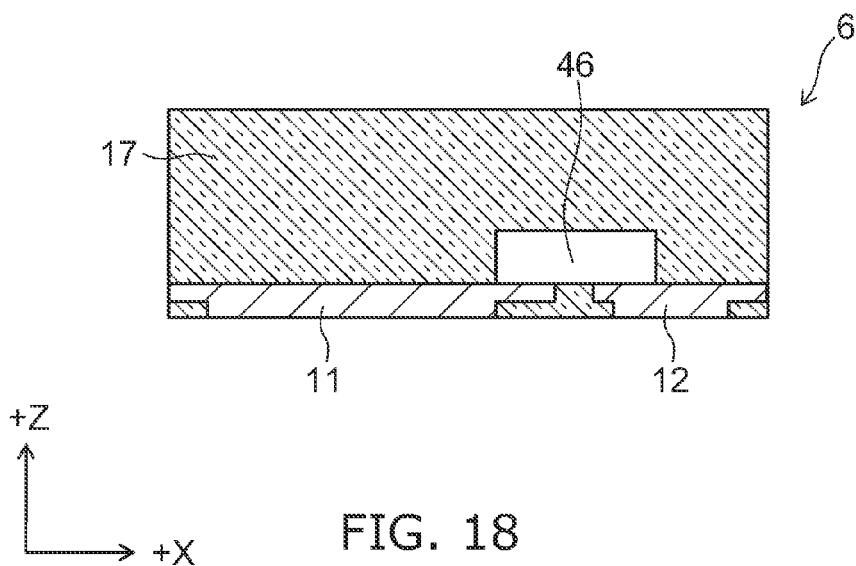
FIG. 18 is a cross-sectional view illustrating the LED package according to the sixth embodiment.

FIG. 18 is a cross-sectional view illustrating the LED package according to the embodiment.

As shown in FIGS. 17 and 18, the LED package 6 according to the embodiment is different from the LED package 1 (see FIG. 1) according to the above first embodiment in including a flip-type LED chip 46 instead of the LED chip 14 having upper surface terminals. More specifically, in the LED package 6 according to the embodiment, two terminals are provided on the lower surface of the LED chip 46. Furthermore, the LED chip 46 is placed like a bridge so as to straddle between the lead frame 11 and the lead frame 12. One lower surface terminal of the LED chip 46 is connected to the lead frame 11, and the other lower surface terminal is connected to the lead frame 12.

In the embodiment, a flip-type LED chip 46 is adopted to eliminate wires. This can enhance the upward light extraction efficiency and omit the wire bonding process. Furthermore, it can also prevent wire breakage due to thermal stress of the transparent resin body 17. The configuration, manufacturing method, and functional effect of the embodiment other than the foregoing are similar to those of the above first embodiment.

Next, a seventh embodiment of the invention is described.

Figure 19:
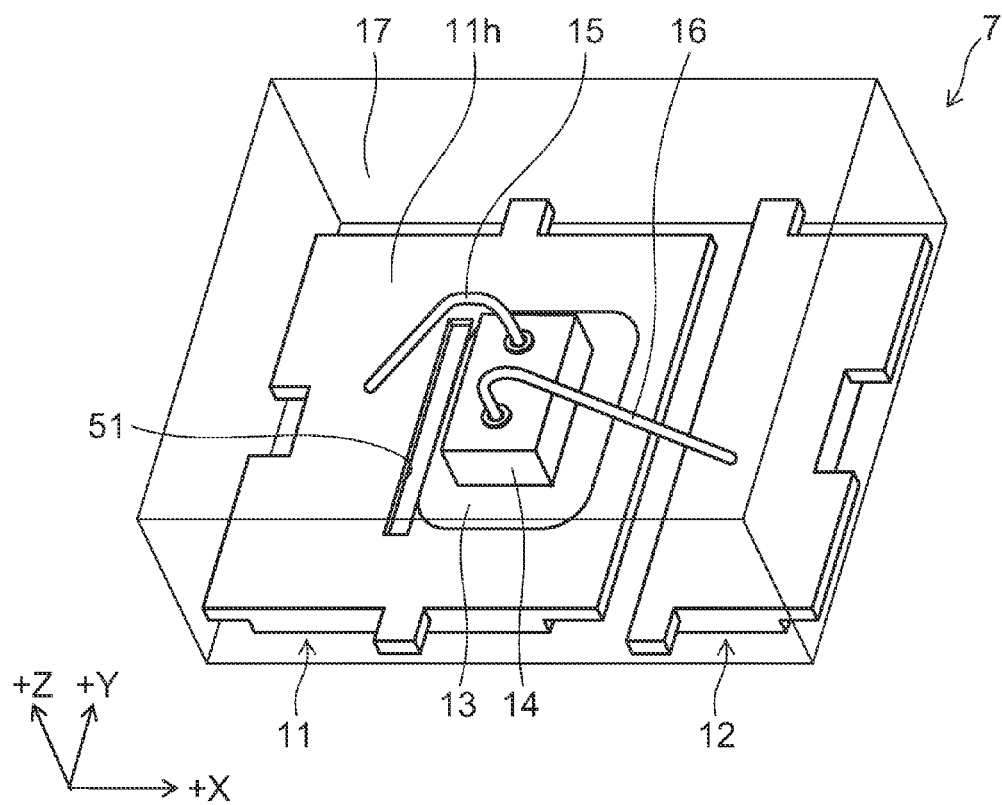
FIG. 19 is a perspective view illustrating an LED package according to a seventh embodiment.

FIG. 19 is a perspective view illustrating an LED package according to the embodiment.

Figure 20:
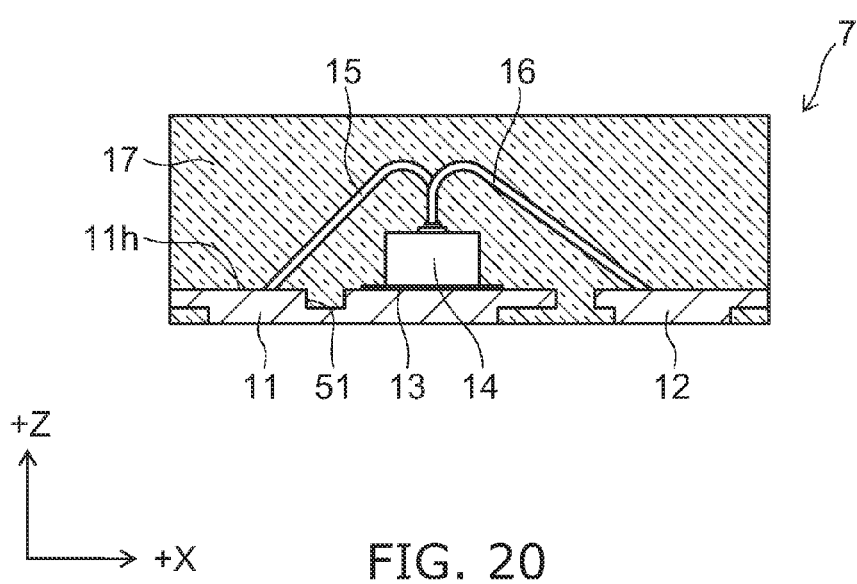
FIG. 20 is a cross-sectional view illustrating the LED package according to the seventh embodiment.

FIG. 20 is a cross-sectional view illustrating the LED package according to the embodiment.

As shown in FIGS. 19 and 20, the LED package 7 according to the embodiment is different from the LED package 1 (see FIG. 1) according to the above first embodiment in that, in addition to the configuration of the LED package 1, a groove 51 is formed in the upper surface 11h of the lead frame 11. The groove 51 extends in the Y direction and is formed in the upper surface 11h of the lead frame 11 between the region where the LED chip is disposed 14 and the region where the wire 15 is bonded. That is, as viewed from the groove 51, the LED chip 14 is located on the +X direction side, and the wire 15 is bonded on the −X direction side. The groove 51 does not reach either Y-direction end of the lead frame 11, nor penetrate through the lead frame 11 in the thickness direction. The groove 51 can be formed by, e.g., half-etching the conductive sheet 21 from the upper surface side in the aforementioned processes shown in FIGS. 4A and 4B. Alternatively, the groove 51 may be formed by a mechanical method such as mold pressing or grinding.

According to the embodiment, a groove 51 is formed in the upper surface of the lead frame 11. Thus, in the aforementioned process shown in FIG. 4C, when the paste-like die mount material 13 is attached to the upper surface of the lead frame 11, even if there is any variation in the supply amount and supply position of the die mount material 13, the die mount material 13 can be prevented from running out into the bonding region of the wire 15. This prevents the bonding region of the wire 15 from being contaminated with the die mount material 13. Thus, the wire 15 can be reliably bonded to the lead frame 11. The configuration, manufacturing method, and functional effect of the embodiment other than the foregoing are similar to those of the above first embodiment.

Next, a first variation of the seventh embodiment is described.

Figure 21:
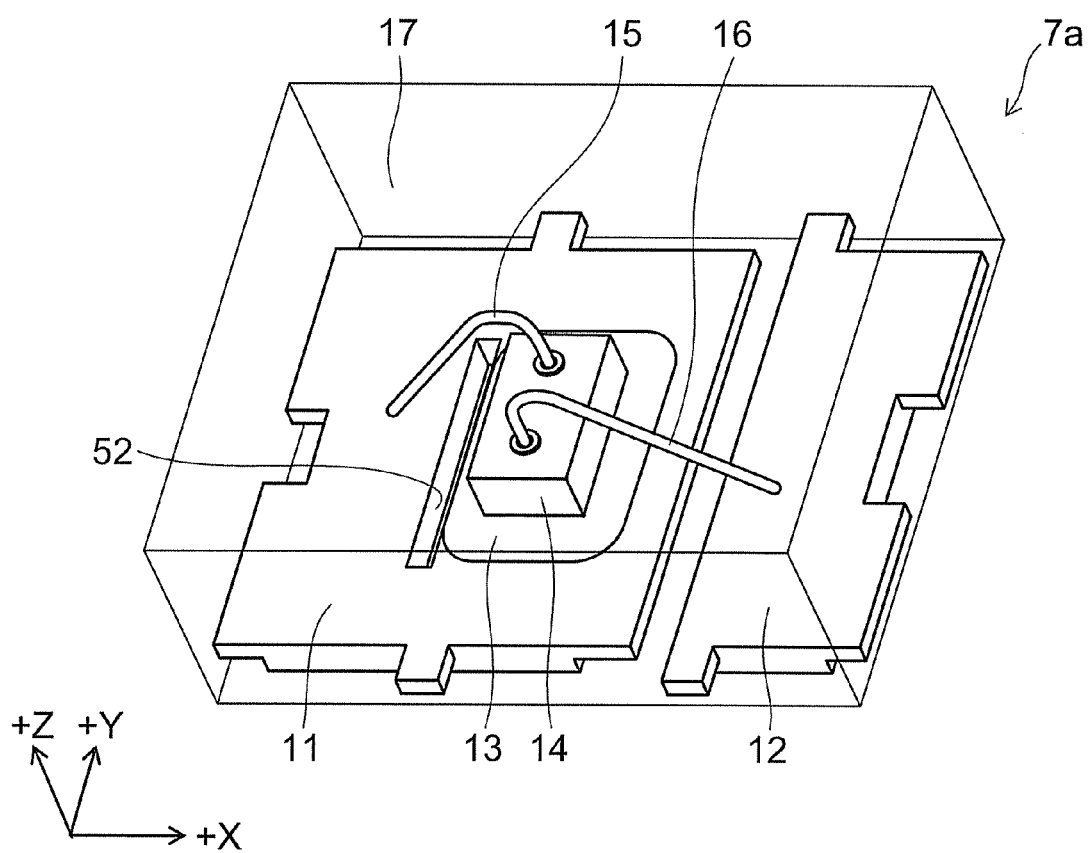
FIG. 21 is a perspective view illustrating an LED package according to a first variation of the seventh embodiment.

FIG. 21 is a perspective view illustrating an LED package according to this variation.

As shown in FIG. 21, the LED package 7a according to this variation is different from the LED package 7 (see FIG. 19) according to the above seventh embodiment in that a through groove 52 is formed instead of the groove 51. The through groove 52 penetrates through the lead frame 11 in the thickness direction. The configuration, manufacturing method, and functional effect of this variation other than the foregoing are similar to those of the above seventh embodiment.

Next, a second variation of the seventh embodiment is described.

Figure 22:
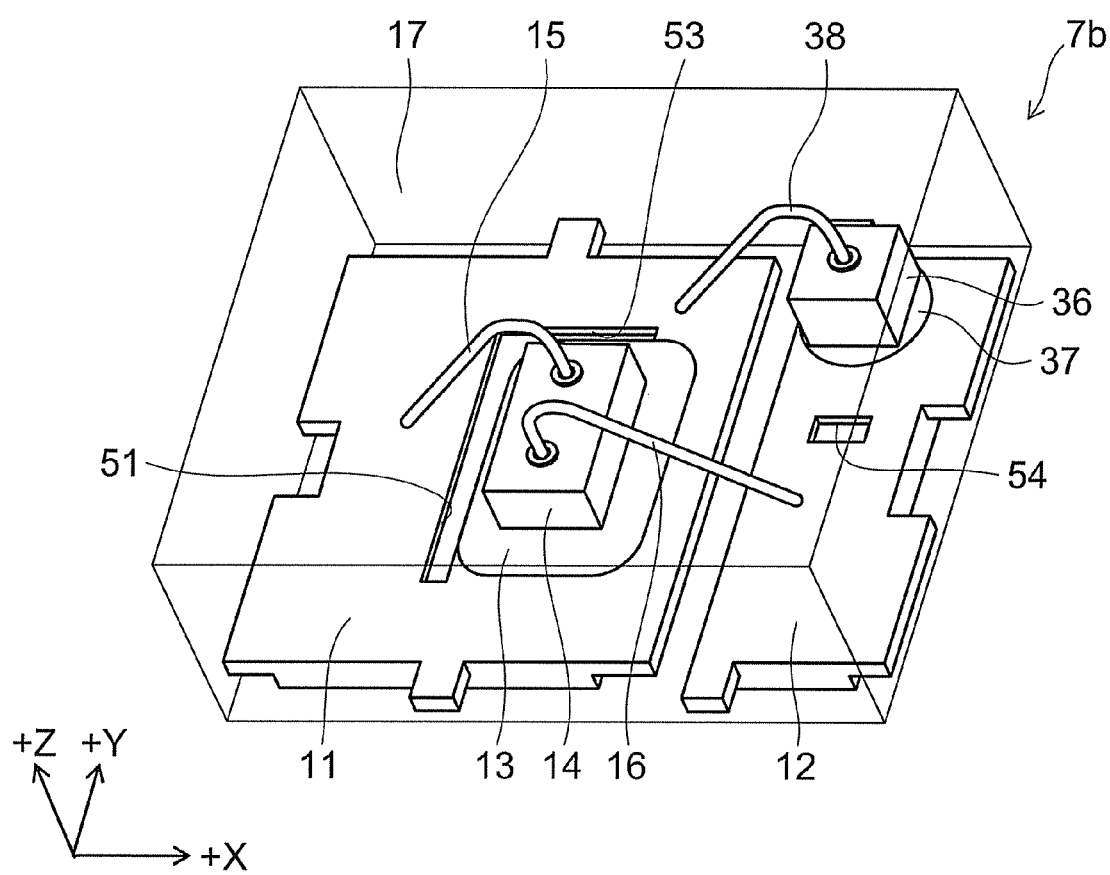
FIG. 22 is a perspective view illustrating an LED package according to a second variation of the seventh embodiment.

FIG. 22 is a perspective view illustrating an LED package according to this variation.

As shown in FIG. 22, the LED package 7b according to this variation is different from the LED package 3 (see FIG. 11) according to the above third embodiment in that, in addition to the configuration of the LED package 3, grooves 51 and 53 are formed in the upper surface 11h of the lead frame 11, and a groove 54 is formed in the upper surface 12h of the lead frame 12. The configuration of the groove 51 is similar to that in the above first variation. The groove 53 extends in the X direction, and its −X-direction end is joined to the +Y-direction end of the groove 51. Thus, the grooves 51 and 53 form one L-shaped groove. The groove 53 is formed in the upper surface 11h of the lead frame 11 between the region where the LED chip 14 is disposed and the region where the wire 38 is bonded. On the other hand, the groove 53 does not reach either X-direction end of the lead frame 11, nor penetrate through the lead frame 11 in the thickness direction. The groove 54 extends in the X direction and is formed in the upper surface 12h of the lead frame 12 between the region where the Zener diode chip 36 is disposed and the region where the wire 16 is bonded. The groove 54 does not reach either X-direction end of the lead frame 12, nor penetrate through the lead frame 12 in the thickness direction.

According to this variation, a groove 51 is formed in the upper surface of the lead frame 11. Thus, when the die mount material 13 is attached to the upper surface of the lead frame 11, even if there is any variation in the attached amount and attached position of the die mount material 13, the die mount material 13 can be prevented from running out into the bonding region of the wire 15. Furthermore, a groove 53 is formed. Thus, the die mount material 13 can be prevented from running out into the formation region of the wire 38. Moreover, a groove 54 is formed in the upper surface of the lead frame 12. Thus, the die mount material 37 can be prevented from running out into the formation region of the wire 16. Consequently, the wires 15 and 38 can be reliably bonded to the lead frame 11, and the wire 16 can be reliably bonded to the lead frame 12. The configuration, manufacturing method, and functional effect of this variation other than the foregoing are similar to those of the above third embodiment.

Next, a third variation of the seventh embodiment is described.

Figure 23:
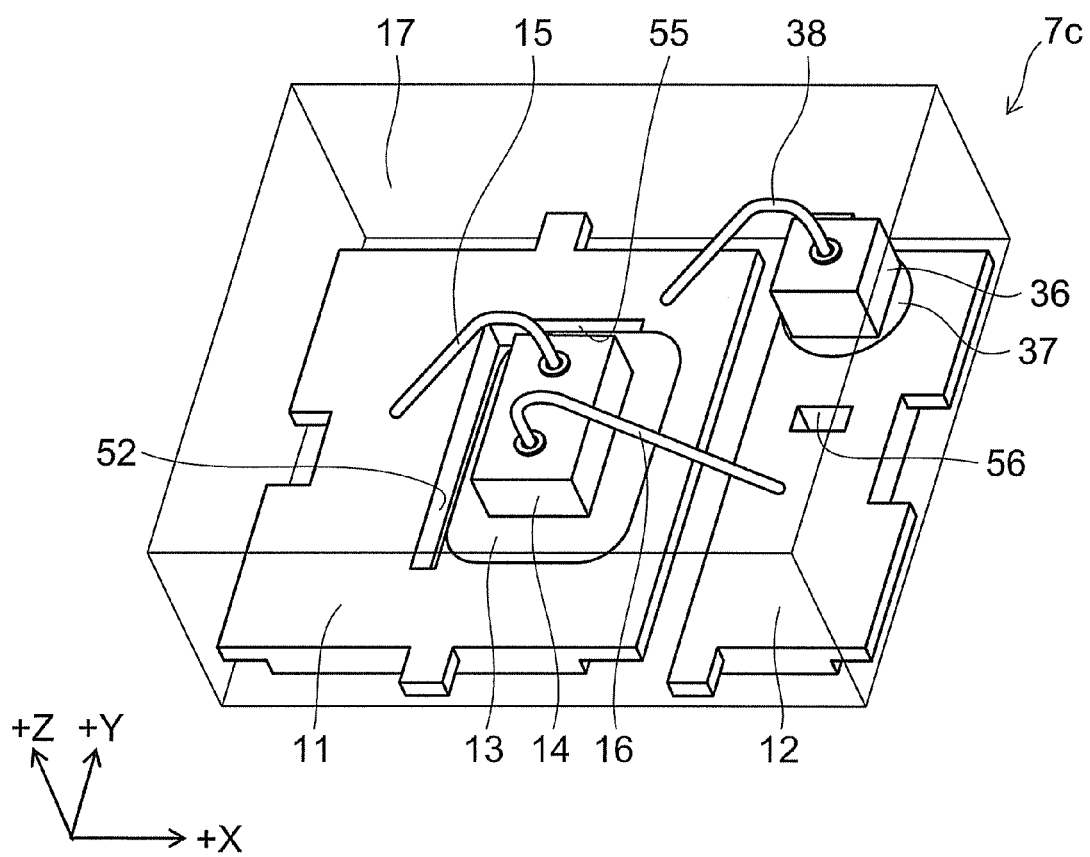
FIG. 23 is a perspective view illustrating an LED package according to a third variation of the seventh embodiment.

FIG. 23 is a perspective view illustrating an LED package according to this variation.

As shown in FIG. 23, the LED package 7c according to this variation is different from the LED package 7b (see FIG. 22) according to the above second variation of the seventh embodiment in that through grooves 52, 55, and 56 are formed instead of the grooves 51, 53, and 54. The through grooves 52 and 55 penetrate through the lead frame 11 in the thickness direction. The through groove 56 penetrates through the lead frame 12 in the thickness direction. The configuration, manufacturing method, and functional effect of this variation other than the foregoing are similar to those of the above second variation of the seventh embodiment.

Next, a fourth variation of the seventh embodiment is described.

Figure 24:
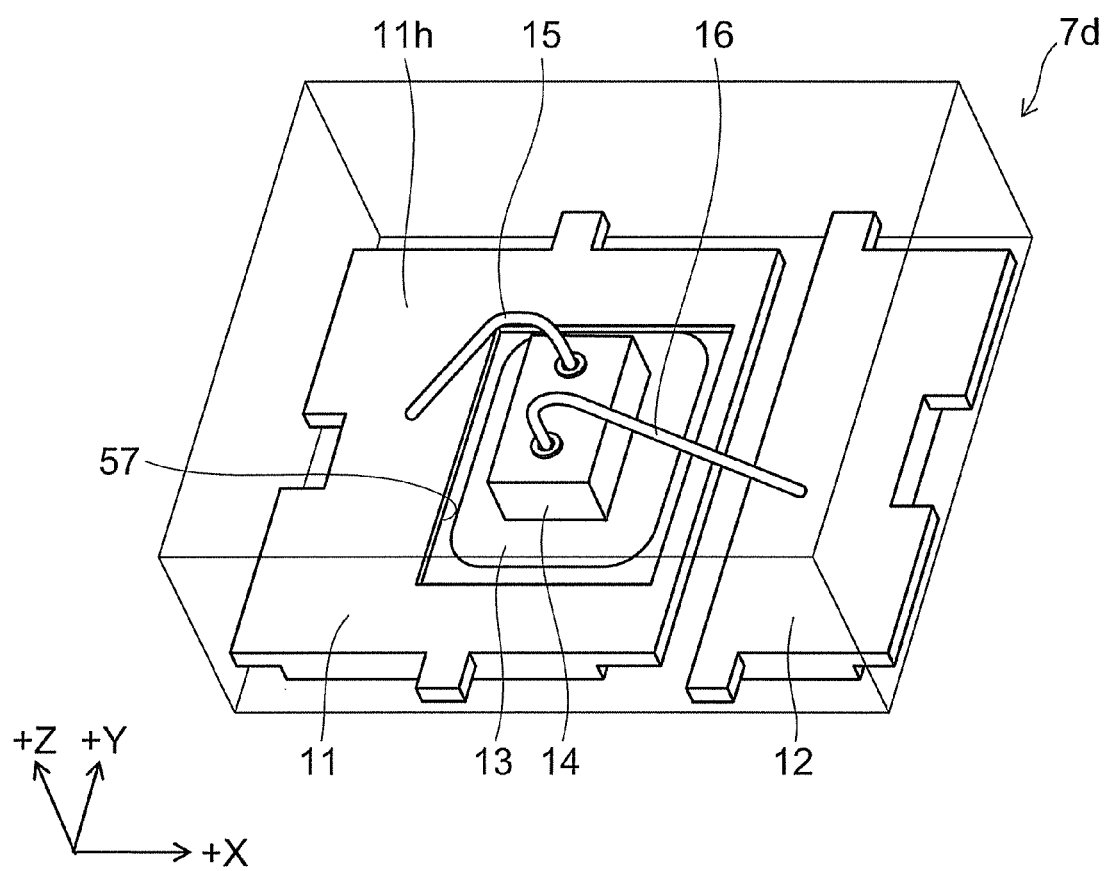
FIG. 24 is a perspective view illustrating an LED package according to a fourth variation of the seventh embodiment.

FIG. 24 is a perspective view illustrating an LED package according to this variation.

As shown in FIG. 24, the LED package 7d according to this variation is different from the LED package 1 (see FIG. 1) according to the above first embodiment in that, in addition to the configuration of the LED package 1, a recess 57 is formed in the upper surface 11h of the lead frame 11. The recess 57 is shaped like a rectangle as viewed from the +Z direction. The die mount material 13 and the LED chip 14 are located inside the recess 57. The wire 15 is bonded to the outside of the recess 57. The recess 57 can be formed by, e.g., half-etching the conductive sheet 21 from the upper surface side in the aforementioned processes shown in FIGS. 4A and 4B. Alternatively, the recess 57 may be formed by a mechanical method such as mold pressing or grinding.

According to this variation, the die mount material 13 is supplied into the recess 57. Hence, the die mount material 13 does not leak out of the recess 57. Thus, even if there is any variation in the supply amount and supply position of the die mount material 13, the die mount material 13 does not run out into the bonding region of the wire 15, nor drop from the edge of the lead frame 11. The configuration, manufacturing method, and functional effect of this variation other than the foregoing are similar to those of the above first embodiment.

Next, an eighth embodiment of the invention is described.

Figure 25A:
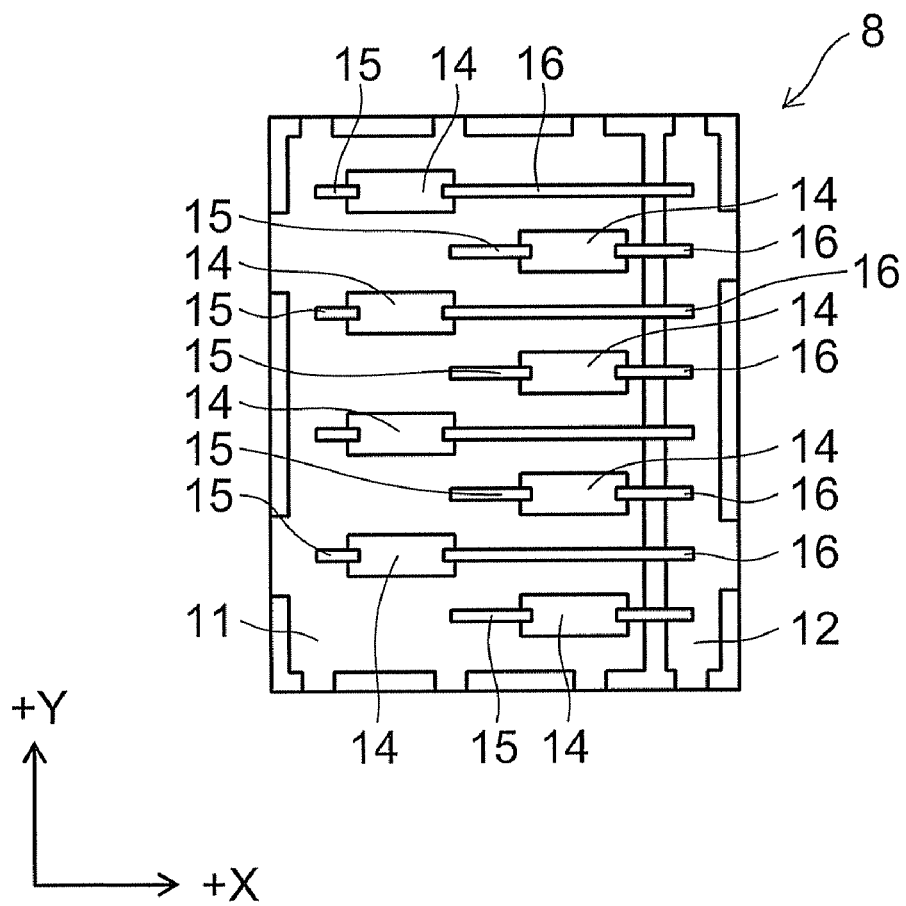
FIG. 25A is a plan view illustrating an LED package according to an eighth embodiment.
Figure 25B:
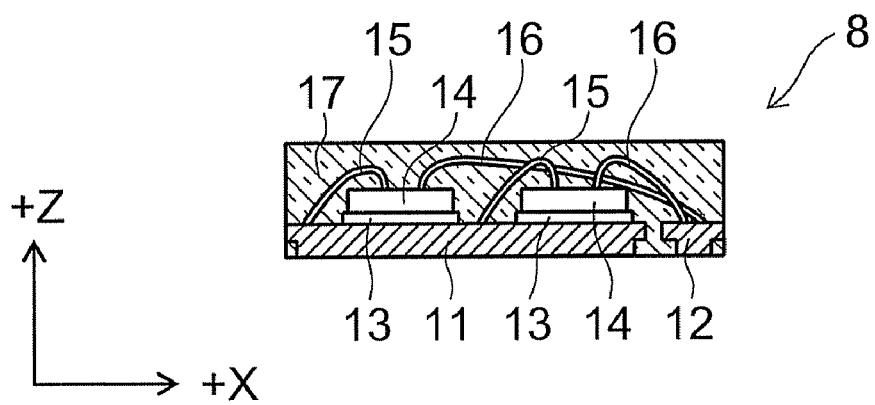
FIG. 25B is a cross-sectional view thereof.

FIG. 25A is a plan view illustrating an LED package according to the embodiment, and FIG. 25B is a cross-sectional view thereof.

As shown in FIGS. 25A and 25B, the LED package 8 according to the embodiment is different from the LED package 1 (see FIG. 1) according to the above first embodiment in including a plurality of, e.g. eight, LED chips 14. These eight LED chips 14 are chips emitting light of the same color and meeting the same specifications.

The eight LED chips 14 are all disposed on the lead frame 11. The terminal 14a (see FIG. 1) of each LED chip 14 is connected to the lead frame 11 via a wire 15. The terminal 14b (see FIG. 1) of each LED chip 14 is connected to the lead frame 12 via a wire 16. Thus, the eight LED chips 14 are connected parallel to each other between the lead frame 11 and the lead frame 12. Furthermore, the eight LED chips 14, two along the X direction and four along the Y direction, are not arranged in a matrix but in a staggered pattern. That is, the phase of arrangement of the column consisting of four LED chips 14 located on the +X-direction side and arranged along the Y direction is shifted by a half pitch with respect to the phase of arrangement of the column consisting of four LED chips 14 located on the −X-direction side and arranged along the Y direction.

According to the embodiment, a larger amount of light can be obtained by installing a plurality of LED chips 14 on one LED package 8. Furthermore, by arranging the LED chips 14 in a staggered pattern, the LED package 8 can be downsized while maintaining the shortest distance between the LED chips 14 at a certain value or more. Maintaining the shortest distance between the LED chips 14 at a certain value or more increases the probability that the light emitted from one LED chip 14 is absorbed by a phosphor before reaching the adjacent LED chip 14, and improves the light extraction efficiency. Furthermore, heat emitted from one LED chip 14 is less likely to be absorbed by the adjacent LED chip 14. This can suppress the decrease of light emission efficiency due to the temperature increase of the LED chips 14. The configuration, manufacturing method, and functional effect of the embodiment other than the foregoing are similar to those of the above first embodiment.

Next, a first variation of the eighth embodiment is described.

Figure 26:
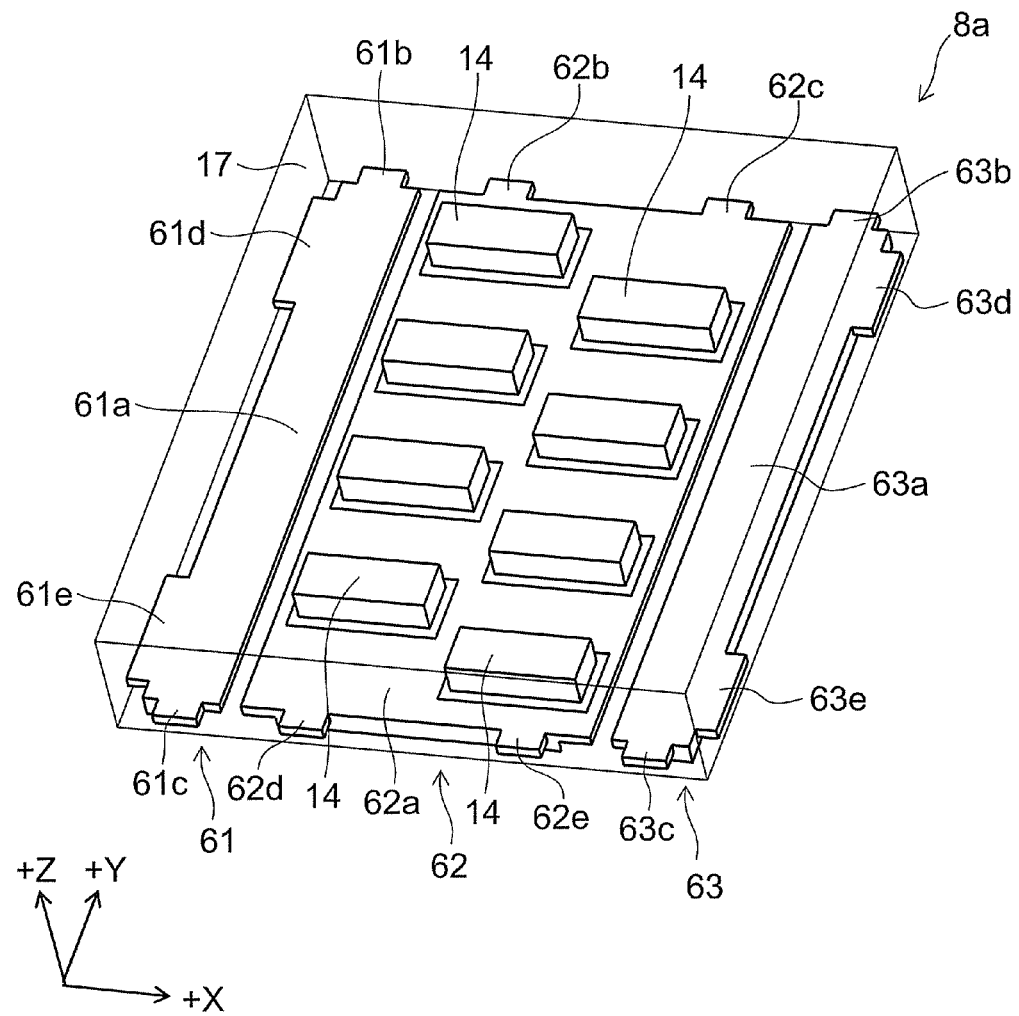
FIG. 26 is a perspective view illustrating an LED package according to a first variation of the eighth embodiment.

FIG. 26 is a perspective view illustrating an LED package according to this variation.

Figure 27A:
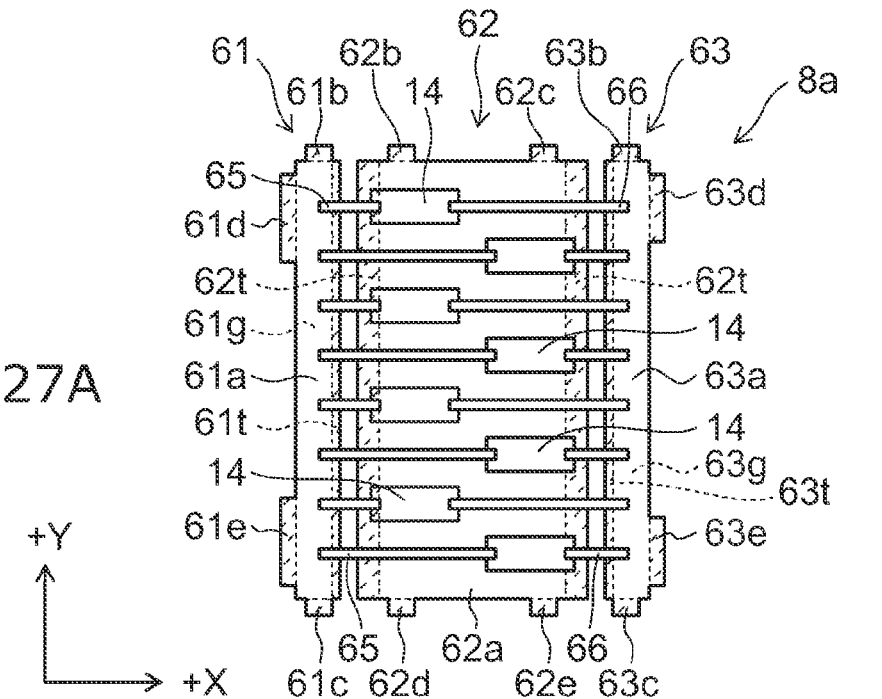
FIG. 27A is a plan view illustrating lead frames, LED chips, and wires of the LED package according to the first variation of the eighth embodiment.

FIG. 27A is a plan view illustrating lead frames, LED chips, and wires of the LED package according to this variation.

Figure 27B:
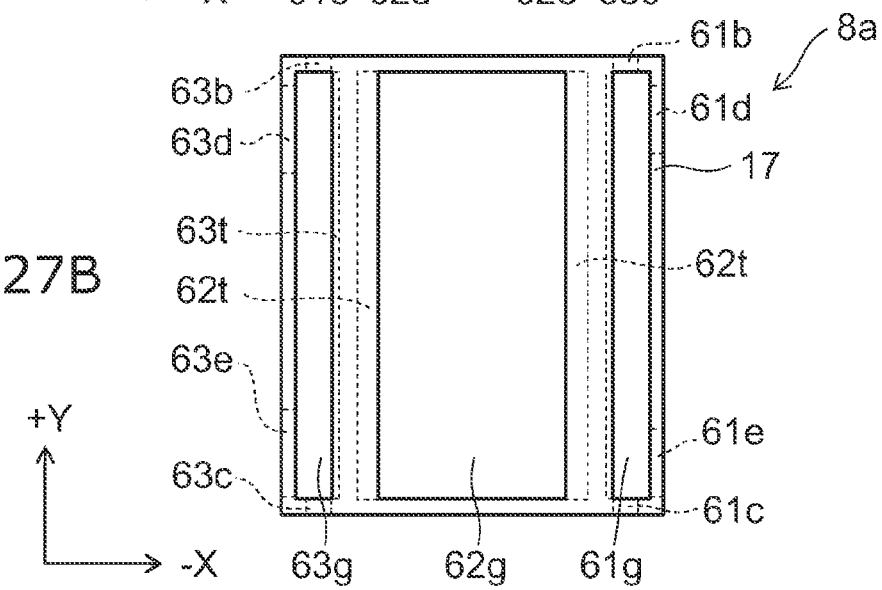
FIG. 27B is a bottom view illustrating the LED package.
Figure 27C:
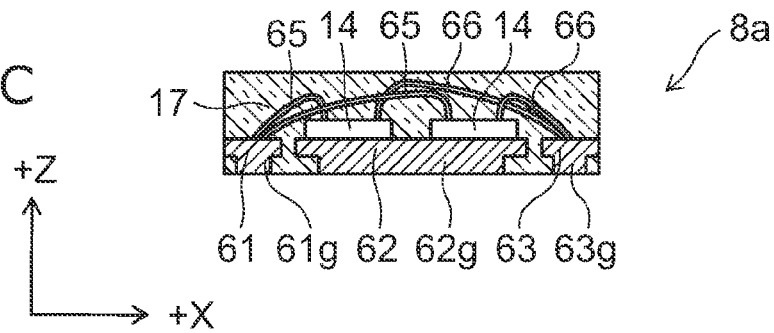
FIG. 27C is a cross-sectional view illustrating the LED package.

FIG. 27B is a bottom view illustrating the LED package. FIG. 27C is a cross-sectional view illustrating the LED package.

Wires are not shown in FIG. 26.

As shown in FIG. 26 and FIGS. 27A to 27C, this variation is an example of combining the second embodiment and the eighth embodiment described above. More specifically, the LED package 8a according to this variation includes three lead frames 61, 62, and 63 spaced from each other. In the lead frame 61, from a strip-shaped base portion 61a with the longitudinal direction directed in the Y direction, a extending portion 61b extends out to the +Y direction, a extending portion 61c extends out to the −Y direction, and two extending portions 61d and 61e extend out to the −X direction. In the lead frame 62, from a strip-shaped base portion 62a with the longitudinal direction directed in the Y direction, two extending portions 62b and 62c extend out to the +Y direction, and two extending portions 62d and 62e extend out to the −Y direction. The shape of the lead frame 63 is substantially the shape obtained by inverting the lead frame 61 in the X direction. However, the extending portions 63d and 63e are narrower than the extending portions 61d and 61e.

The LED package 8a includes a plurality of, e.g. eight, LED chips 14. The arrangement of the LED chips 14 in this variation is similar to that of the above eighth embodiment. More specifically, the LED chips 14 are provided in two columns, each including four chips arranged along the Y direction. The phase of arrangement of the column on the +X-direction side is shifted by a half pitch with respect to the column on the −X-direction side, and the columns are staggered. Each LED chip 14 is disposed on the lead frame 62 via a die mount material (not shown). The terminal 14a (see FIG. 1) is connected to the lead frame 61 via a wire 65, and the terminal 14b (see FIG. 1) is connected to the lead frame 63 via a wire 66. Furthermore, the lower surface of the protrusions 61g, 62g, and 63g of the lead frames 61, 62, and 63, respectively, is exposed at the lower surface of the transparent resin body 17. In contrast, the lower surface of the thin plate portions 61t, 62t, and 63t of the lead frames 61, 62, and 63, respectively, is covered with the transparent resin body 17. In FIG. 27A, the relatively thin portions in the lead frames 61, 62, and 63, i.e., the thin plate portions and the extending portions, are hatched with dashed lines.

Also in this variation, as in the above eighth embodiment, a large amount of light can be obtained by providing eight LED chips 14. Furthermore, as in the above second embodiment, by providing three lead frames, an electrically independent heat sink is realized, and the Manhattan phenomenon can be suppressed. Moreover, by arranging the LED chips 14 in a staggered pattern, the LED package 8a can be downsized while ensuring the light emission efficiency and extraction efficiency.

In the following, this effect is described with reference to a specific numerical example. For instance, the LED chip 14 has a length of 0.60 mm in the X direction and 0.24 mm in the Y direction. The X-direction distance between the LED chips 14 in the projection of the eight LED chips 14 on the XZ plane is 0.20 mm, and the Y-direction distance between the LED chips 14 in the projection on the YZ plane is 0.10 mm. Then, if the LED chips 14 are arranged in a staggered pattern, the eight LED chips 14 can be placed on a rectangular base portion 42a having a length of 1.6 mm in the X direction and 3.0 mm in the Y direction. In this case, the shortest distance between the LED chips 14 is $\sqrt{(0.10^2+0.20^2)} \approx 0.22$ mm. The configuration, manufacturing method, and functional effect of this variation other than the foregoing are similar to those of the above second and eighth embodiments.

Next, a second variation of the eighth embodiment is described.

Figure 28:
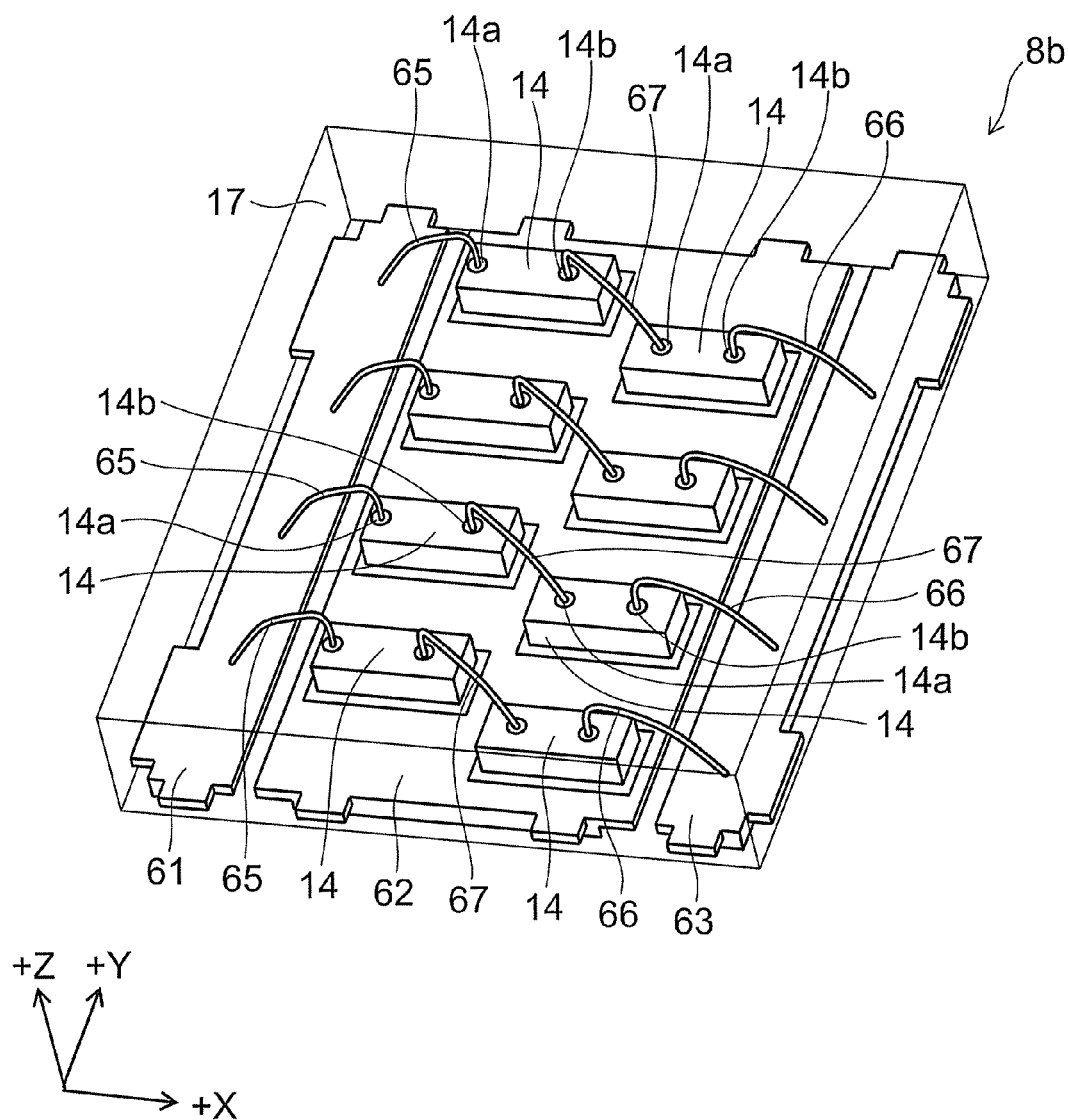
FIG. 28 is a perspective view illustrating an LED package according to a second variation of the eighth embodiment.

FIG. 28 is a perspective view illustrating an LED package according to this variation.

As shown in FIG. 28, the LED package 8b according to this variation is different from the LED package 8a (see FIG. 26) according to the above first variation of the eighth embodiment in that the terminal 14a of each LED chip 14 belonging to the column on the +X-direction side is connected to the terminal 14b of the corresponding LED chip 14 belonging to the column on the −X-direction side via a corresponding wire 67. Thus, four circuits each including two LED chips 14 connected in series are connected in parallel between the lead frame 11 and the lead frame 12. The configuration, manufacturing method, and functional effect of this variation other than the foregoing are similar to those of the above first variation of the eighth embodiment.

Next, a third variation of the eighth embodiment is described.

Figure 29A:
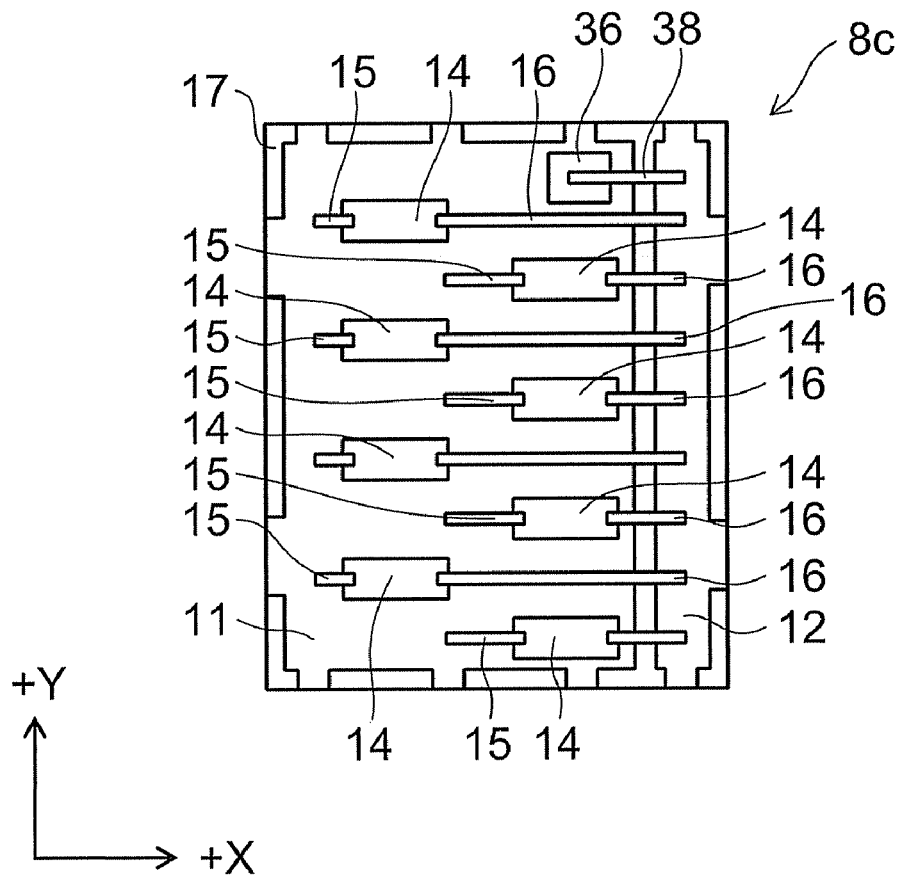
FIG. 29A is a plan view illustrating an LED package according to a third variation of the eighth embodiment.
Figure 29B:
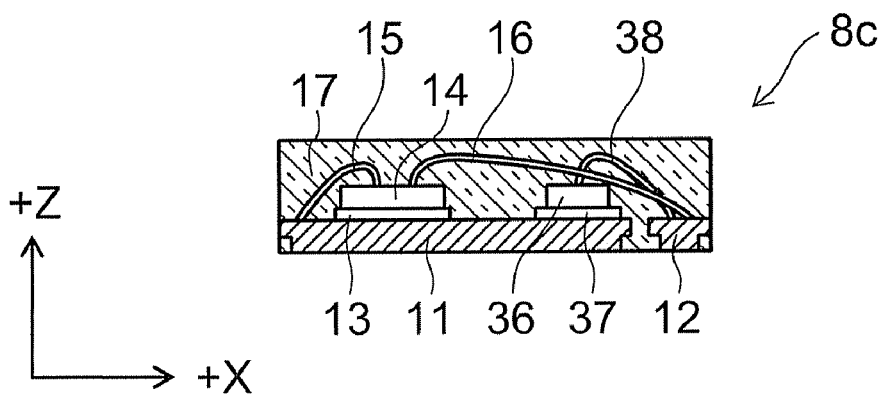
FIG. 29B is a cross-sectional view thereof.

FIG. 29A is a plan view illustrating an LED package according to this variation, and FIG. 29B is a cross-sectional view thereof.

As shown in FIGS. 29A and 29B, the LED package 8c according to this variation includes one Zener diode chip 36 in addition to the configuration of the LED package 8 (see FIGS. 25A and 25B) according to the above eighth embodiment. The Zener diode chip 36 is disposed on the lead frame 11 via a conductive die mount material 37. The lower surface terminal (not shown) of the Zener diode chip 36 is connected to the lead frame 11 via the die mount material 37, and the upper surface terminal is connected to the lead frame 12 via a wire 38. Thus, the Zener diode chip 36 is connected parallel to the eight LED chips 14 between the lead frame 11 and the lead frame 12. According to this variation, ESD resistance can be improved by providing the Zener diode chip 36. The configuration, manufacturing method, and functional effect of this variation other than the foregoing are similar to those of the above eighth embodiment.

Next, a fourth variation of the eighth embodiment is described.

Figure 30A:
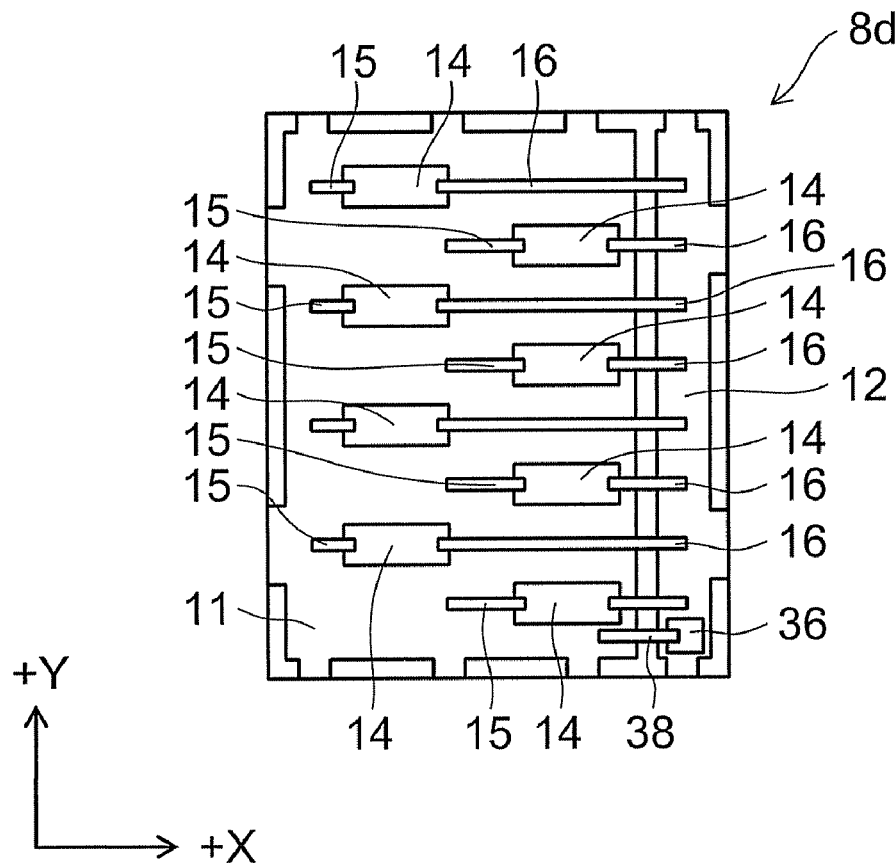
FIG. 30A is a plan view illustrating an LED package according to a fourth variation of the eighth embodiment.
Figure 30B:
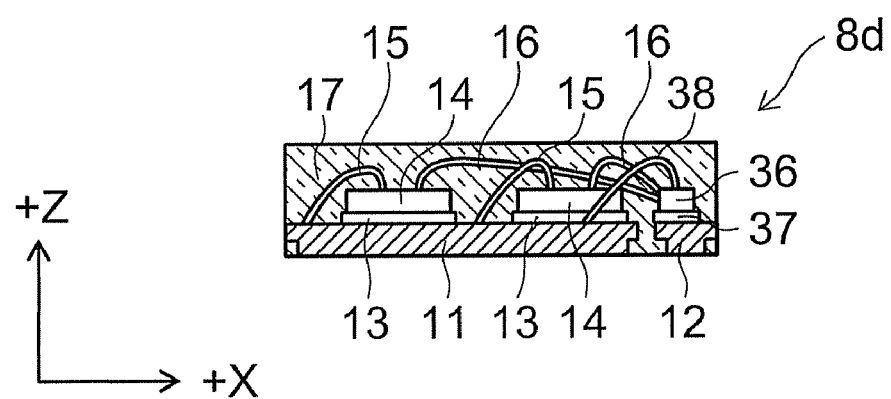
FIG. 30B is a cross-sectional view thereof.

FIG. 30A is a plan view illustrating an LED package according to this variation, and FIG. 30B is a cross-sectional view thereof.

As shown in FIGS. 30A and 30B, the LED package 8d according to this variation is different from the LED package 8c (see FIGS. 29A and 29B) according to the above third variation of the eighth embodiment in that the Zener diode chip 36 is disposed on the lead frame 12. The configuration, manufacturing method, and functional effect of this variation other than the foregoing are similar to those of the above third variation of the eighth embodiment.

Next, a fifth variation of the eighth embodiment is described.

Figure 31A:
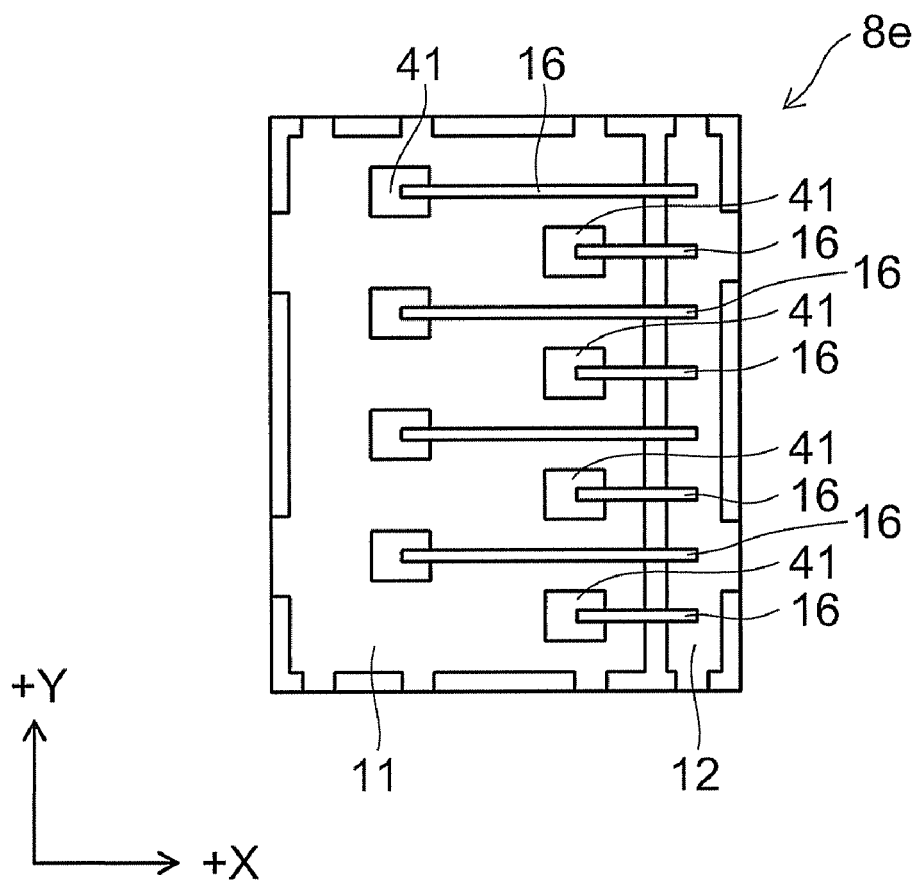
FIG. 31A is a plan view illustrating an LED package according to a fifth variation of the eighth embodiment.
Figure 31B:
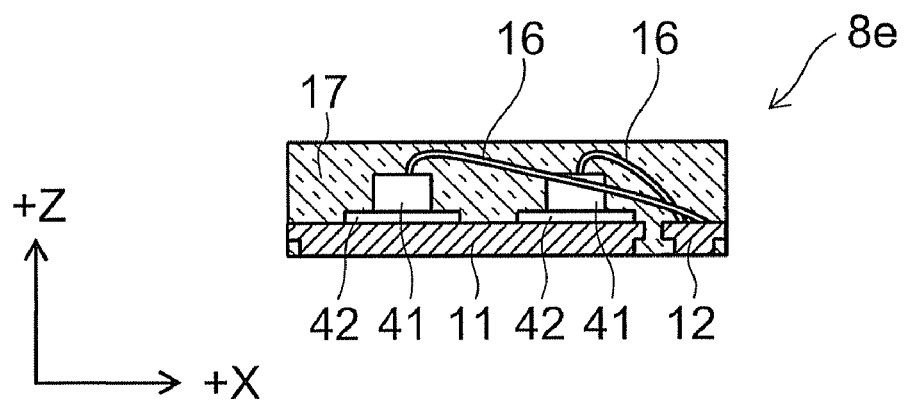
FIG. 31B is a cross-sectional view thereof.

FIG. 31A is a plan view illustrating an LED package according to this variation, and FIG. 31B is a cross-sectional view thereof.

As shown in FIGS. 31A and 31B, this variation is an example of combining the fifth embodiment and the eighth embodiment described above. More specifically, the LED package 8e according to this variation is different from the LED package 8 (see FIGS. 25A and 25B) according to the above eighth embodiment in including eight vertically conducting LED chips 41 instead of the eight LED chips 14 having upper surface terminals. Furthermore, as in the fifth embodiment, the lower surface terminal (not shown) of each LED chip 41 is connected to the lead frame 11 via a conductive die mount material 42. Furthermore, the upper surface terminal 41a of each LED chip 41 is connected to the lead frame 12 via a wire 16. The configuration, manufacturing method, and functional effect of this variation other than the foregoing are similar to those of the above fifth and eighth embodiments.

Next, a sixth variation of the eighth embodiment is described.

Figure 32A:
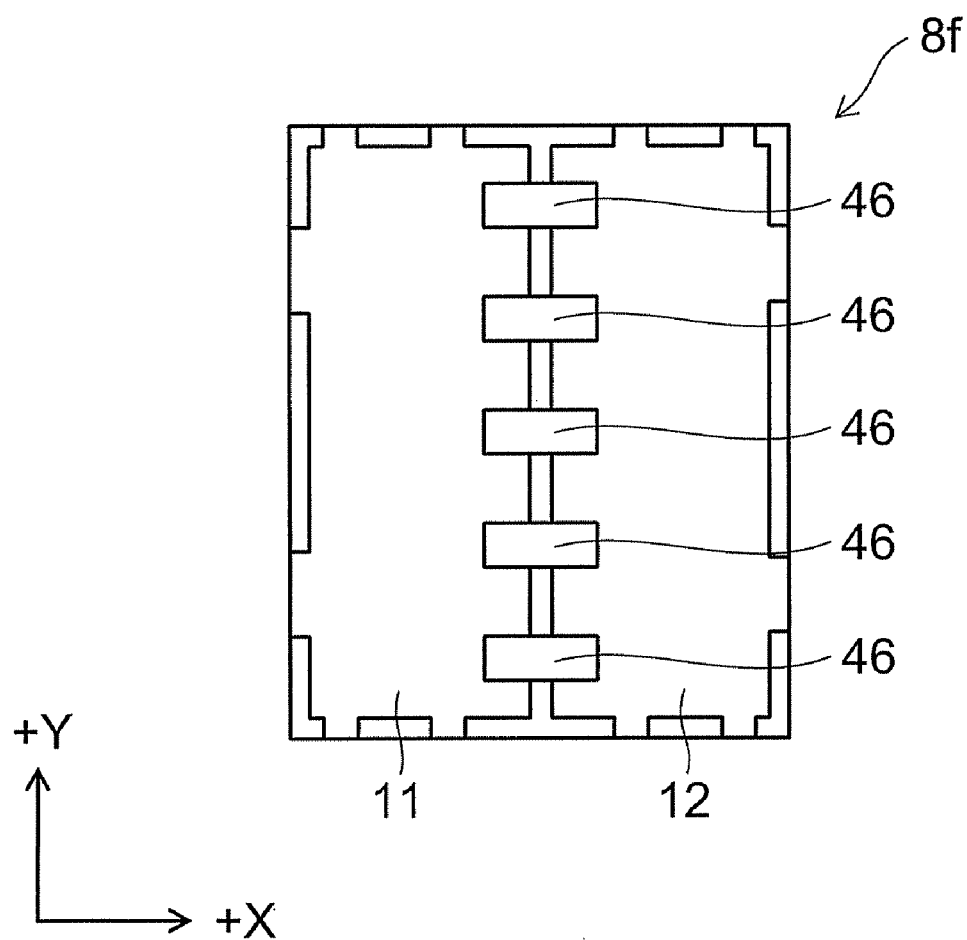
FIG. 32A is a plan view illustrating an LED package according to a sixth variation of the eighth embodiment.
Figure 32B:
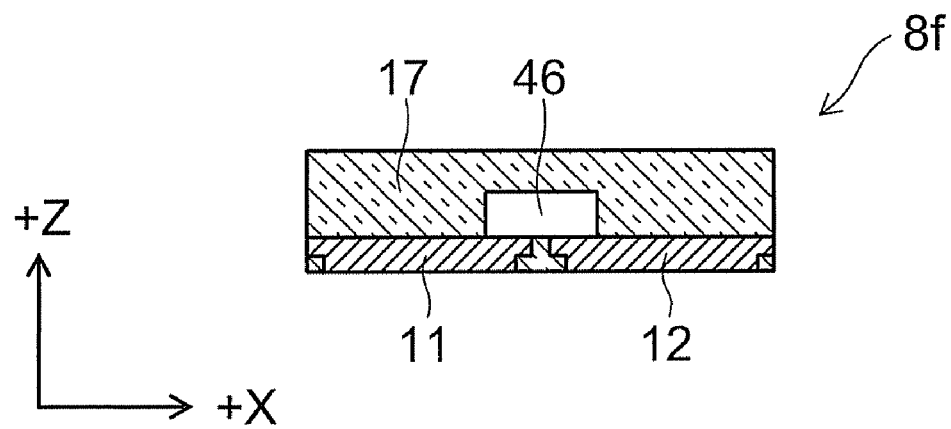
FIG. 32B is a cross-sectional view thereof.

FIG. 32A is a plan view illustrating an LED package according to this variation, and FIG. 32B is a cross-sectional view thereof.

As shown in FIGS. 32A and 32B, this variation is an example of combining the sixth embodiment and the eighth embodiment described above. More specifically, the LED package 8f according to this variation is different from the LED package 8 (see FIGS. 25A and 25B) according to the above eighth embodiment in including five flip-type LED chips 46 instead of the eight LED chips 14 having upper surface terminals. Furthermore, as in the sixth embodiment, each LED chip 46 is placed like a bridge so as to straddle between the lead frame 11 and the lead frame 12, with one lower surface terminal connected to the lead frame 11 and the other lower surface terminal connected to the lead frame 12. Thus, the five LED chips 46 are connected parallel to each other between the lead frame 11 and the lead frame 12. The configuration, manufacturing method, and functional effect of this variation other than the foregoing are similar to those of the above sixth and eighth embodiments.

Next, a seventh variation of the eighth embodiment is described.

This variation is an example of the manufacturing method for the above eighth embodiment and its variations.

Figure 33A:
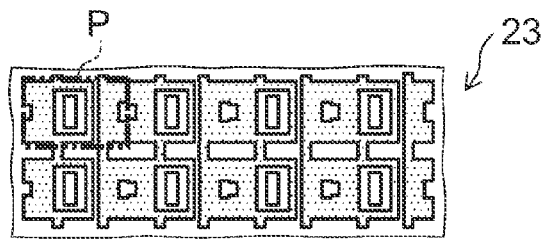
FIGS. 33A to 33E are plan views illustrating a device region of a lead frame sheet used in a seventh variation of the eighth embodiment.
Figure 33B:
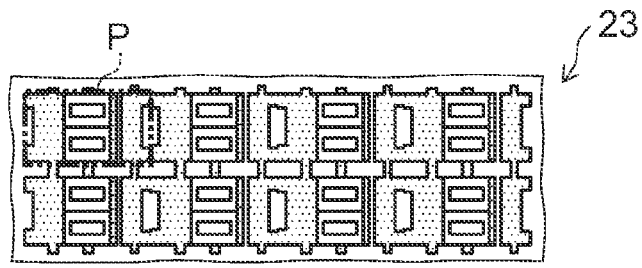
Figure 33C:
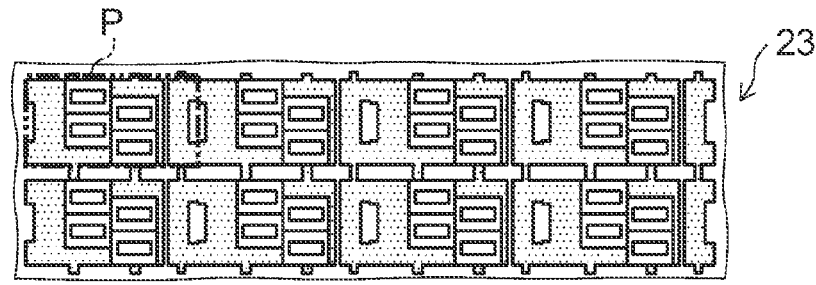
Figure 33D:
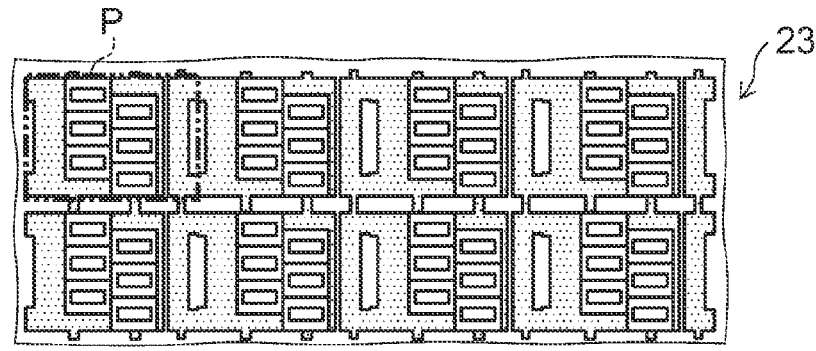
Figure 33E:
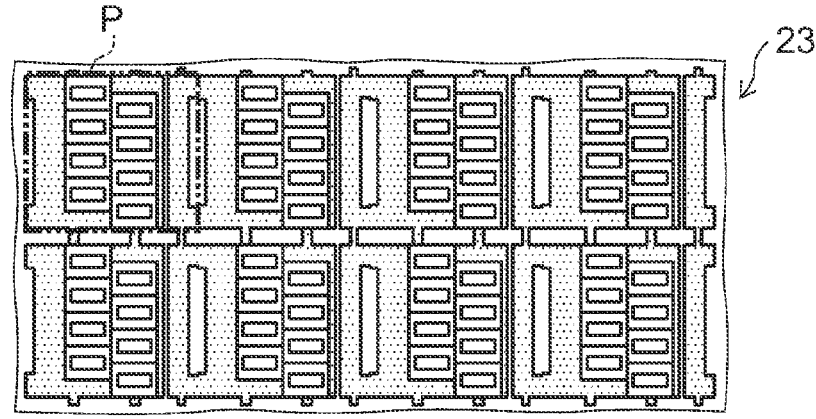

FIGS. 33A to 33E are plan views illustrating the device region of the lead frame sheet used in this variation. More specifically, FIG. 33A shows the case of installing one LED chip on one LED package. FIG. 33B shows the case of installing two LED chips. FIG. 33C shows the case of installing four LED chips. FIG. 33D shows the case of installing six LED chips. FIG. 33E shows the case of installing eight LED chips.

Here, FIGS. 33A to 33E are depicted in the same scale. Furthermore, only one device region P is indicated in each figure, but actually, numerous device regions P are arranged in a matrix. Moreover, the dicing region D is not shown.

As shown in FIGS. 33A to 33E, as the number of LED chips disposed on one LED package becomes larger, the area of one device region P increases, and the number of device regions P included in one block B decreases. However, even if the number of LED chips changes, the basic structure of the lead frame sheet 23, such as the size of the lead frame sheet 23 and the arrangement of blocks B, is the same. Furthermore, the method for forming the lead frame sheet 23 is also the same. Furthermore, the method for manufacturing an LED package using the lead frame sheet 23 is also the same. The only change is the layout in the block B.

Thus, according to this variation, the LED packages according to the above eighth embodiment and its variations can be selectively formed simply by changing the layout in each block B in the lead frame sheet 23. Here, the number of LED chips disposed on one LED package is arbitrary, and may be seven, or nine or more, for instance.

Next, a ninth embodiment of the invention is described.

Figure 34A:
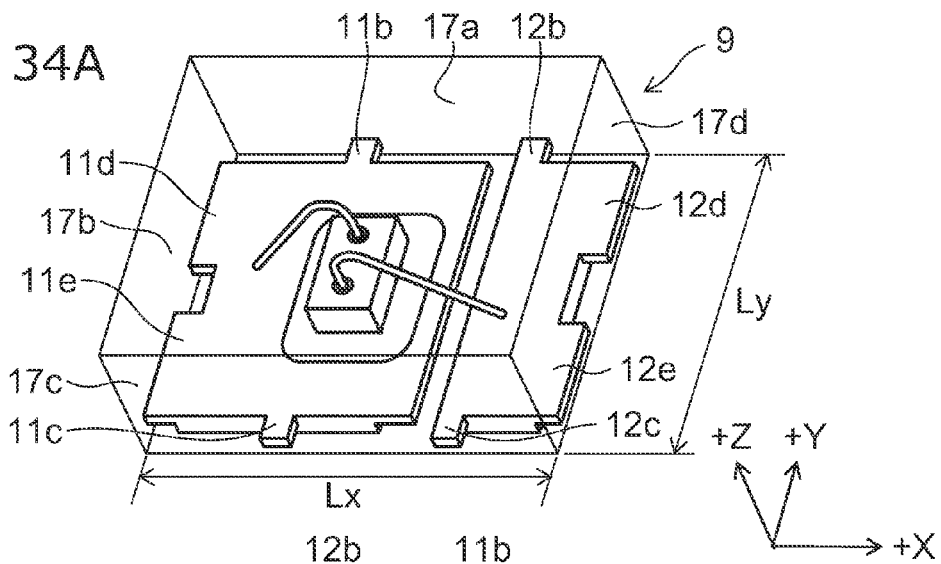
FIG. 34A is a perspective view illustrating an LED package according to a ninth embodiment.
Figure 34B:
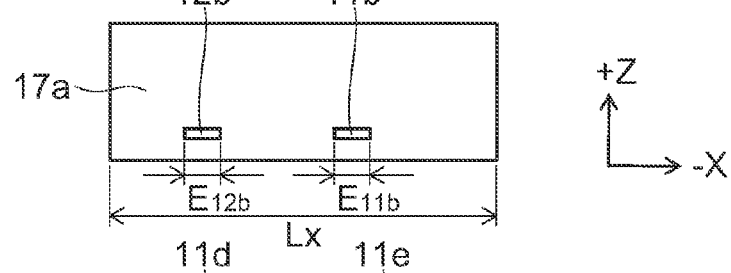
FIGS. 34B to 34E are side views illustrating the LED package according to the embodiment.
Figure 34C:
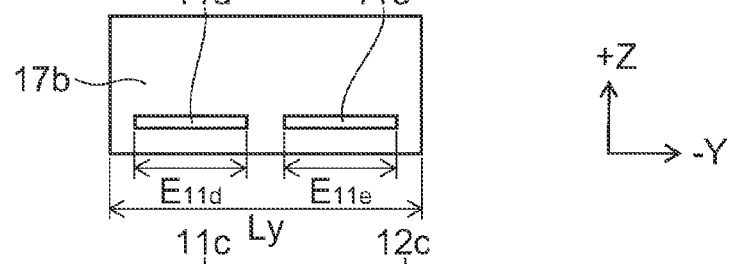
Figure 34D:
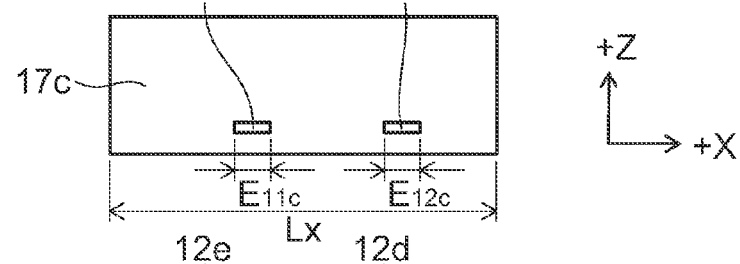
Figure 34E:
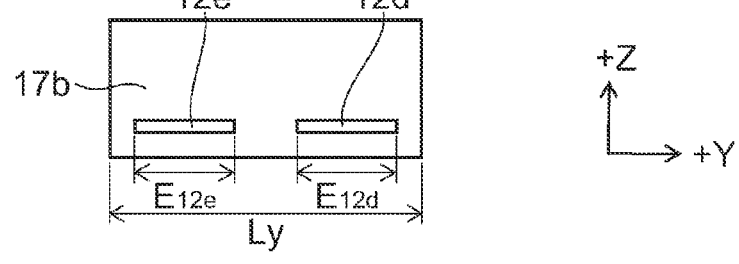

FIG. 34A is a perspective view illustrating an LED package according to the embodiment. FIGS. 34B to 34E are side views illustrating the LED package according to the embodiment.

As shown in FIGS. 34A to 34E, the configuration of the LED package 9 according to the embodiment is similar to that in the above first embodiment. However, the embodiment specifies the range of the ratio, (E/L×100)%, of the total E of the lengths of the regions of the lead frames exposed at the side surfaces 17a to 17d of the transparent resin body 17 to the entire circumferential length L of these side surfaces in the XY plane. In the following, this ratio (E/L×100)% is referred to as "total extending portion width ratio".

More specifically, as shown in FIG. 34A, the length in the X direction of the transparent resin body 17 is denoted by Lx, and the length in the Y direction is denoted by Ly. Then, the entire circumferential length L of the side surfaces 17a to 17d of the transparent resin body 17 is given by L=2(Lx+Ly). On the other hand, the lengths in the X or Y direction of the tip surfaces of the extending portions 11b to 11e and 12b to 12e are denoted by $E_{11b}$ to $E_{11e}$ and $E_{12b}$ to $E_{12e}$, respectively. Then, the total E of the lengths in the X direction and Y direction of the regions of the lead frames 11 and 12 exposed at the side surface of the transparent resin body 17 is given by the following.

$$E = E_{11b} + E_{11c} + E_{11d} + E_{11e} + E_{12b} + E_{12c} + E_{12d} + E_{12e}$$

In the following, this total E is referred to as "exposed length". In the embodiment, the range of the total extending portion width ratio, i.e., of the value of (E/L×100)%, is 21 to 91%, and more preferably 30 to 88%.

In general, to increase the light extraction efficiency of an LED package configured as in the embodiment, it is preferable to maximize the area of the lead frame to increase the light reflected by the lead frame. With the increase of the area of the lead frame, the aforementioned exposed length increases accordingly. On the other hand, to improve the bonding performance in bonding wires to the lead frame sheet and the LED chip disposed thereon, the lead frame needs to be robustly supported at the time of bonding. This is because if the bonding portion is unstable, ultrasonic waves applied for bonding do not act efficiently. To robustly support the lead frame, it is preferable to thicken the width of the bridges 23b and 23c (see FIG. 7B) of the lead frame sheet 23 and to increase the number of bridges. The exposed length is inevitably lengthened by thickening the width of the bridge and increasing the number of bridges.

However, if the exposed length is lengthened and the total extending portion width ratio is increased, the lead frame becomes likely to peel from the transparent resin body in the exposed region of the lead frame at the side surface of the transparent resin body. If the lead frame peels from the transparent resin body to form an opening, the characteristics of the LED package are degraded. For instance, an air layer formed between the lead frame and the transparent resin body decreases the light reflection efficiency. Moisture penetrating through the opening advances corrosion of the lead frame. Furthermore, moisture penetrating through the opening reaches the wire and corrodes the wire. For instance, if the silver plating layer of the lead frame is oxidized or sulfurized by oxygen and moisture penetrating through the opening, the light reflectance of the lead frame decreases. Thus, if the total extending portion width ratio is too high, the characteristics of the LED package may be degraded. Conversely, if the total extending portion width ratio is too low, the wire bonding performance is degraded, and the light reflection efficiency is decreased. Hence, there is a preferable range for the total extending portion width ratio. In the embodiment, the range of the total extending portion width ratio (E/L×100)% is set to 21 to 91%. This can suppress peeling between the lead frame and the transparent resin body, improve the wire bonding performance, and ensure the light reflection efficiency.

In the following, this effect is described with reference to specific data.

First, the influence of the total extending portion width ratio on the degradation of characteristics of the LED package is described.

Figure 35:
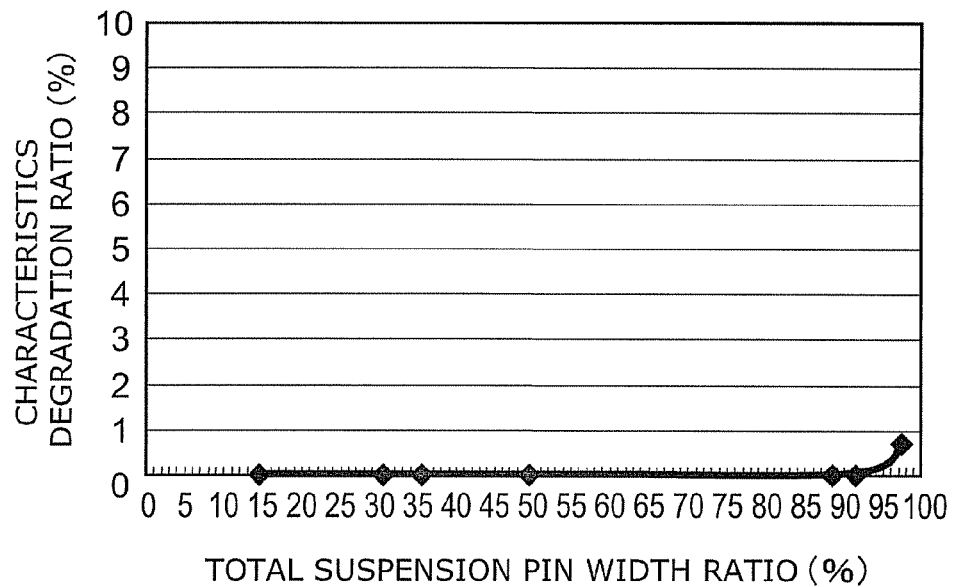
FIG. 35 is a graph illustrating the influence of the total extending portion width ratio on the degradation of characteristics of the LED package, where the horizontal axis represents the total extending portion width ratio and the vertical axis represents the characteristics degradation ratio.

FIG. 35 is a graph illustrating the influence of the total extending portion width ratio on the degradation of characteristics of the LED package. The horizontal axis represents the total extending portion width ratio, and the vertical axis represents the characteristics degradation ratio.

LED packages being different in total extending portion width ratio were fabricated by the method described in the above first embodiment. Here, for each level of total extending portion width ratio, a plurality of LED packages were fabricated. Next, these LED packages were subjected to an energization test for 168 hours. At the beginning of the energization test, all the LED packages illuminated. With the passage of energization time, degradation of the LED packages proceeded, and the brightness decreased in some LED packages. The "characteristics degradation ratio" was defined as the sum of the brightness decrease ratios of individual LED packages at the end of the 168-hour energization test out of all the LED packages having the same value of total extending portion width ratio subjected to this energization test. For instance, if one out of ten LED packages has become completely dark, and nine LED packages have not changed in brightness, then the characteristics degradation ratio is 10%.

As shown in FIG. 35, for some of LED packages having a total extending portion width ratio of 97° k, the brightness decreased during the 168-hour energization test. In the darkened LED package, corrosion of the lead frame and the wire from the exposed region of the lead frame was observed. In contrast, for any of the LED packages having a total extending portion width ratio of 91% or less, there was no decrease in brightness after the 168-hour energization test. From the result of this test, it is found preferable that the total extending portion width ratio is 91% or less.

Next, the influence of the total extending portion width ratio on the wire bonding performance is described.

Figure 36:
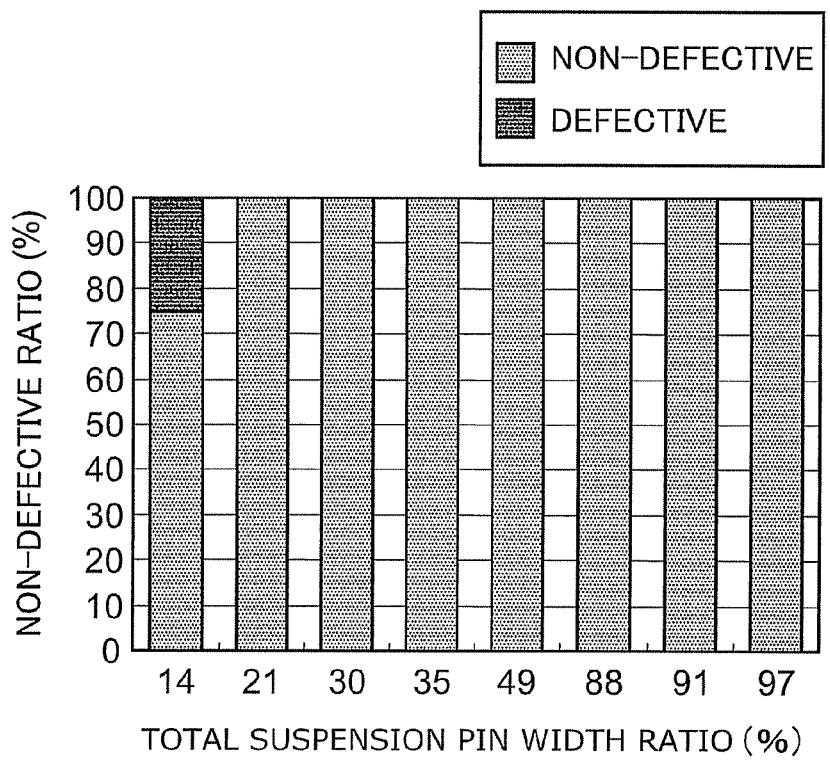
FIG. 36 is a graph illustrating the influence of the total extending portion width ratio on a wire bonding performance, where the horizontal axis represents the total extending portion width ratio and the vertical axis represents the non-defective ratio in a bonding test.

FIG. 36 is a graph illustrating the influence of the total extending portion width ratio on the wire bonding performance. The horizontal axis represents the total extending portion width ratio, and the vertical axis represents the non-defective ratio in the bonding test.

A plurality of kinds of lead frame sheets being different in the number of bridges and in the width of the bridge were fabricated by the method described in the above first embodiment. The horizontal axis of FIG. 36 represents the value of the total extending portion width ratio for LED packages assumed to be manufactured from these lead frame sheets. Next, wires were bonded to these lead frame sheets. Wire bonding was performed by ultrasonic bonding. More specifically, by application of heat, weight, and ultrasonic waves to the contact portion between the lead frame sheet and the wire, the tip of the wire was melted and bonded to the lead frame. Such bonding portions were formed in number of 20 on each lead frame sheet. Next, a peel test was performed on these bonding portions. More specifically, the wire was pulled with tweezers and stripped away from the lead frame sheet. The stripped mark was observed from above by a microscope. When the melted wire material was left in the stitch portion in an area ratio of 1/3 or more, the bonding portion was determined as "non-defective". When it was less than 1/3, the bonding portion was determined as "defective". Here, if the wire has been bonded to the lead frame sheet sufficiently robustly, the wire portion is broken when pulled, and most of the wire material remains in the bonding portion.

As shown in FIG. 36, in the lead frame sheet having a total extending portion width ratio of 14%, five out of 20 bonding portions were defective. That is, the non-defective ratio was 75%. In contrast, in lead frame sheets having a total extending portion width ratio of 21% or more, all the bonding portions were non-defective. That is, the non-defective ratio was 100%. From the result of this test, it is found preferable that the total extending portion width ratio is 21% or more.

The test result shown in FIG. 35 and the test result shown in FIG. 36 are summarized in TABLE 1. Here, "-" shown in TABLE 1 represents absence of corresponding data. As shown in TABLE 1, the total extending portion width ratio is preferably 91% or less from the viewpoint of characteristics degradation ratio, and preferably 21% or more from the viewpoint of bonding performance. Hence, the total extending portion width ratio is preferably 21 to 91%. With a certain margin in consideration of variations in the processing condition, the total extending portion width ratio is more preferably 30 to 88%.

TABLE 1

| TOTAL EXTENDING PORTION WIDTH RATIO (%) | CHARACTERISTICS DEGRADATION RATIO | BONDING PERFORMANCE |
| --- | --- | --- |
| 14 | ○ | X |
| 21 | — | ○ |
| 30 | ○ | ○ |
| 35 | ○ | ○ |
| 49 | ○ | ○ |
| 88 | ○ | ○ |
| 91 | ○ | ○ |
| 97 | X | ○ |

Next, a tenth embodiment of the invention is described.

Figure 37:
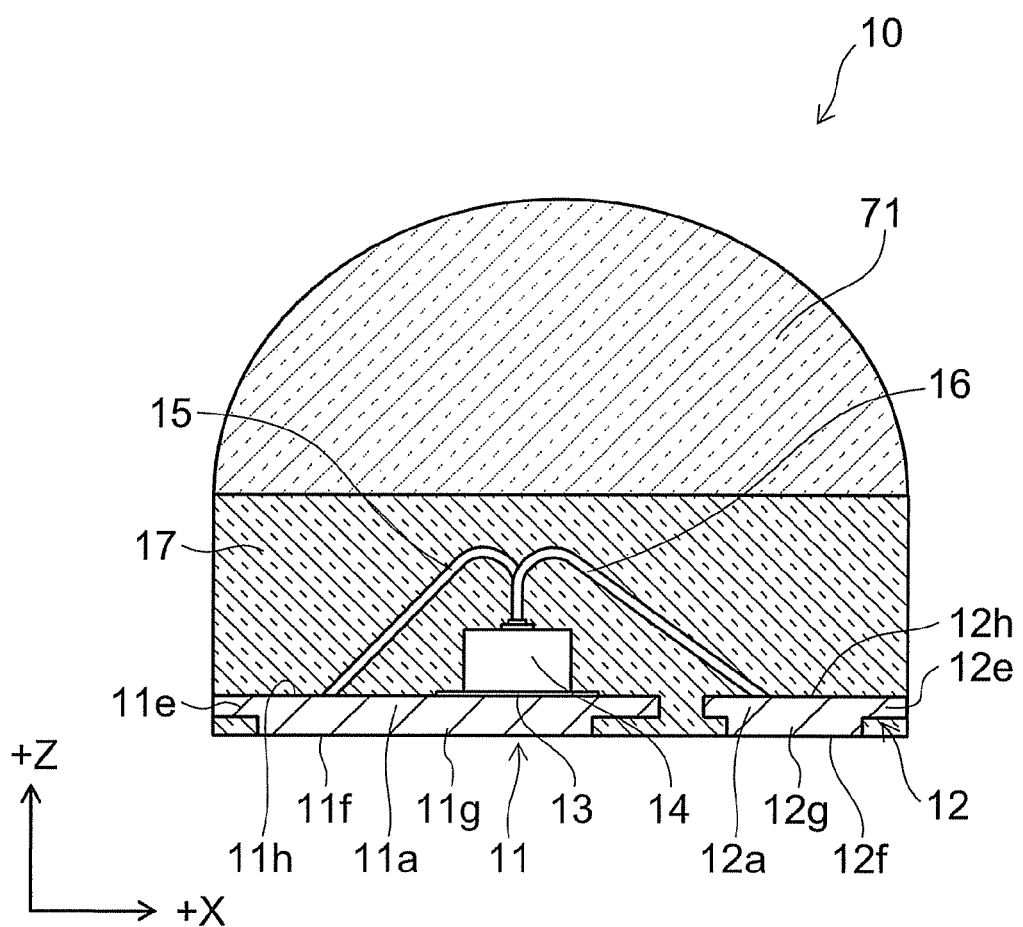
FIG. 37 is a cross-sectional view illustrating an LED package according to a tenth embodiment.

FIG. 37 is a cross-sectional view illustrating an LED package according to the embodiment.

As shown in FIG. 37, in addition to the configuration of the LED package 1 (see FIGS. 2A and 2B) according to the above first embodiment, the LED package 10 according to the embodiment includes a lens 71 on the transparent resin body 17. The lens 71 is made of a transparent resin. The lens 71 is a planoconvex lens with the convex surface facing up. For instance, the lens 71 may be formed integrally with the transparent resin body 17 by forming a concave portion in the bottom surface of the lower mold 101 (see FIGS. 5A to 5C). Alternatively, after forming the transparent resin plate 29 (see FIGS. 6A and 6B), the lens 71 may be attached to the transparent resin plate 29, and then the transparent resin plate 29 may be diced. Alternatively, the lens 71 may be attached to the transparent resin body 17 after dicing the transparent resin plate 29. According to the embodiment, the light emitted from the transparent resin body 17 can be condensed by the lens 71 in the directly upward direction (+Z direction). This improves the light distribution characteristics. The configuration, manufacturing method, and functional effect of the embodiment other than the foregoing are similar to those of the above first embodiment.

Next, an eleventh embodiment of the invention is described.

Figure 38:
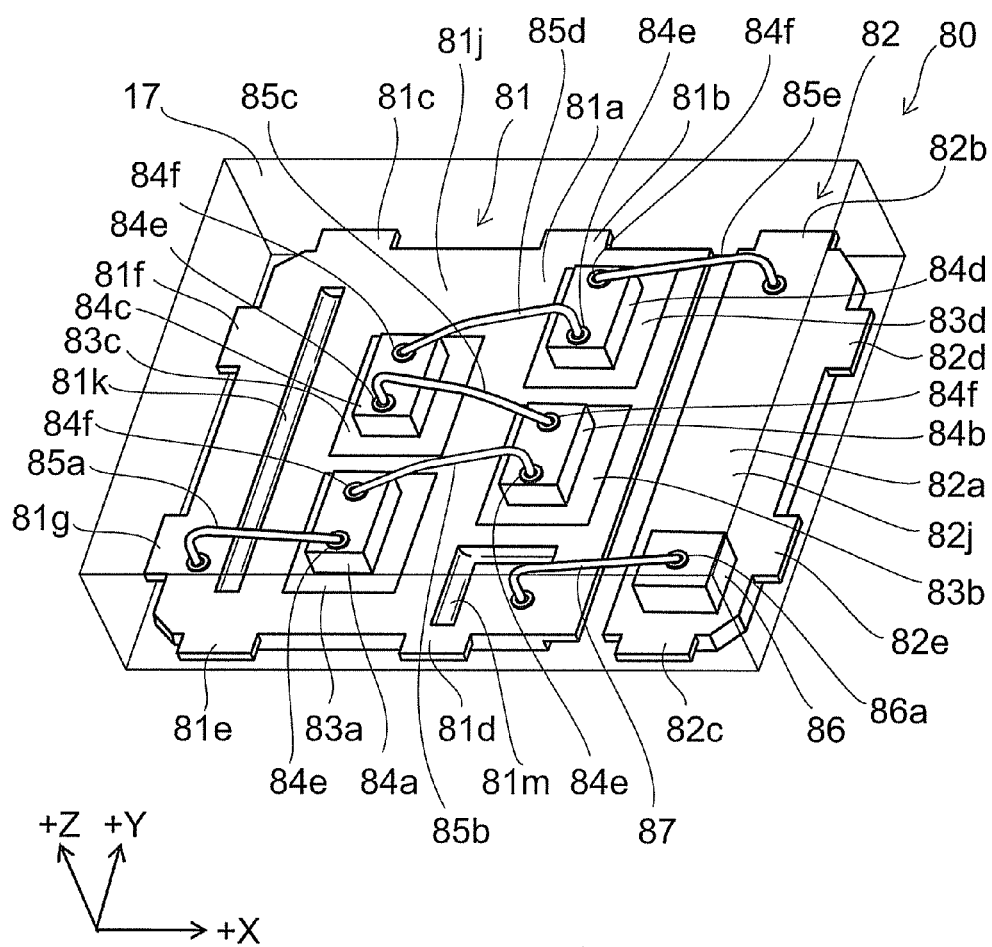
FIG. 38 is a perspective view illustrating an LED package according to an eleventh embodiment.

FIG. 38 is a perspective view illustrating an LED package according to the embodiment.

Figure 39:
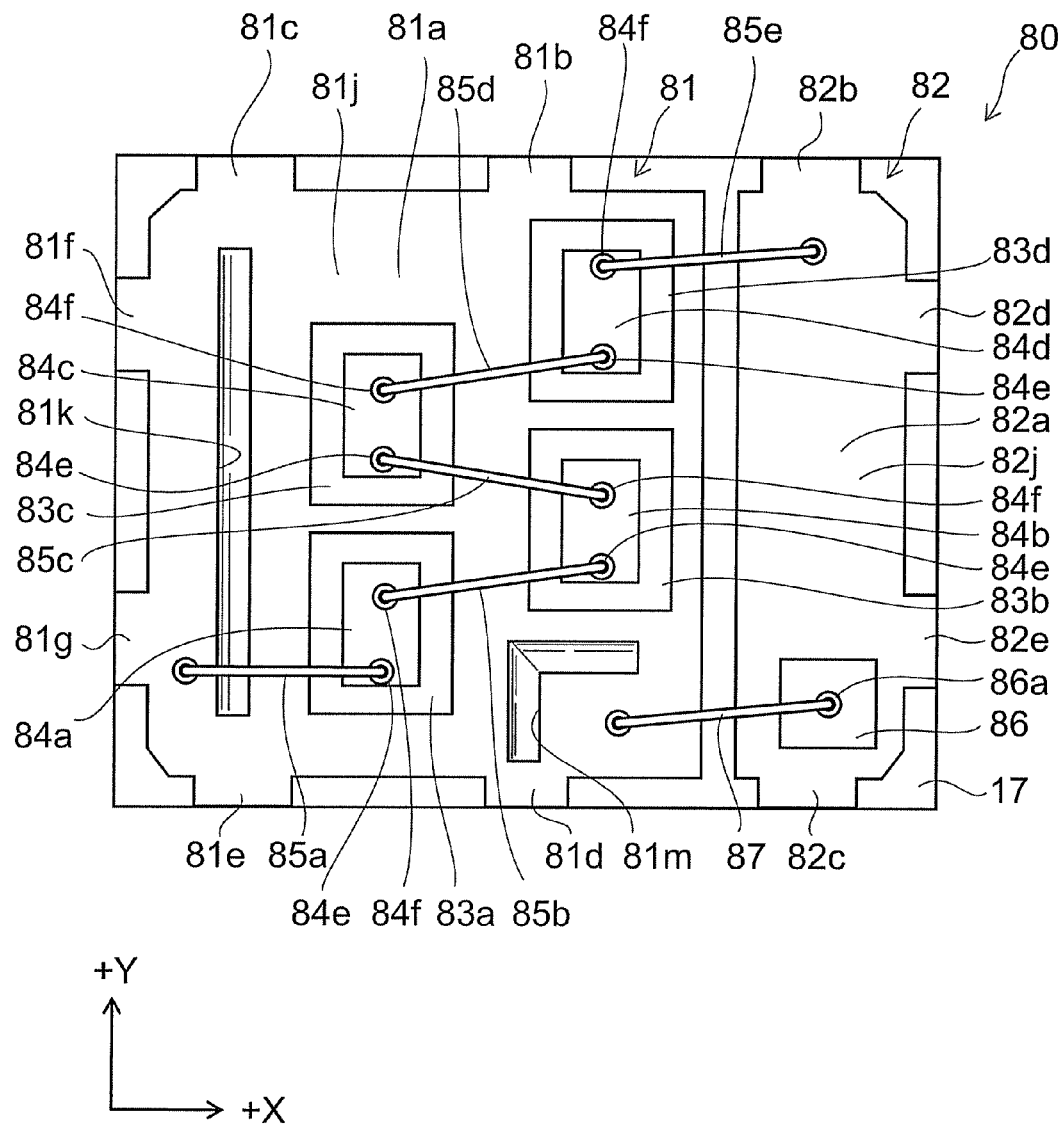
FIG. 39 is a top view illustrating the LED package according to the eleventh embodiment.

FIG. 39 is a top view illustrating the LED package according to the embodiment.

Figure 40:
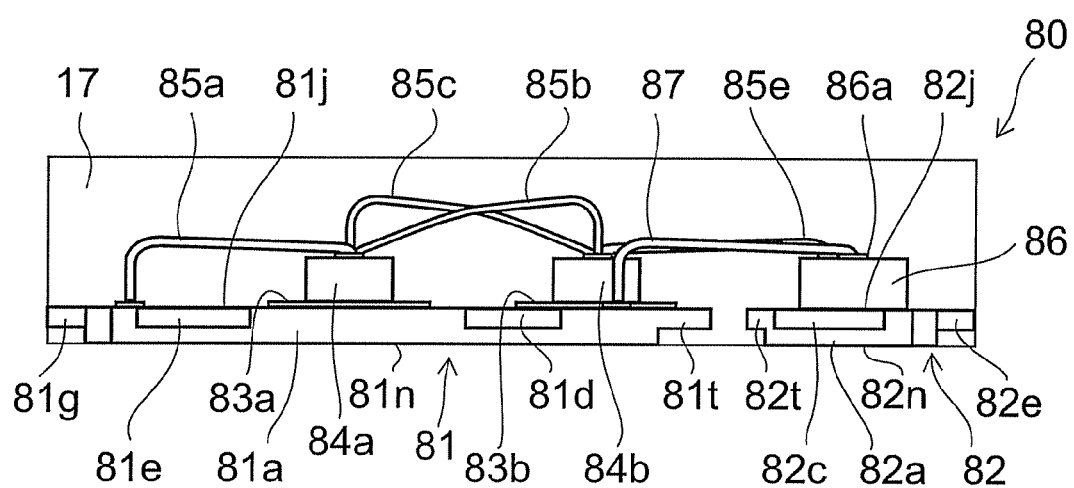
FIG. 40 is a side view illustrating the LED package according to the eleventh embodiment.

FIG. 40 is a side view illustrating the LED package according to the embodiment.

Figure 41:
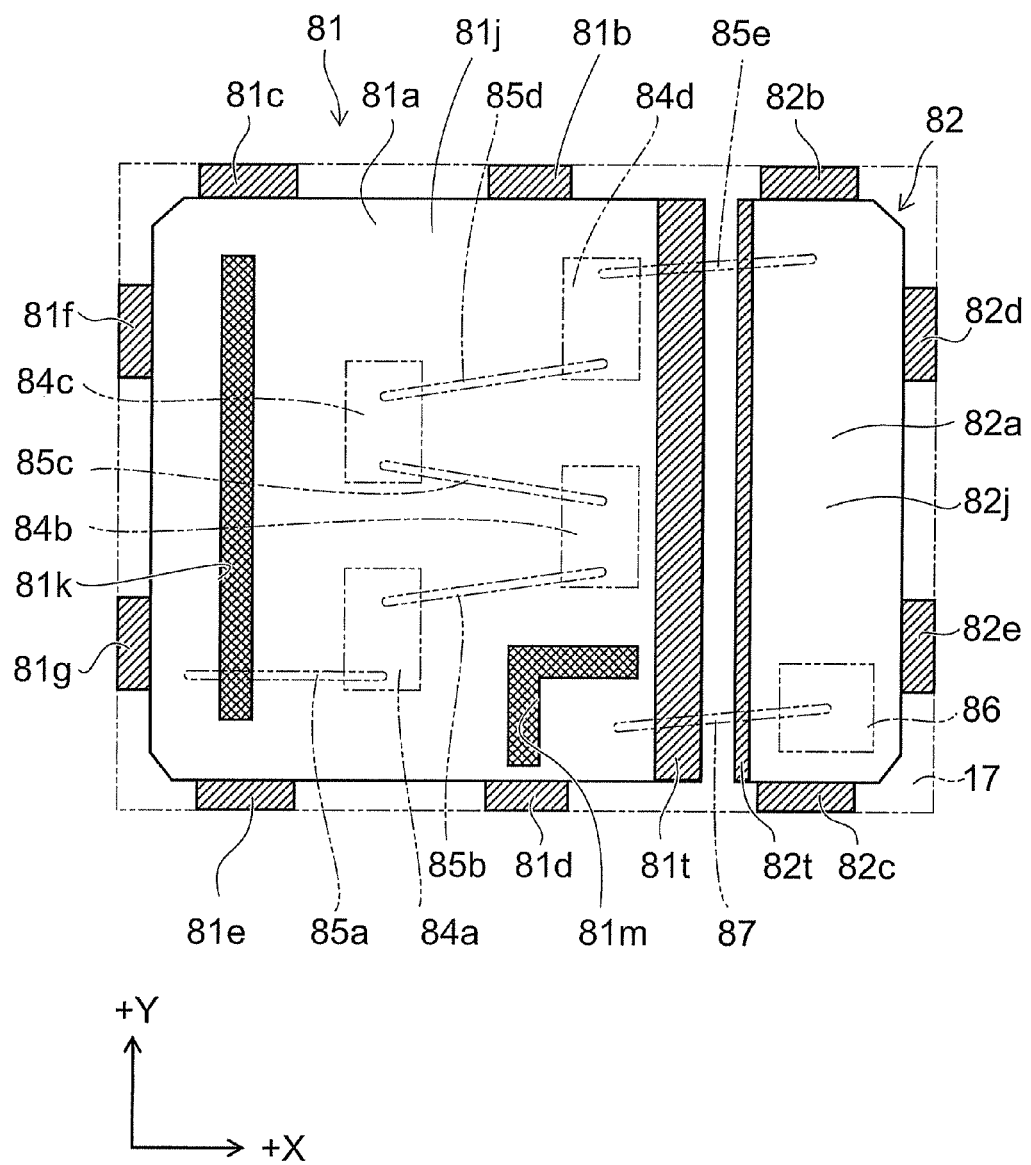
FIG. 41 is a top view illustrating lead frames according to the eleventh embodiment.

FIG. 41 is a top view illustrating lead frames according to the embodiment.

In FIG. 41, the relatively thin portions in the lead frames 81 and 82 are hatched. More specifically, the portion where the lower surface side of the lead frame is removed is hatched with unidirectionally extending diagonal lines. The portion where the upper surface side of the lead frame is removed is hatched with mutually intersecting diagonal lines.

As shown in FIGS. 38 to 40, the LED package 80 according to the embodiment includes a pair of lead frames 81 and 82. The lead frames 81 and 82 are shaped like flat plates, being placed on the same plane and spaced from each other. The lead frames 81 and 82 are made of the same conductive material, e.g. in a configuration such that a silver plating layer is formed on the upper surface and lower surface of a copper plate. However, on the end surface of the lead frames 81 and 82, the silver plating layer is not formed, but the copper plate is exposed.

The lead frame 81 includes one base portion 81a. As viewed in the Z direction, the base portion 81a has a generally rectangular shape with the two corners on the −X-direction side truncated. Six extending portions 81b, 81c, 81d, 81e, 81f, and 81g extend out from the base portion 81a. The extending portion 81b extends out from the +X-direction side portion of the +Y-direction facing edge of the base portion 81a toward the +Y direction. The extending portion 81c extends out from the −X-direction side portion of the +Y-direction facing edge of the base portion 81a toward the +Y direction. The extending portion 81d extends out from the +X-direction side portion of the −Y-direction facing edge of the base portion 81a toward the −Y direction. The extending portion 81e extends out from the −X-direction side portion of the −Y-direction facing edge of the base portion 81a toward the −Y direction. The extending portion 81f extends out from the +Y-direction side portion of the −X-direction facing edge of the base portion 81a toward the −X direction. The extending portion 81g extends out from the −Y-direction side portion of the −X-direction facing edge of the base portion 81a toward the −X direction. Thus, the extending portions 81b to 81g extend out from three different sides of the base portion 81a. The positions of the extending portions 81b and 81d in the X direction are the same. The positions of the extending portions 81c and 81e in the X direction are also the same.

As compared with the lead frame 81, the lead frame 82 has a shorter length in the X direction and the same length in the Y direction. The lead frame 82 includes one base portion 82a. As viewed in the Z direction, the base portion 82a has a generally rectangular shape with the two corners on the +X-direction side truncated. Four extending portions 82b, 82c, 82d, and 82e extend out from the base portion 82a. The extending portion 82b extends out from the +Y-direction facing edge of the base portion 82a toward the +Y direction. The extending portion 82c extends out from the −Y-direction facing edge of the base portion 82a toward the −Y direction. The extending portion 82d extends out from the +Y-direction side portion of the +X-direction facing edge of the base portion 82a toward the +X direction. The extending portion 82e extends out from the −Y-direction side portion of the +X-direction facing edge of the base portion 82a toward the +X direction. Thus, the extending portions 82b to 82e extend out from three different sides of the base portion 82a. The positions of the extending portions 81f and 82d in the Y direction are the same. The positions of the extending portions 81g and 82e in the Y direction are also the same.

As shown in FIGS. 38 to 41, in the upper surface 81j of the lead frame 81, a groove 81k extending in the Y direction is formed in the region between the extending portion 81c and the extending portion 81e. Furthermore, an L-shaped groove 81m is formed at the +X−Y-direction corner of the upper surface 81j of the lead frame 81. The portion extending in the Y direction of the groove 81m is located in the region between the extending portion 81b and the extending portion 81d. From the +Y-direction end of this portion, the portion extending in the X direction extends out toward the +X direction. The portion extending in the X direction of the groove 81m is located in the region between the extending portion 81g and the extending portion 82e. The grooves 81k and 81m are formed in the base portion 81a. The grooves 81k and 81m do not reach the outer edge of the lead frame 81, nor penetrate through the lead frame 81 in the thickness direction.

A notch extending in the Y direction is formed at the +X-direction end of the lower surface 81n of the lead frame 81. The immediately overlying region of this notch constitutes a thin plate portion 81t. The lower surface of the thin plate portion 81t is located above the lower surface of the portion of the base portion 81a outside the thin plate portion 81t. The lower surface of the extending portions 81b to 81g lies at the same height as the lower surface of the thin plate portion 81t. Thus, the lower surface of the extending portions 81b to 81g is located above the lower surface of the portion of the base portion 81a outside the thin plate portion 81t. Hence, the thickness of the thin plate portion 81t and the extending portions 81b to 81g of the lead frame 81 is thinner than the thickness of the portion of the base portion 81a outside the thin plate portion 81t.

No groove is formed in the upper surface 82j of the lead frame 82, and the upper surface 82j is a flat surface. On the other hand, a notch extending in the Y direction is formed at the −X-direction end of the lower surface 82n of the lead frame 82. The immediately overlying region of this notch constitutes a thin plate portion 82t. The lower surface of the thin plate portion 82t is located above the lower surface of the portion of the base portion 82a outside the thin plate portion 82t. The lower surface of the extending portions 82b to 82e lies at the same height as the lower surface of the thin plate portion 82t. Thus, the lower surface of the extending portions 82b to 82e is located above the lower surface of the portion of the base portion 82a outside the thin plate portion 82t. Hence, the thickness of the thin plate portion 82t and the extending portions 82b to 82e of the lead frame 82 is thinner than the thickness of the portion of the base portion 82a outside the thin plate portion 82t. Thus, the lead frames 81 and 82 include a portion having a relatively thick plate thickness and a portion having a relatively thin plate thickness. The relatively thick portion is the portion of the base portion outside the thin plate portion. The relatively thin portion includes the thin plate portion and the extending portions.

In other words, it can be said that in the lower surface of each lead frame, a protrusion is formed in the region corresponding to the base portion outside the thin plate portion. These protrusions are formed in regions spaced from the mutually opposed edges of the lead frames 81 and 82. The upper surface 81j of the lead frame 81 and the upper surface 82j of the lead frame 82 are flush with each other. The lower surface of the protrusion of the lead frame 81 and the lower surface of the protrusion of the lead frame 82 are also flush with each other. The lower surface of the thin plate portion and the extending portions of the lead frame 81 and the lower surface of the thin plate portion and the extending portions of the lead frame 82 are also flush with each other. Hence, the extending portions in the lead frames 81 and 82 are located on the same XY plane.

On the upper surface 81j of the lead frame 81, die mount materials 83a to 83d are attached to part of the region between the groove 81k and the groove 81m in the base portion 81a. As viewed in the Z direction, the shapes of the die mount materials 83a to 83d are equal to each other. The shape is a rectangle with the Y-direction length being longer than the X-direction length. The die mount materials 83a to 83d are spaced from each other and arranged in a staggered pattern. More specifically, the die mount material 83a is located in a −Y-direction side portion of the base portion 81a between the groove 81k and the groove 81m. The die mount material 83b is located on the +X+Y-direction side of the die mount material 83a and on the +Y-direction side of the groove 81m. The die mount material 83c is located on the −X+Y-direction side of the die mount material 83b and on the +Y-direction side of the die mount material 83a. The die mount material 83d is located on the +X+Y-direction side of the die mount material 83c and on the +Y-direction side of the die mount material 83b. In the embodiment, the die mount materials 83a to 83d may be either conductive or insulative.

LED chips 84a to 84d are provided on the die mount materials 83a to 83d, respectively. That is, the LED chips 84a to 84d are disposed on the lead frame 81 via the die mount materials 83a to 83d. The LED chips 84a to 84d are LED chips meeting the same specifications. Each LED chip is shaped like a rectangular solid, with a pair of terminals 84e and 84f provided on its upper surface. In each LED chip, the terminal 84f is located on the +Y-direction side of the terminal 84e. The LED chips 84a to 84d emit e.g. blue light by being supplied with a voltage between the terminal 84e and the terminal 84f.

Like the die mount materials 83a to 83d, the LED chips 84a to 84d are arranged in a staggered pattern in the region between the groove 81k and the groove 81m on the upper surface 81j of the lead frame 81. More specifically, the LED chip 84a is located in a −Y-direction side portion of the base portion 81a. The LED chip 84b is located on the +X+Y-direction side of the LED chip 84a. The LED chip 84c is located on the −X+Y-direction side of the LED chip 84b and on the +Y-direction side of the LED chip 84a. The LED chip 84d is located on the +X+Y-direction side of the LED chip 84c and on the +Y-direction side of the LED chip 84b.

The LED package 80 includes wires 85a to 85e connecting the lead frame to the LED chips and connecting between the LED chips. One end of the wire 85a is bonded to the region of the upper surface 81j of the lead frame 81 on the opposite side of the groove 81k from the region disposed with the LED chips 84a to 84d, i.e., to the upper surface of the −X−Y-direction corner of the base portion 81a on the −X-direction side of the groove 81k. The other end is bonded to the terminal 84e of the LED chip 84a. The wire 85a is drawn out generally perpendicularly from the lead frame 81 to the +Z direction, then is bent at a generally right angle to the +X direction, and reaches generally horizontally to the terminal 84e of the LED chip 84a. Thus, the drawn-out angle of the wire, i.e., the angle at which the direction of the wire drawn out makes with the XY plane, is larger at the end of the wire 85a on the lead frame 81 side than at the end on the LED chip 84a side.

One end of the wire 85b is bonded to the terminal 84f of the LED chip 84a, and the other end is bonded to the terminal 84e of the LED chip 84b. The wire 85b is drawn out from the terminal 84f of the LED chip 84a to a generally +X+Z direction, then is bent at an acute angle to the −Z direction, and reaches generally perpendicularly to the terminal 84e of the LED chip 84b. Thus, the drawn-out angle of the wire 85b on the LED chip 84a side is smaller than the drawn-out angle on the LED chip 84b side.

One end of the wire 85c is bonded to the terminal 84f of the LED chip 84b, and the other end is bonded to the terminal 84e of the LED chip 84c. The wire 85c is drawn out from the terminal 84f of the LED chip 84b to a generally −X+Z direction, then is bent at an acute angle to the −Z direction, and reaches generally perpendicularly to the terminal 84e of the LED chip 84c. Thus, the drawn-out angle of the wire 85c on the LED chip 84b side is smaller than the drawn-out angle on the LED chip 84c side.

One end of the wire 85d is bonded to the terminal 84f of the LED chip 84c, and the other end is bonded to the terminal 84e of the LED chip 84d. The wire 85d is drawn out from the terminal 84f of the LED chip 84c obliquely upward to the +X+Z direction, then is bent at an acute angle to the −Z direction, and reaches generally perpendicularly to the terminal 84e of the LED chip 84d. Thus, the drawn-out angle of the wire 85d on the LED chip 84c side is smaller than the drawn-out angle on the LED chip 84d side.

One end of the wire 85e is bonded to the terminal 84f of the LED chip 84d, and the other end is bonded to the upper surface of the +Y-direction end of the base portion 82a of the lead frame 82. The wire 85e is drawn out generally horizontally from the terminal 84f of the LED chip 84d to the +X direction, then is bent at a generally right angle to the −Z direction, and reaches generally perpendicularly to the lead frame 82. Thus, the drawn-out angle of the wire 85e on the LED chip 84d side is smaller than the drawn-out angle on the lead frame 82 side.

Thus, by the wires 85a to 85e, four LED chips 84a to 84d are connected in series between the lead frame 81 and the lead frame 82. The region of the lead frame 81 where the wire 85a is bonded lies on the opposite side of the groove 81k from the die mount materials 83a to 83d.

The LED package 80 further includes a Zener diode chip 86 and a wire 87. The Zener diode chip 86 is disposed on the −Y-direction end of the base portion 82a of the lead frame 82. An upper surface terminal 86a is provided on the upper surface of the Zener diode chip 86, and a lower surface terminal (not shown) is provided on the lower surface. The lower surface terminal of the Zener diode chip 86 is bonded to the upper surface of the lead frame 82, and thereby connected to the lead frame 82.

On the other hand, the upper surface terminal 86a of the Zener diode chip 86 is bonded to one end of the wire 87. The other end of the wire 87 is bonded to the region of the upper surface 81j of the lead frame 81 on the opposite side of the groove 81m from the region disposed with the LED chips 84a to 84d, i.e., to the upper surface of the +X−Y-direction corner of the base portion 81a on the +X−Y-direction side of the groove 81m. The wire 87 is drawn out generally horizontally from the upper surface terminal 86a of the Zener diode chip 86 to the −X direction, then is bent at a generally right angle to the −Z direction, and reaches generally perpendicularly to the lead frame 81. Thus, the drawn-out angle of the wire 87 on the Zener diode chip 86 side is smaller than the drawn-out angle on the lead frame 81 side.

Thus, by the wire 87, one Zener diode chip 86 is connected between the lead frame 81 and the lead frame 82. The region of the lead frame 81 where the wire 87 is bonded lies on the opposite side of the groove 81m from the die mount materials 83a to 83d.

Furthermore, the LED package 80 includes a transparent resin body 17. The transparent resin body 17 is formed from a transparent resin, such as silicone resin. The outline of the transparent resin body 17 is a rectangular solid. The transparent resin body 17 buries the lead frames 81 and 82, the die mount materials 83a to 83d, the LED chips 84a to 84d, the wires 85a to 85e and 87, and the Zener diode chip 86. Thus, the outline of the transparent resin body 17 constitutes the outline of the LED package 80. Part of the lead frame 81 and part of the lead frame 82 are exposed at the lower surface and side surface of the transparent resin body 17. That is, the transparent resin body 17 covers the LED chips 84a to 84d, and covers the upper surface, part of the lower surface, and part of the end surface of the lead frames 81 and 82. However, the transparent resin body 17 exposes the rest of the lower surface and the rest of the end surface of the lead frames 81 and 82.

More specifically, in the lead frame 81, the lower surface of the portion having a relatively thick plate thickness, i.e., of the portion of the base portion 81a outside the thin plate portion 81t, is exposed at the lower surface of the transparent resin body 17. The tip surface of the extending portions 81b to 81g is exposed at the side surface of the transparent resin body 17. On the other hand, the entire upper surface 81j of the lead frame 81, the lower surface of the portion having a relatively thin plate thickness in the lead frame 81, i.e., of the thin plate portion 81*t* and the extending portions 81*b* to 81*g*, the side surface of the portion having a relatively thick plate thickness, the side surface of the extending portions 81*b* to 81*g*, and the end surface of the base portion 81*a* are covered with the transparent resin body 17.

Likewise, in the lead frame 82, the lower surface of the portion having a relatively thick plate thickness, i.e., of the portion of the base portion 82*a* outside the thin plate portion 82*t*, is exposed at the lower surface of the transparent resin body 17. The tip surface of the extending portions 82*b* to 82*e* is exposed at the side surface of the transparent resin body 17. On the other hand, the entire upper surface 82*j* of the lead frame 82, the lower surface of the portion having a relatively thin plate thickness in the lead frame 82, i.e., of the thin plate portion 82*t* and the extending portions 82*b* to 82*e*, the side surface of the portion having a relatively thick plate thickness, the side surface of the extending portions 82*b* to 82*e*, and the end surface of the base portion 82*a* are covered with the transparent resin body 17.

Numerous phosphors 18 (see FIG. 2A) are dispersed inside the transparent resin body 17. Each phosphor 18 is particulate. The phosphor 18 absorbs light emitted from the LED chips 84*a* to 84*d*, and emits light with a longer wavelength. For instance, the phosphors 18 include green phosphors absorbing blue light emitted from the LED chips 84*a* to 84*d* and emitting green light, and red phosphors absorbing blue light and emitting red light. Alternatively, the phosphor 18 may be a yellow phosphor absorbing blue light emitted from the LED chips 84*a* to 84*d* and emitting yellow light. Thus, the LED package 80 produces white emission light as a whole. The configuration of the embodiment other than the foregoing is similar to that of the above first embodiment.

The LED package 80 according to the embodiment can be manufactured by a method similar to that for the LED package 1 according to the above first embodiment. In this case, the lead frame sheet can be the lead frame sheet shown in FIG. 33C as described in the seventh variation of the eighth embodiment. Furthermore, the grooves 81*k* and 81*m* can be formed by half-etching the conductive sheet 21 from the upper surface side in the processes shown in FIGS. 4A and 4B. In FIG. 41, in the lead frames 81 and 82, the regions half-etched from the upper surface side, i.e., the grooves 81*k* and 81*m*, are hatched with mutually intersecting diagonal lines. The regions half-etched from the lower surface side, i.e., the thin plate portions and the extending portions, are hatched with unidirectionally extending diagonal lines. The manufacturing method of the embodiment other than the foregoing is similar to that of the above first embodiment.

Next, the functional effect of the embodiment is described.

The LED package 80 according to the embodiment includes four LED chips 84*a* to 84*d*. Hence, a large amount of light can be obtained. Furthermore, by arranging the LED chips in a staggered pattern, the LED package 80 can be downsized while maintaining the shortest distance between the LED chips at a certain value or more. Maintaining the shortest distance between the LED chips at a certain value or more increases the probability that the light emitted from one LED chip is absorbed by a phosphor before reaching the adjacent LED chip, and improves the light extraction efficiency. Furthermore, heat emitted from one LED chip is less likely to be absorbed by the adjacent LED chip. This can suppress the decrease of light emission efficiency due to the temperature increase of the LED chips.

In the LED package 80 according to the embodiment, the Zener diode chip 86 is connected between the lead frame 81 and the lead frame 82. This improves ESD resistance. Furthermore, the Zener diode chip 86 is disposed on the lead frame 82 different from the lead frame 81 disposed with the LED chips 84*a* to 84*d*. Hence, the space on the lead frame can be effectively utilized, and the LED package 80 can be downsized.

Furthermore, according to the embodiment, the groove 81*k* is formed in the upper surface of the lead frame 81. Hence, the regions where the die mount materials 83*a* to 83*d* are attached are separated by the groove 81*k* from the region where the wire 85*a* is bonded. Thus, in the aforementioned process shown in FIG. 4C, when the paste-like die mount materials 83*a* and 83*c* are attached to the upper surface of the lead frame 81, even if there is any variation in the supply amount and supply position of the die mount material, the die mount material can be prevented from running out into the bonding region of the wire 85*a*. This prevents the bonding region of the wire 85*a* from being contaminated with the die mount material. Thus, the wire 85*a* can be reliably bonded to the lead frame 81.

Likewise, the groove 81*m* is formed in the upper surface of the lead frame 81. Thus, in the aforementioned process shown in FIG. 4C, when the paste-like die mount materials 83*a* and 83*b* are attached to the upper surface of the lead frame 81, even if there is any variation in the supply amount and supply position of the die mount material, the die mount material can be prevented from running out into the bonding region of the wire 87. This prevents the bonding region of the wire 87 from being contaminated with the die mount material. Thus, the wire 87 can be reliably bonded to the lead frame 81.

Moreover, in the embodiment, one end of the wires is drawn out generally horizontally from the upper surface of the LED chips and the Zener diode chip. Hence, the loop height of the wire can be lowered. Thus, when the transparent resin body 17 repetitively expands and contracts due to temperature change, the amount of displacement of the wire dragged by the transparent resin body 17 is reduced. This can reliably prevent cutting of the wire and breakage of the bonding portion.

Moreover, in the embodiment, the base portion 81*a* of the lead frame 81 has a shape with the two corners on the −X-direction side truncated. The base portion 82*a* of the lead frame 82 has a shape with the two corners on the +X-direction side truncated. Thus, right-angle or acute-angle corners are removed from around the corners of the LED package 80. Hence, these corners do not act as an origin of resin peeling or cracking. This can suppress the occurrence of resin peeling or cracking in the LED package 80 as a whole.

Moreover, the LED package 80 according to the embodiment is not provided with an enclosure made of a white resin. Hence, there is no degradation of the enclosure by absorbing light and heat generated from the LED chips. Hence, the LED package 80 according to the embodiment has long lifetime and high reliability, and is applicable to a wide variety of purposes. Furthermore, the transparent resin body 17 is formed from silicone resin. Hence, the durability of the LED package 80 is further improved.

Moreover, the LED package 80 according to the embodiment is not provided with an enclosure covering the side surface of the transparent resin body 17. Hence, light is emitted toward a wide angle. Thus, the LED package 80 according to the embodiment is particularly suitable for applications requiring light emission with a wide angle.

Moreover, in the LED package 80 according to the embodiment, the transparent resin body 17 covers part of the lower surface and most of the end surface of the lead frames 81 and 82, thereby retaining the peripheral portion of the lead frames 81 and 82. Hence, the retainability of the lead frames 81 and 82 can be enhanced while part of the lower surface of the lead frames 81 and 82 is exposed from the transparent resin body 17 to realize external electrode pads. This makes the lead frames 81 and 82 more resistant to being stripped from the transparent resin body 17 at the time of dicing. Thus, the yield of the LED package 80 can be improved.

Moreover, in the LED package 80 according to the embodiment, the extending portions extend out from the base portions 81a and 82a of the lead frames 81 and 82. This prevents the base portion itself from being exposed at the side surface of the transparent resin body 17. Thus, the exposed area of the lead frames 81 and 82 can be reduced. This can prevent the lead frames 81 and 82 from being stripped from the transparent resin body 17. Furthermore, corrosion of the lead frames 81 and 82 can also be suppressed. The functional effects of the embodiment other than the foregoing are similar to those of the above first embodiment.

The above embodiments can realize an LED package having high durability and low cost, and a method for manufacturing the same.

The invention has been described with reference to the embodiments and the variations thereof. However, the invention is not limited to these embodiments and variations. The above embodiments and the variations thereof can be practiced in combination with each other. For instance, in an LED package disposed with a plurality of LED chips as in the above eighth embodiment and its variations, a groove may be formed between the regions disposed with the LED chips on the upper surface of the lead frame as in the above seventh embodiment. Furthermore, a recess in which the LED chip is to be disposed may be formed. Furthermore, as in the above ninth embodiment, the range of the value of the ratio E/L may be specified. Furthermore, as in the above tenth embodiment, a lens may be provided.

Furthermore, those skilled in the art can suitably modify the above embodiments and the variations thereof by addition, deletion, or design change of components, or by addition, omission, or condition change of processes. Such modifications are also encompassed within the scope of the invention as long as they fall within the spirit of the invention.

For instance, in the above first embodiment, the lead frame sheet 23 is formed by e.g. wet etching. However, the invention is not limited thereto. It may be formed by a mechanical method such as press working. Furthermore, in the above first embodiment, in the lead frame, for instance, silver plating layers are formed on the upper and lower surface of the copper plate. However, the invention is not limited thereto. For instance, silver plating layers may be formed on the upper and lower surface of the copper plate, and a rhodium (Rh) plating layer may be formed on at least one of the silver plating layers. Furthermore, a copper (Cu) plating layer may be formed between the copper plate and the silver plating layer. Moreover, a nickel (Ni) plating layer may be formed on the upper and lower surface of the copper plate, and a gold-silver alloy (Au—Ag alloy) plating layer may be formed on the nickel plating layer.

Furthermore, in the above embodiments and the variations thereof, for instance, the LED chip is a chip emitting blue light, the phosphor is a phosphor absorbing blue light and emitting yellow light, so that the color of light emitted from the LED package is white. However, the invention is not limited thereto. The LED chip may be one emitting visible light of a color other than blue, or one emitting ultraviolet or infrared radiation. The phosphor is also not limited to the phosphor emitting yellow light, but may be a phosphor emitting blue light, green light, or red light, for instance.

Phosphors emitting blue light can include the following, for instance.

$$(RE_{1-x}Sm_x)_3(Al_yGa_{1-y})_5O_{12}:Ce$$

where $0 \leq x < 1$, $0 \leq y \leq 1$, and RE is at least one selected from Y and Gd.

ZnS:Ag
ZnS:Ag+Pigment
ZnS:Ag,Al
ZnS:Ag,Cu,Ga,Cl
ZnS:Ag+In$_2$O$_3$
ZnS:Zn+In$_2$O$_3$
(Ba,Eu)MgAl$_{10}$O$_{17}$
(Sr,Ca,Ba,Mg)$_{10}$(PO$_4$)$_6$Cl$_2$:Eu
Sr$_{10}$(PO$_4$)$_6$Cl$_2$:Eu
(Ba,Sr,Eu)(Mg,Mn)Al$_{10}$O$_{17}$
10(Sr,Ca,Ba,Eu).6PO$_4$.Cl$_2$
BaMg$_2$Al$_{16}$O$_{25}$:Eu Phosphors emitting green light can include the following, for instance, in addition to the sialon-based green phosphors described above.

ZnS:Cu,Al
ZnS:Cu,Al+Pigment
(Zn,Cd)S:Cu,Al
ZnS:Cu,Au,Al+Pigment
Y$_3$Al$_5$O$_{12}$:Tb
Y$_3$(Al,Ga)$_5$O$_{12}$:Tb
Y$_2$SiO$_5$:Tb
Zn$_2$SiO$_4$:Mn
(Zn,Cd)S:Cu
ZnS:Cu
ZnS:Cu+Zn$_2$SiO$_4$:Mn
Gd$_2$O$_2$S:Tb
(Zn,Cd)S:Ag
Y$_2$O$_2$S:Tb
ZnS:Cu,Al+In$_2$O$_3$
(Zn,Cd)S:Ag+In$_2$O$_3$
(Zn,Mn)$_2$SiO$_4$
BaAl$_{12}$O$_{19}$:Mn
(Ba,Sr,Mg)O.aAl$_2$O$_3$:Mn
LaPO$_4$:Ce,Tb
3(Ba,Mg,Eu,Mn)O.8Al$_2$O$_3$
La$_2$O$_3$.0.2SiO$_2$.0.9P$_2$O$_5$:Ce,Tb
CeMgAl$_{11}$O$_{19}$:Tb Phosphors emitting red light can include the following, for instance, in addition to the sialon-based red phosphors described above.

CaAlSiN$_3$:Eu$^{2+}$
Y$_2$O$_2$S:Eu
Y$_2$O$_2$S:Eu+Pigment
Y$_2$O$_3$:Eu
Zn$_3$(PO$_4$)$_2$:Mn
(Zn,Cd)S:Ag+In$_2$O$_3$
(Y,Gd,Eu)BO$_3$
(Y,Gd,Eu)$_2$O$_3$
YVO$_4$:Eu
La$_2$O$_2$S:Eu,Sm In addition to the silicate-based phosphors described above, the phosphor emitting yellow light can be e.g. a phosphor represented by the general formula Me$_x$Si$_{12-(m+n)}$Al$_{(m+n)}$O$_n$N$_{16-n}$:Re1$_y$Re2$_z$ (where x, y, z, m, and n in the formula are coefficients), where the metal Me (Me being one or two of Ca and Y) solid-solved in the alpha sialon is partly or entirely substituted by a lanthanide metal Re1 (Re1 being one or more of Pr, Eu, Tb, Yb, and Er) serving as an emission center, or by two lanthanide metals Re1 and Re2 (Re2 being Dy) serving as a coactivator.

Furthermore, the color of light emitted entirely from the LED package is not limited to white. Any tint can be realized by adjusting the weight ratio R:G:B for the red phosphor, green phosphor, and blue phosphor as described above. For instance, white light emission ranging from the white incandescent color to the white fluorescent lamp color can be realized by setting the R:G:B weight ratio to one of 1:1:1 to 7:1:1, 1:1:1 to 1:3:1, and 1:1:1 to 1:1:3.

Furthermore, the phosphor may be omitted from the LED package. In this case, the light emitted from the LED chip is emitted from the LED package.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An LED package, comprising:
   first and second lead frames disposed on a same plane and spaced from each other;
   an LED chip provided above the first and second lead frames, one terminal connected to the first lead frame and one other terminal connected to the second lead frame; and
   a resin body covering the LED chip, covering an upper surface, a part of a lower surface, and a part of an end surface of each of the first and second lead frames, and exposing a remaining part of the lower surface and a remaining part of the end surface,
   at least one of the first lead frame and the second lead frame including:
      a base portion having an end surface covered with the resin body; and
      three portions extending in mutually different directions from the base portion, a lower surface of each of the three extending portions being covered with the resin body, a tip surface of each of the three extending portions being exposed on a side surface of the resin body,
   a protrusion being formed in a region of one of a lower surface of the first lead frame and a lower surface of the second lead frame, the region being spaced from one other of the lower surface of the first lead frame and the lower surface of the second lead frame, a lower surface of the protrusion being exposed on a lower surface of the resin body, and a side surface of the protrusion being covered with the resin body, and
   the resin body forming an outline of the LED package.

2. The LED package according to claim 1, wherein
   the base portion is shaped like a rectangle as viewed from above,
   the three extending portions are disposed on a same plane and each of the three extending portions extending from one of mutually different three sides of the base portion.

3. The LED package according to claim 1, wherein
   one other protrusion is formed in the one other of the lower surface of the first lead frame and the lower surface of the second lead frame, and
   a lower surface of the one other protrusion is exposed on a lower surface of the resin body, and a side surface of the one other protrusion is covered with the resin body.

4. The LED package according to claim 3, wherein
   The one other protrusion formed in the one other of the lower surface of the first lead frame and the lower surface of the second lead frame is formed in a region spaced from the one of the lower surface of the first lead frame and the lower surface of the second lead frame.

5. The LED package according to claim 1, further comprising:
   a first wire connecting the one terminal to the first lead frame;
   a second wire connecting the one other terminal to the second lead frame; and
   a third lead frame disposed between the first lead frame and the second lead frame, a part of a lower surface and a part of an end surface of the third lead frame being exposed from the resin body,
   the one terminal and the one other terminal being both provided on an upper surface of the LED chip,
   the LED chip being disposed on the third lead frame.

6. The LED package according to claim 1, further comprising:
   a first wire connecting the one terminal to the first lead frame; and
   a second wire connecting the one other terminal to the second lead frame,
   the one terminal and the one other terminal being both provided on an upper surface of the LED chip, and
   the LED chip being disposed on the first lead frame.

7. The LED package according to claim 6, further comprising:
   a die mount material securing the LED chip to the first lead frame,
   a groove being formed on an upper surface of the first lead frame between a region where the LED chip is disposed and a region where the first wire is bonded.

8. The LED package according to claim 6, further comprising:
   a die mount material securing the LED chip to the first lead frame,
   a recess being formed on an upper surface of the first lead frame, the LED chip being disposed inside the recess, and a region where the first wire is bonded being located outside the recess.

9. The LED package according to claim 1, further comprising:
   a die mount material made of a conductive material, securing the LED chip to the first lead frame, and connecting the one terminal to the first lead frame; and
   a wire connecting the one other terminal to the second lead frame,
   the LED chip being disposed on the first lead frame, and
   the one terminal being provided on a lower surface of the LED chip, and the one other terminal being provided on an upper surface of the LED chip.

10. The LED package according to claim 1, further comprising:
    a Zener diode chip connected between the first lead frame and the second lead frame;
    a wire connecting an upper surface terminal of the Zener diode chip to the first lead frame; and
    a die mount material attached to an upper surface of the second lead frame and connecting a lower surface terminal of the Zener diode chip to the second lead frame,
    the Zener diode chip being disposed on the second lead frame via the die mount material.

11. The LED package according to claim 1, further comprising:
- a Zener diode chip connected between the first lead frame and the second lead frame;
- a wire connecting an upper surface terminal of the Zener diode chip to the second lead frame; and
- a die mount material attached to an upper surface of the first lead frame and connecting a lower surface terminal of the Zener diode chip to the first lead frame,
- the Zener diode chip being disposed on the first lead frame via the die mount material.

12. The LED package according to claim 1, further comprising:
- a die mount material attached to an upper surface of the first lead frame and installing the LED chip on the first lead frame,
- a first wire connecting the one terminal to the first lead frame;
- a second wire connecting the one other terminal to the second lead frame;
- one other die mount material attached to an upper surface of the second lead frame;
- a Zener diode chip having a lower surface terminal connected to the second lead frame via the one other die mount material; and
- a third wire connecting an upper surface terminal of the Zener diode chip to the first lead frame,
- a groove being formed in an upper surface of the first lead frame between a region where the LED chip is disposed and a region where the first wire is bonded and between the region where the LED chip is disposed and a region where the third wire is bonded,
- another groove being formed in an upper surface of the second lead frame between a region where the Zener diode chip is disposed and a region where the second wire is bonded, and
- the one terminal and the one other terminal being both provided on an upper surface of the LED chip.

13. The LED package according to claim 1, further comprising:
- other LED chips provided above the first and second lead frames, one terminal of each of the other LED chips connected to the first lead frame and one other terminal of each of the other LED chips connected to the second lead frame;
- the LED chip and the other LED chips being arranged in a staggered pattern.

14. The LED package according to claim 1, wherein a ratio of a total length of regions of the lead frames exposed on a side surface of the resin body to an entire circumferential length of the side surface of the resin body is 21% or more and 91% or less.

15. The LED package according to claim 1, further comprising:
- a lens provided on the resin body.

16. The LED package according to claim 1, further comprising:
- a fluorescent material disposed in the resin body,
- the LED chip emitting a blue light, and the fluorescent material including a fluorescent material absorbing the blue light and emitting a green light, and a fluorescent material absorbing the blue light and emitting a red light.

17. An LED package, comprising:
- first and second lead frames disposed on a same plane and spaced from each other;
- an LED chip provided above the first and second lead frames, with one terminal connected to the first lead frame and one other terminal connected to the second lead frame; and
- a resin body covering the LED chip, covering an upper surface, a part of a lower surface, and a part of an end surface of each of the first and second lead frames, and exposing a remaining part of the lower surface and a remaining part of the end surface,
- at least one of the first lead frame and the second lead frame including:
  - a base portion having an end surface covered with the resin body; and
  - a plurality of portions extending from the base portion, lower surfaces of the plurality of extending portions being covered with the resin body, each of tip surfaces of the plurality of extending portions being exposed on one of mutually different three side surfaces of the resin body,
- a protrusion being formed in a region of one of a lower surface of the first lead frame and a lower surface of the second lead frame, the region being spaced from one other of the lower surface of the first lead frame and the lower surface of the second lead frame, a lower surface of the protrusion being exposed on a lower surface of the resin body, and a side surface of the protrusion being covered with the resin body, and
- the resin body forming an outline of the LED package.

18. The LED package according to claim 17, wherein
- one other protrusion is also formed in the one other of the lower surface of the first lead frame and the lower surface of the second lead frame, and
- a lower surface of the one other protrusion is exposed on a lower surface of the resin body, and a side surface of the one other protrusion is covered with the resin body.

19. The LED package according to claim 18, wherein
- The one other protrusion formed in the one other of the lower surface of the first lead frame and the lower surface of the second lead frame is formed in a region spaced from the one of the lower surface of the first lead frame and the lower surface of the second lead frame.

20. The LED package according to claim 17, wherein a ratio of a total length of regions of the lead frames exposed on a side surface of the resin body to an entire circumferential length of the side surface of the resin body is 21% or more and 91% or less.

* * * * *